United States Patent
Kim et al.

(10) Patent No.: US 12,132,046 B2
(45) Date of Patent: Oct. 29, 2024

(54) SEMICONDUCTOR DEVICE INCLUDING SEPARATION PATTERN PENETRATING GATE STRUCTURE AND METHOD OF FABRICATING THE SAME

(71) Applicant: Samsung Electronics Co., Ltd., Suwon-si (KR)

(72) Inventors: Ho-Jun Kim, Suwon-si (KR); Beomjin Park, Hwaseong-si (KR); Dong Il Bae, Seongnam-si (KR); Mirco Cantoro, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 400 days.

(21) Appl. No.: 17/466,043

(22) Filed: Sep. 3, 2021

(65) Prior Publication Data

US 2022/0262790 A1    Aug. 18, 2022

(30) Foreign Application Priority Data

Feb. 16, 2021  (KR) ......................... 10-2021-0020472

(51) Int. Cl.
*H01L 27/088*    (2006.01)
*H01L 29/417*    (2006.01)
*H01L 29/423*    (2006.01)

(52) U.S. Cl.
CPC ...... *H01L 27/088* (2013.01); *H01L 29/41775* (2013.01); *H01L 29/42372* (2013.01)

(58) Field of Classification Search
CPC ..... H01L 21/823481; H01L 21/823431; H01L 21/823821; H01L 27/0886; H01L 29/66795–66818; H01L 29/785–7856; H01L 2029/7857; H01L 2029/7858
See application file for complete search history.

(56) References Cited

U.S. PATENT DOCUMENTS

| | | | |
|---|---|---|---|
| 9,659,930 B1 | 5/2017 | Yu et al. | |
| 10,090,382 B1 | 10/2018 | Yu et al. | |
| 10,535,746 B2 | 1/2020 | Lee et al. | |
| 2014/0001564 A1* | 1/2014 | Song | G06F 30/00 |
| | | | 716/112 |
| 2015/0325482 A1* | 11/2015 | Hu | H01L 21/28035 |
| | | | 438/585 |
| 2017/0148682 A1 | 5/2017 | Basker et al. | |
| 2018/0138092 A1* | 5/2018 | Lee | H01L 21/823437 |
| 2018/0145082 A1* | 5/2018 | Hong | H01L 27/0924 |
| 2019/0067301 A1* | 2/2019 | Yang | H01L 29/785 |

(Continued)

*Primary Examiner* — Eric A. Ward
(74) *Attorney, Agent, or Firm* — Harness, Dickey & Pierce, P.L.C.

(57) ABSTRACT

Disclosed are semiconductor devices and methods of fabricating the same. The semiconductor device includes a plurality of gate structures that are spaced apart from each other in a first direction on a substrate and extend in a second direction intersecting the first direction, and a plurality of separation patterns penetrating immediately neighboring ones of the plurality of gate structures, respectively. Each of the plurality of separation patterns separates a corresponding one of the neighboring gate structures into a pair of gate structures that are spaced apart from each other in the second direction. The plurality of separation patterns are spaced apart from and aligned with each other along the first direction.

15 Claims, 49 Drawing Sheets

(56) References Cited

U.S. PATENT DOCUMENTS

| | | | |
|---|---|---|---|
| 2019/0280087 A1* | 9/2019 | Park | .................... H01L 27/0886 |
| 2020/0035566 A1 | 1/2020 | Perng et al. | |
| 2020/0058652 A1 | 2/2020 | Park et al. | |
| 2020/0083090 A1 | 3/2020 | Chan et al. | |

* cited by examiner

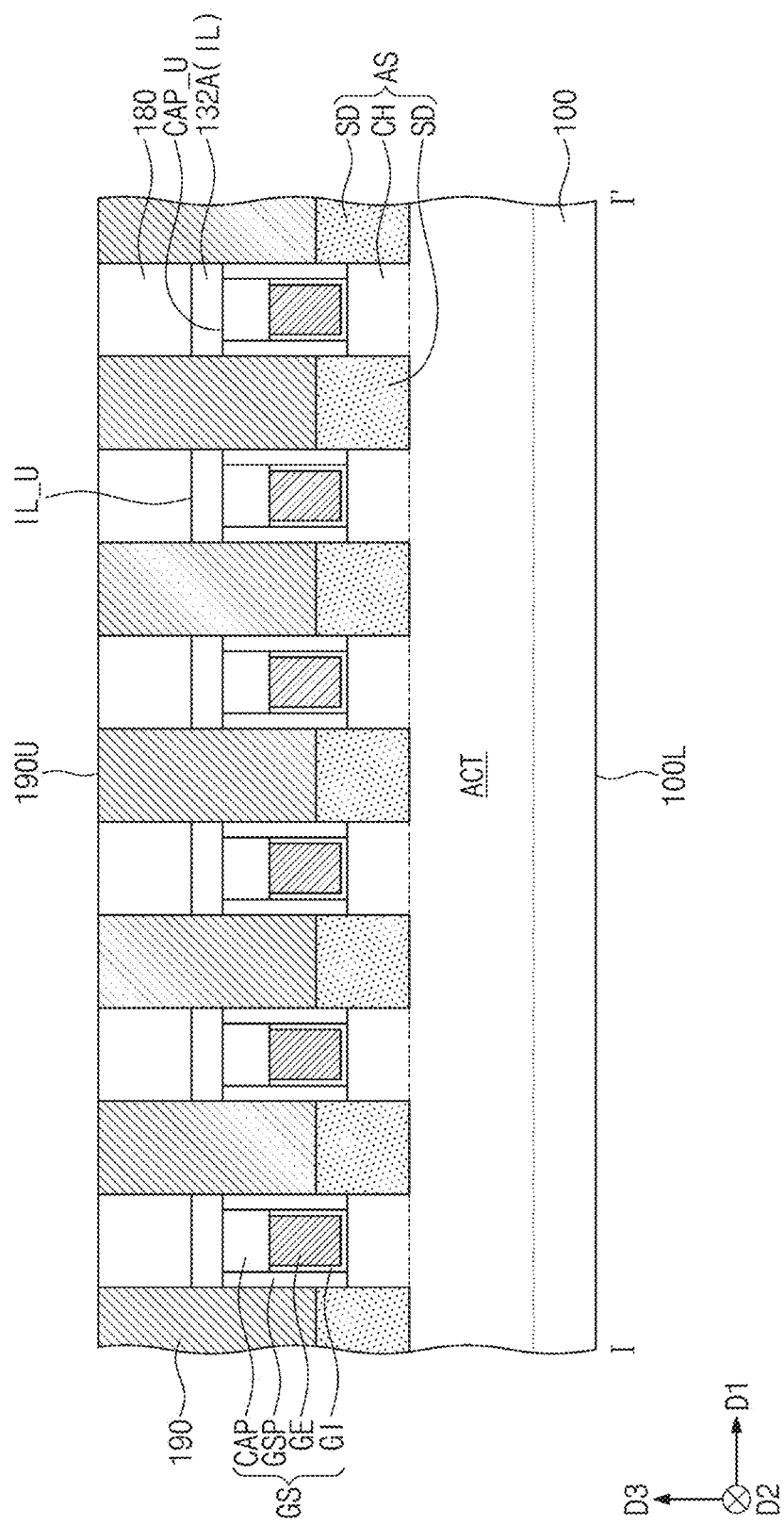

FIG. 4C
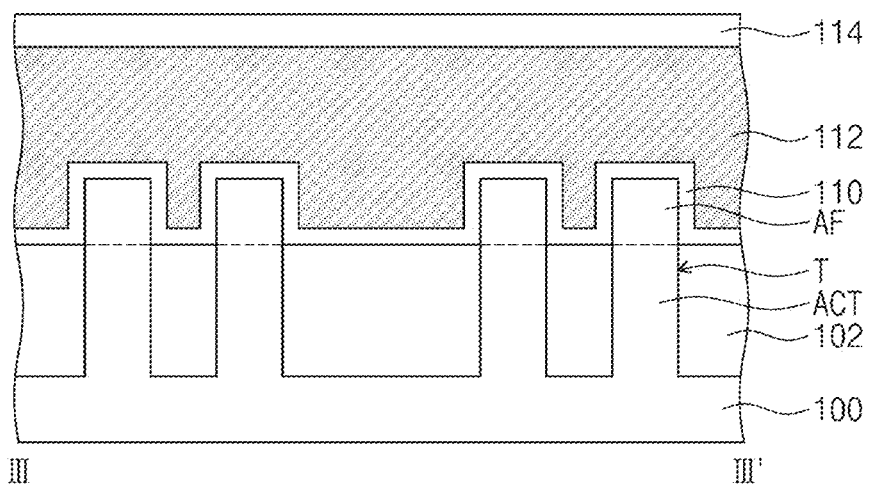
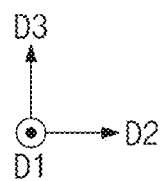

FIG. 6C
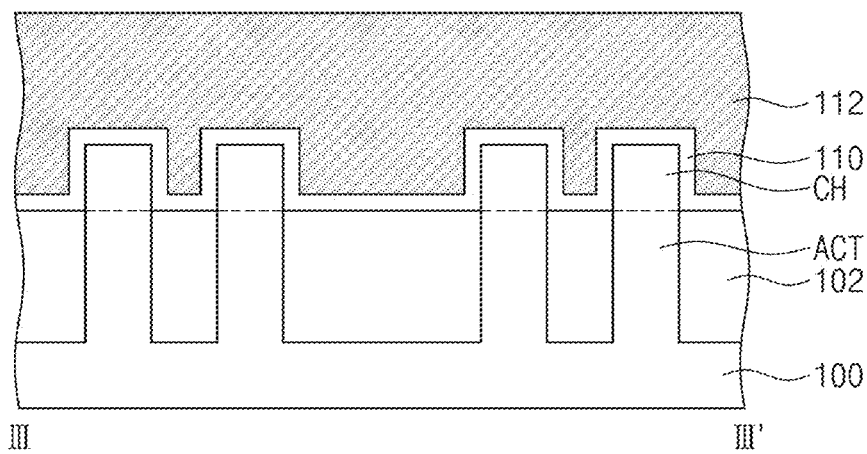
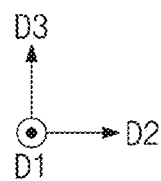

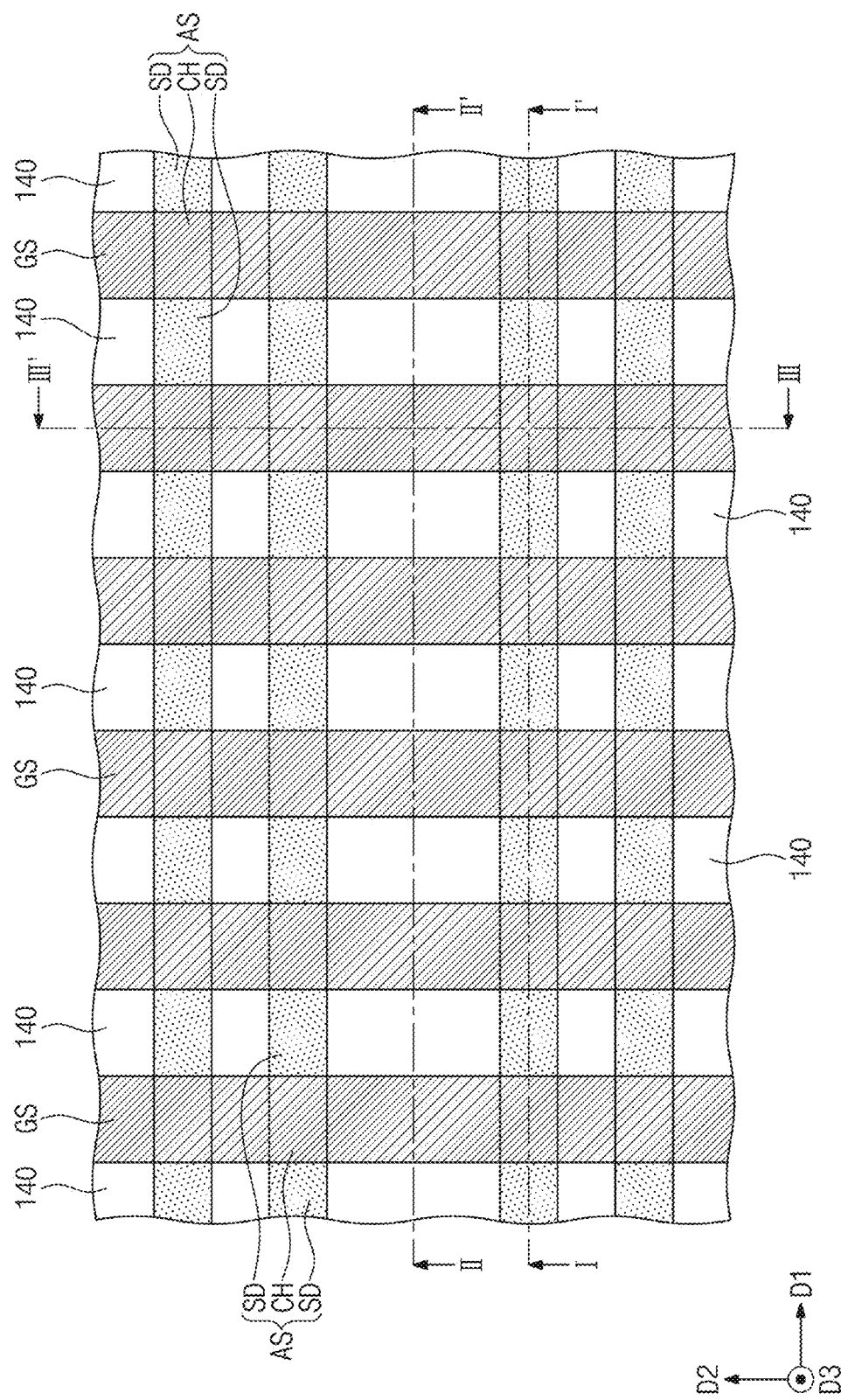

FIG. 8C
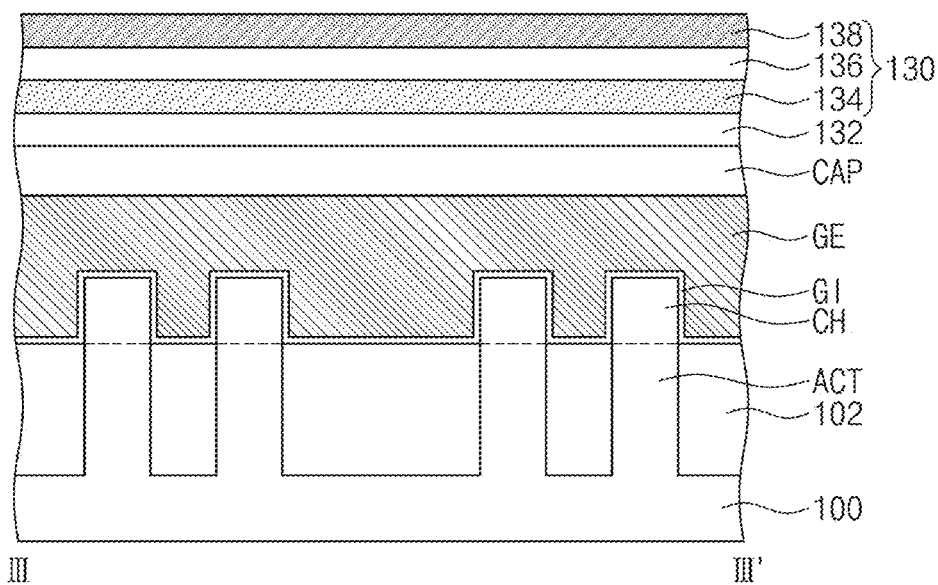
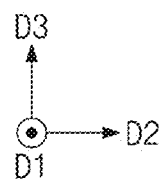

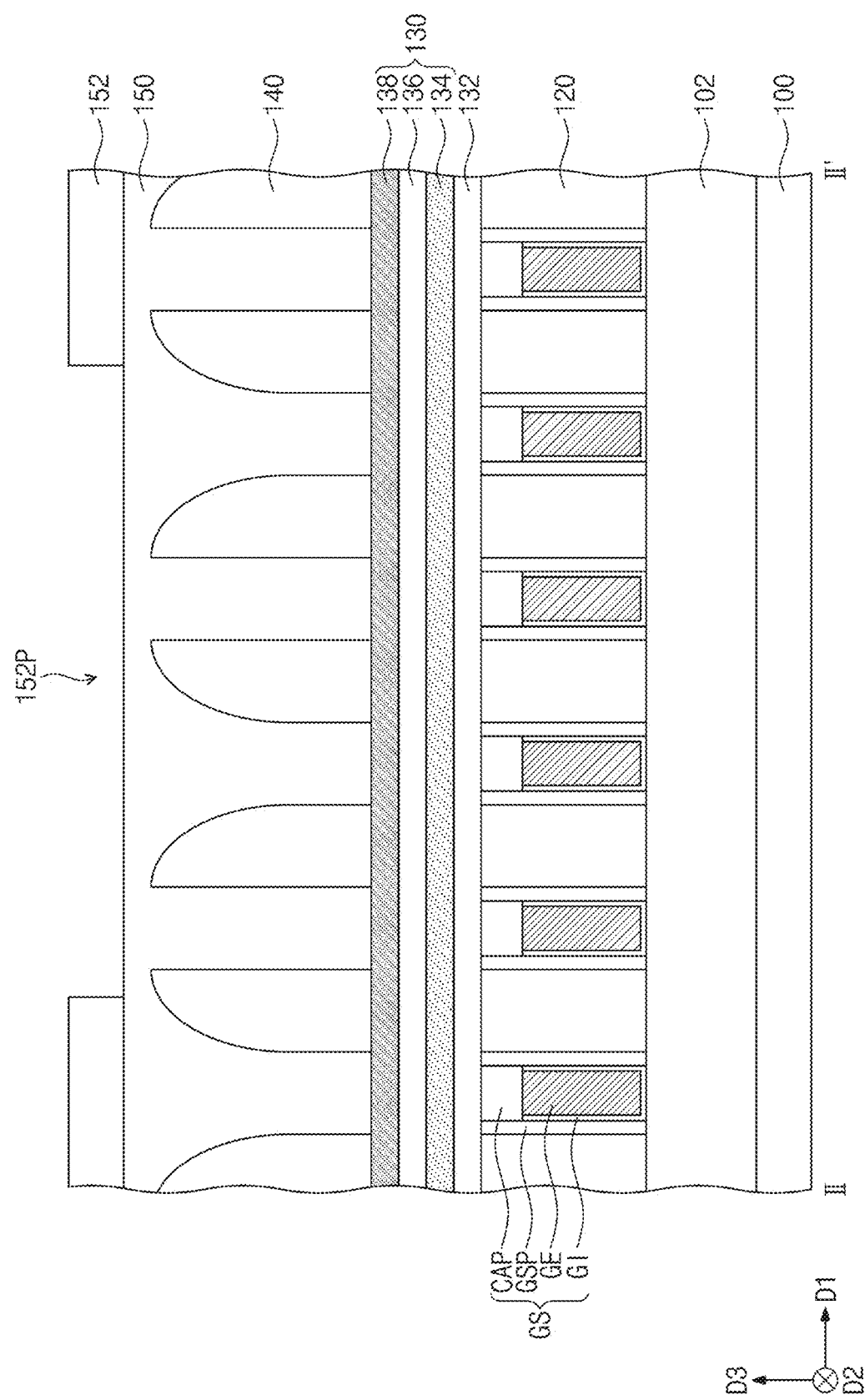

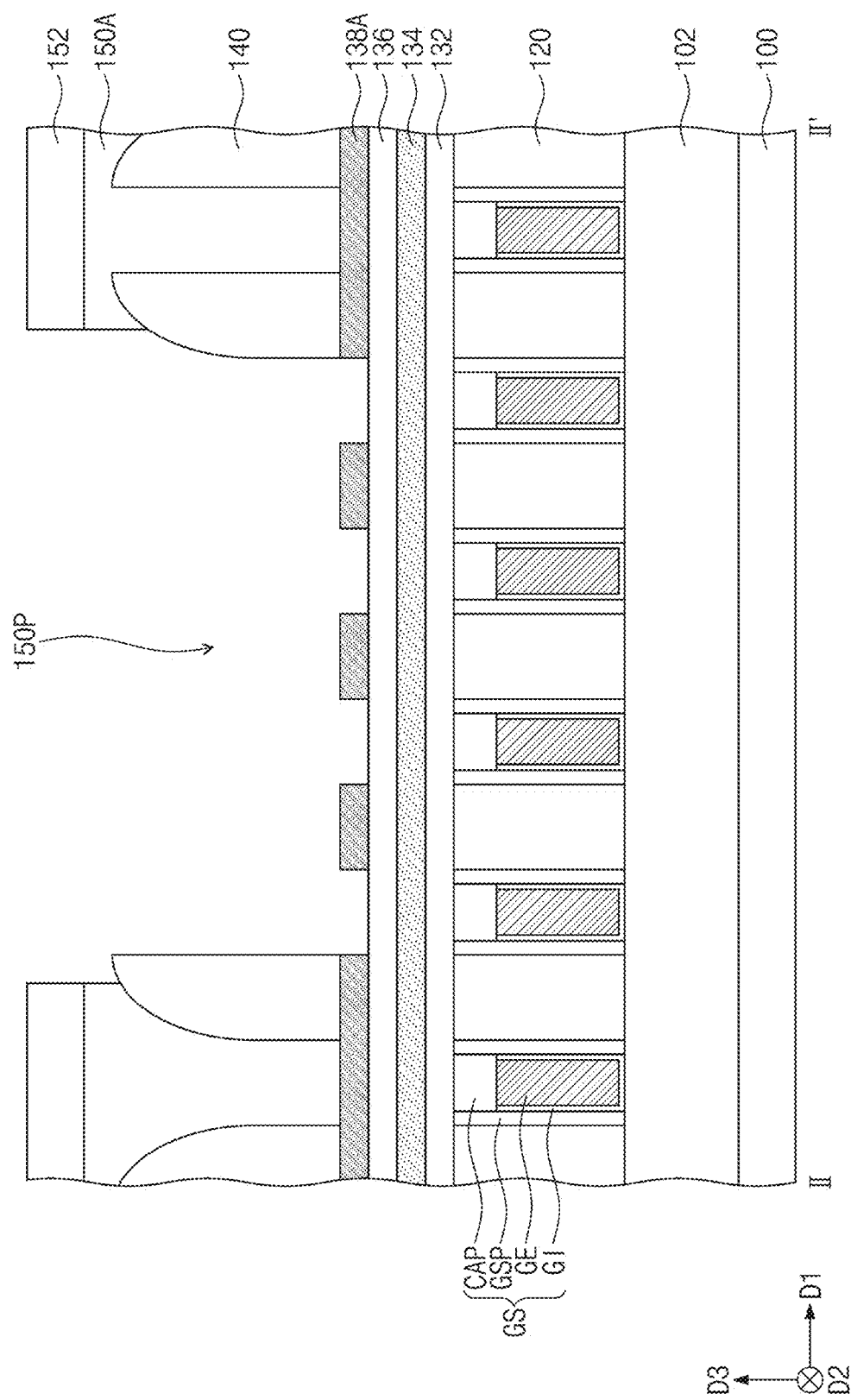

FIG. 12C
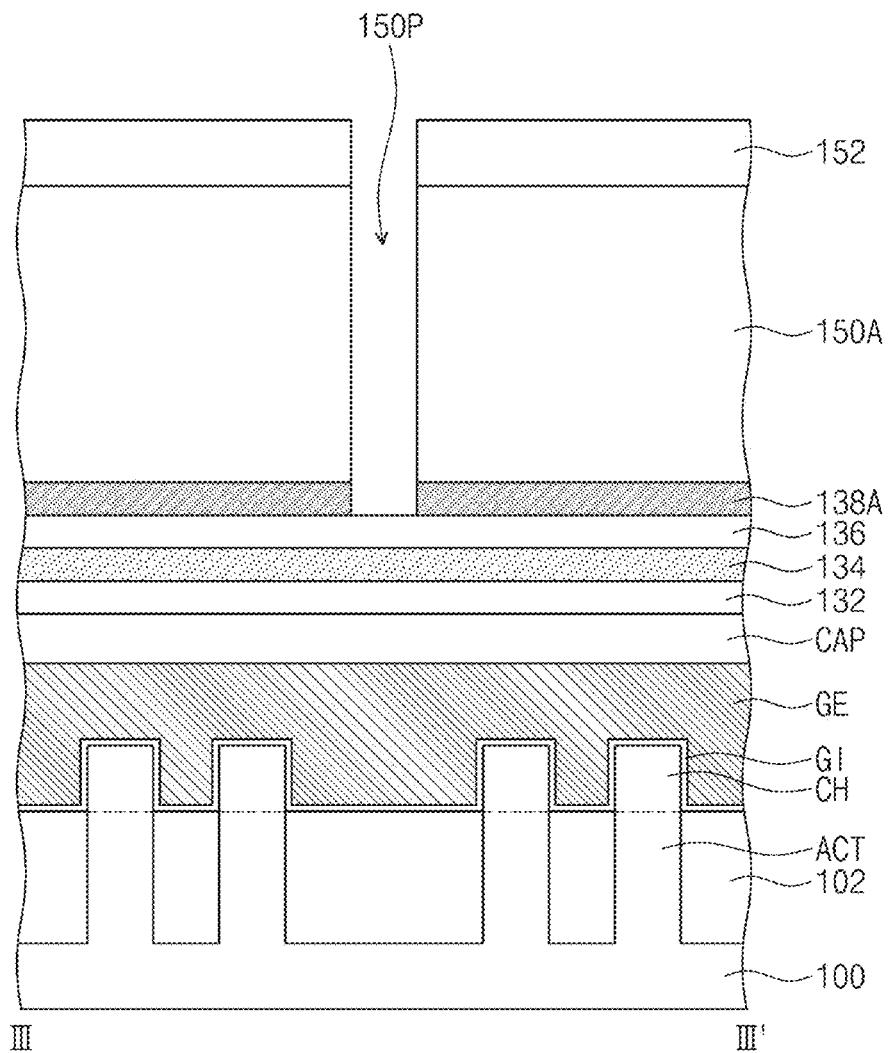
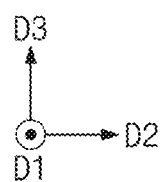

SEMICONDUCTOR DEVICE INCLUDING SEPARATION PATTERN PENETRATING GATE STRUCTURE AND METHOD OF FABRICATING THE SAME

CROSS-REFERENCE TO RELATED APPLICATION

This U.S. nonprovisional application claims priority under 35 U.S.C § 119 to Korean Patent Application No. 10-2021-0020472 filed on Feb. 16, 2021 in the Korean Intellectual Property Office, the disclosure of which is hereby incorporated by reference in its entirety.

BACKGROUND

The present inventive concepts relate to semiconductor devices and/or methods of fabricating the same, and more particularly, to semiconductor devices including a field effect transistor and/or a methods of fabricating the same.

A semiconductor device includes an integrated circuit consisting of metal oxide semiconductor field effect transistors (MOSFETs). As size and design rule of the semiconductor device are gradually decreased, sizes of the MOSFETs are also increasingly scaled down. The scale down of MOSFETs may deteriorate operating characteristics of the semiconductor device. Accordingly, research has been variously conducted to manufacture the semiconductor device having excellent performances while overcoming limitations due to integration of the semiconductor device.

SUMMARY

Some example embodiments of the present inventive concepts provide semiconductor devices capable of preventing or mitigating the occurrence of defects in patterns and/or methods of fabricating the same.

Some example embodiments of the present inventive concepts provide semiconductor devices having improved electrical characteristics and/or a methods of fabricating the same.

According to an example embodiment of the present inventive concepts, a semiconductor device includes a plurality of gate structures on a substrate, the plurality of gate structures spaced apart from each other in a first direction and extending in a second direction intersecting the first direction, and a plurality of separation patterns penetrating immediately neighboring ones of the plurality of gate structures, respectively. Each of the plurality of separation patterns separates a corresponding one of the neighboring gate structures into a pair of gate structures that are spaced apart from each other in the second direction. The plurality of separation patterns are spaced apart from and aligned with each other along the first direction.

According to an example embodiment of the present inventive concepts, a semiconductor device includes a plurality of gate structures on a substrate, the plurality of gate structures spaced apart from each other in a first direction and extending in a second direction intersecting the first direction, a plurality of separation patterns penetrating immediately neighboring ones of the plurality of gate structures, respectively, the plurality of separation patterns aligned with each other along the first direction, and a lower dielectric layer between the separation patterns. The separation patterns are spaced apart from each other in the first direction across the lower dielectric layer. Each of the plurality of gate structures includes a gate electrode and a gate capping pattern on a top surface of the gate electrode. A height of an uppermost surface of the lower dielectric layer is equal to or higher than a height of an uppermost surface of the gate capping pattern.

According to an example embodiment of the present inventive concepts, a method of fabricating a semiconductor device includes forming a plurality of gate structures on a substrate such that the plurality of gate structures are spaced apart from each other in a first direction and extend in a second direction intersecting the first direction, forming a mask layer on the plurality of gate structures, forming a plurality of blocking mask patterns on the mask layer that the plurality of blocking mask patterns are spaced apart from each other in the first direction and extend in the second direction, the blocking mask patterns vertically overlapping a lower interlayer dielectric layer between the plurality of gate structures, forming a preliminary cutting mask pattern having an opening on the blocking mask patterns, the opening extending in the first direction, running across immediately neighboring ones of the plurality of gate structures, and exposing portions of the blocking mask patterns, patterning the mask layer by using the preliminary cutting mask pattern and the blocking mask patterns as an etching mask to form a cutting mask pattern having a plurality of holes that are spaced apart from each other in the first direction, the plurality of holes vertically overlap the neighboring gate structures, respectfully, and forming a plurality of through holes penetrating the neighboring gate structures, respectively, by using the cutting mask pattern as an etching mask

BRIEF DESCRIPTION OF THE DRAWINGS

FIGS. 2A, 2B, and 2C illustrate cross-sectional views taken along lines I-I', II-II', and III-III' of FIG. 1, respectively.

FIGS. 3, 5, 7, 9, 11, 13, 15, 17, and 19 illustrate plan views showing a method of fabricating a semiconductor device according to an example embodiment of the present inventive concepts.

FIGS. 4B, 6B, 8B, 10B, 12B, 14B, 16B, 18B, and 20B illustrate cross-sectional views taken along line II-II' of FIGS. 3, 5, 7, 9, 11, 13, 15, 17, and 19, respectively.

FIGS. 4C, 6C, 8C, 10C, 12C, 14C, 16C, 18C, and 20C illustrate cross-sectional views taken along line III-III' of FIGS. 3, 5, 7, 9, 11, 13, 15, 17, and 19, respectively.

DETAILED DESCRIPTION

The following will now describe in detail some example embodiments of the present inventive concepts with reference to the accompanying drawings.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Expressions such as "at least one of" or "one or more of" when preceding a list of elements, modify the entire list of elements and do not modify the individual elements of the list.

Figure 1:
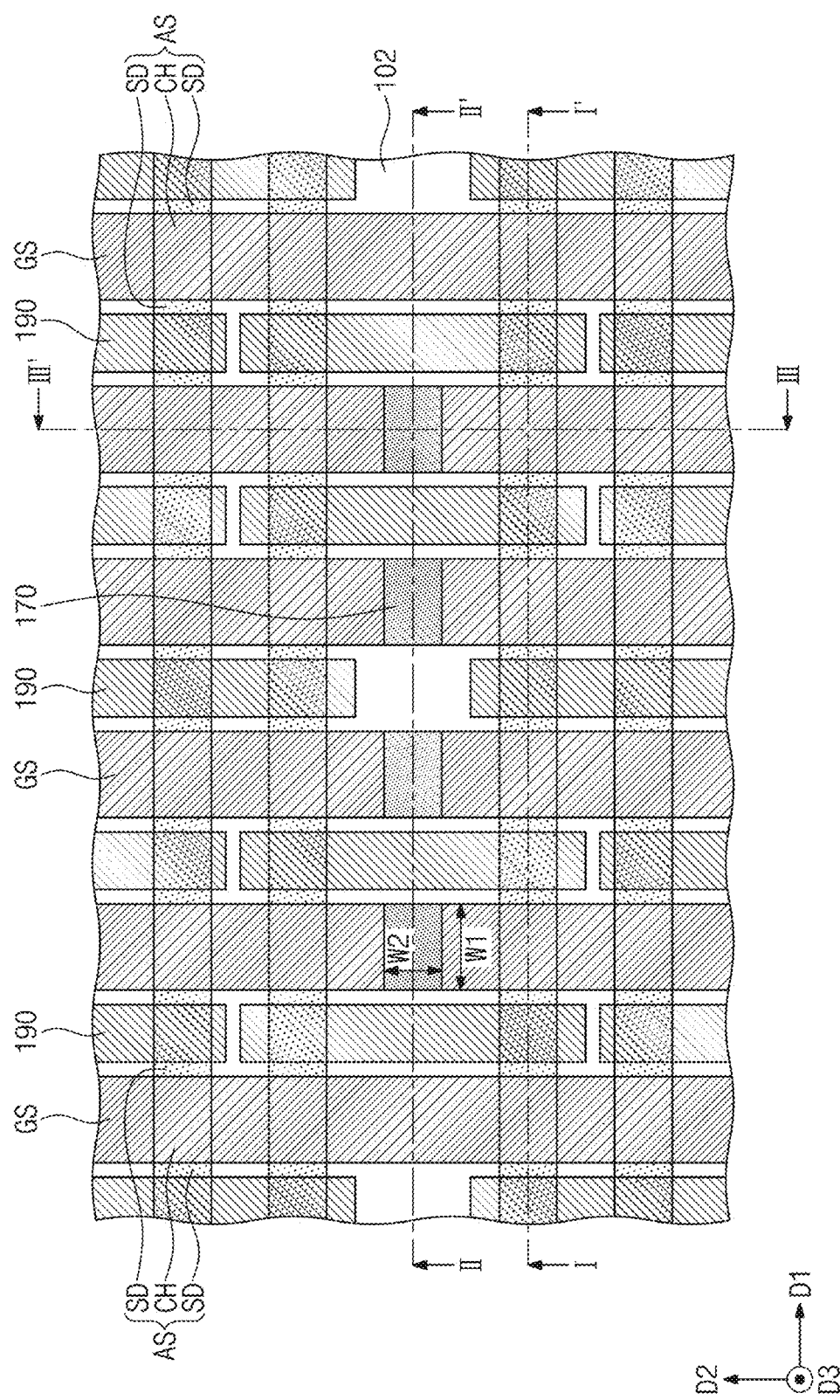
FIG. 1 illustrates a plan view showing a semiconductor device according to an example embodiment of the present inventive concepts.
Figure 2B:
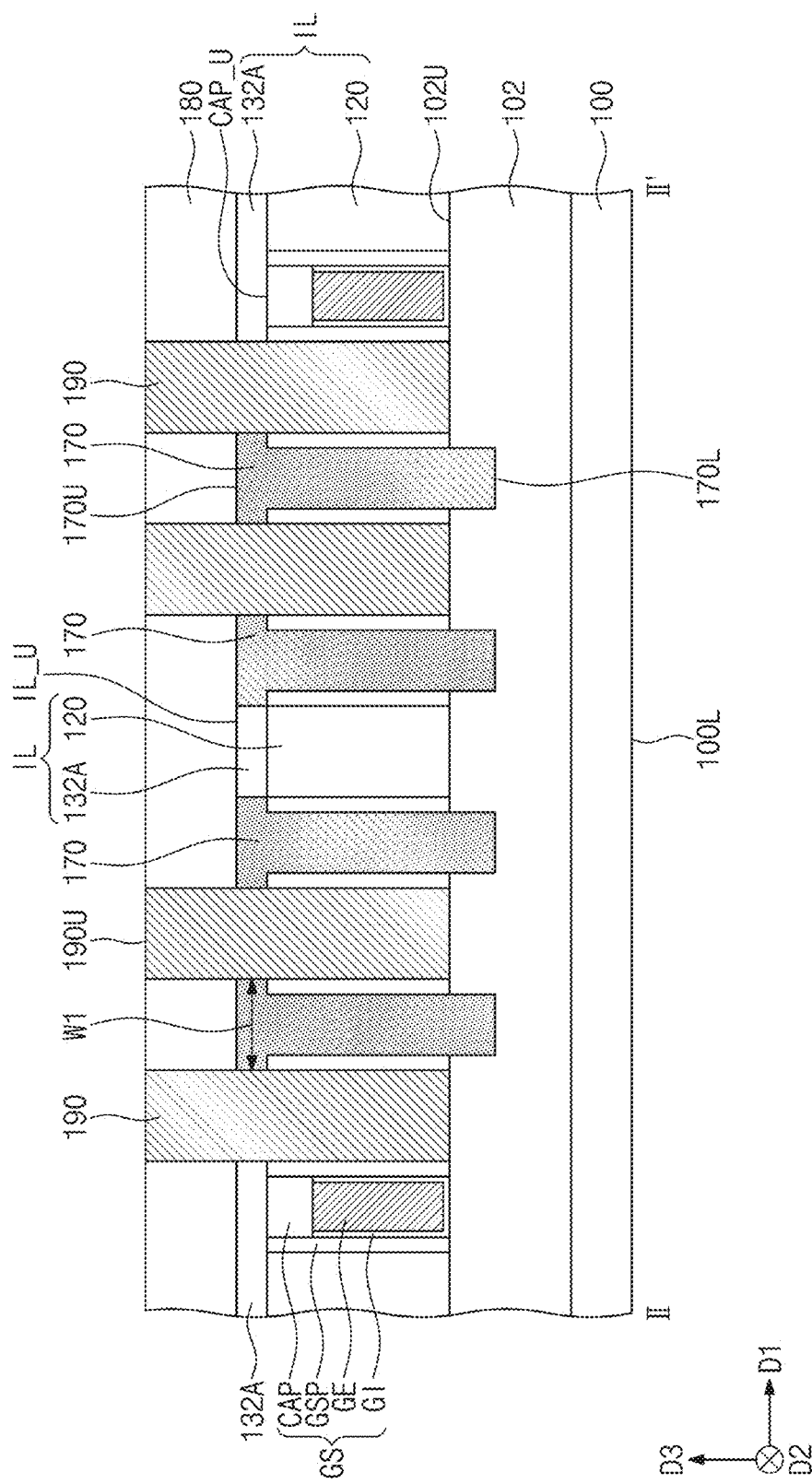
Figure 2C:
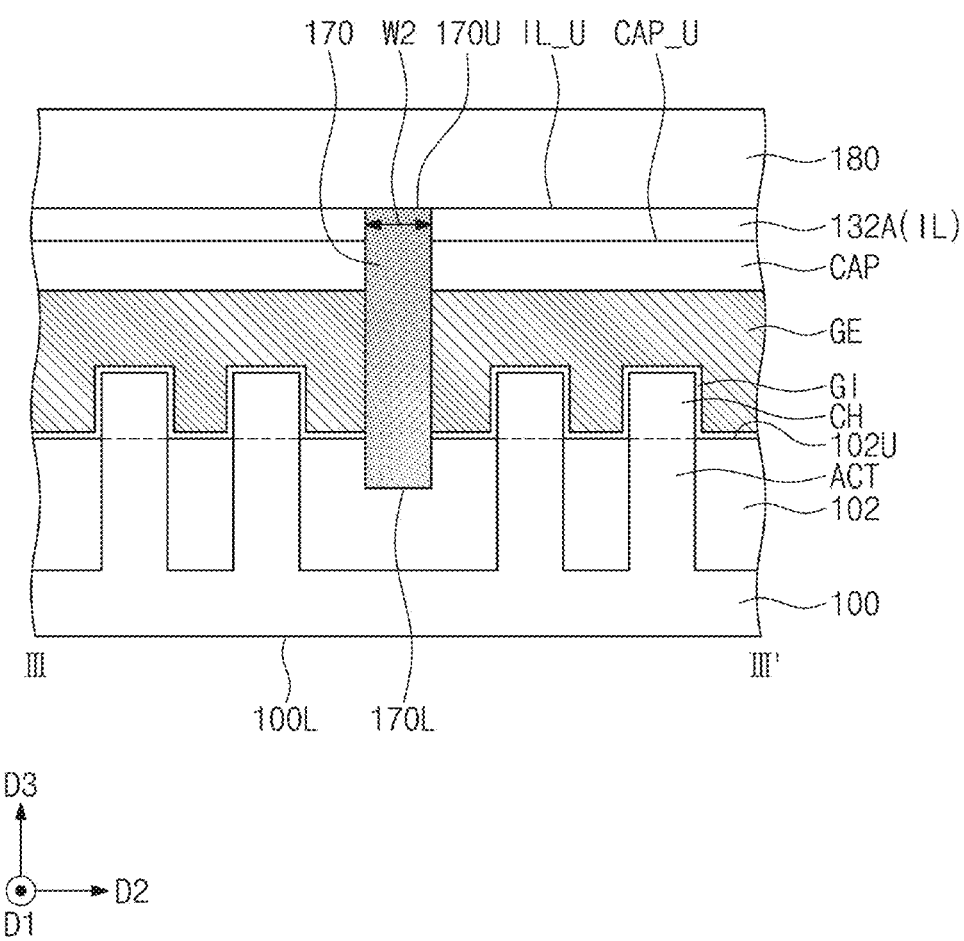
Figure 3:
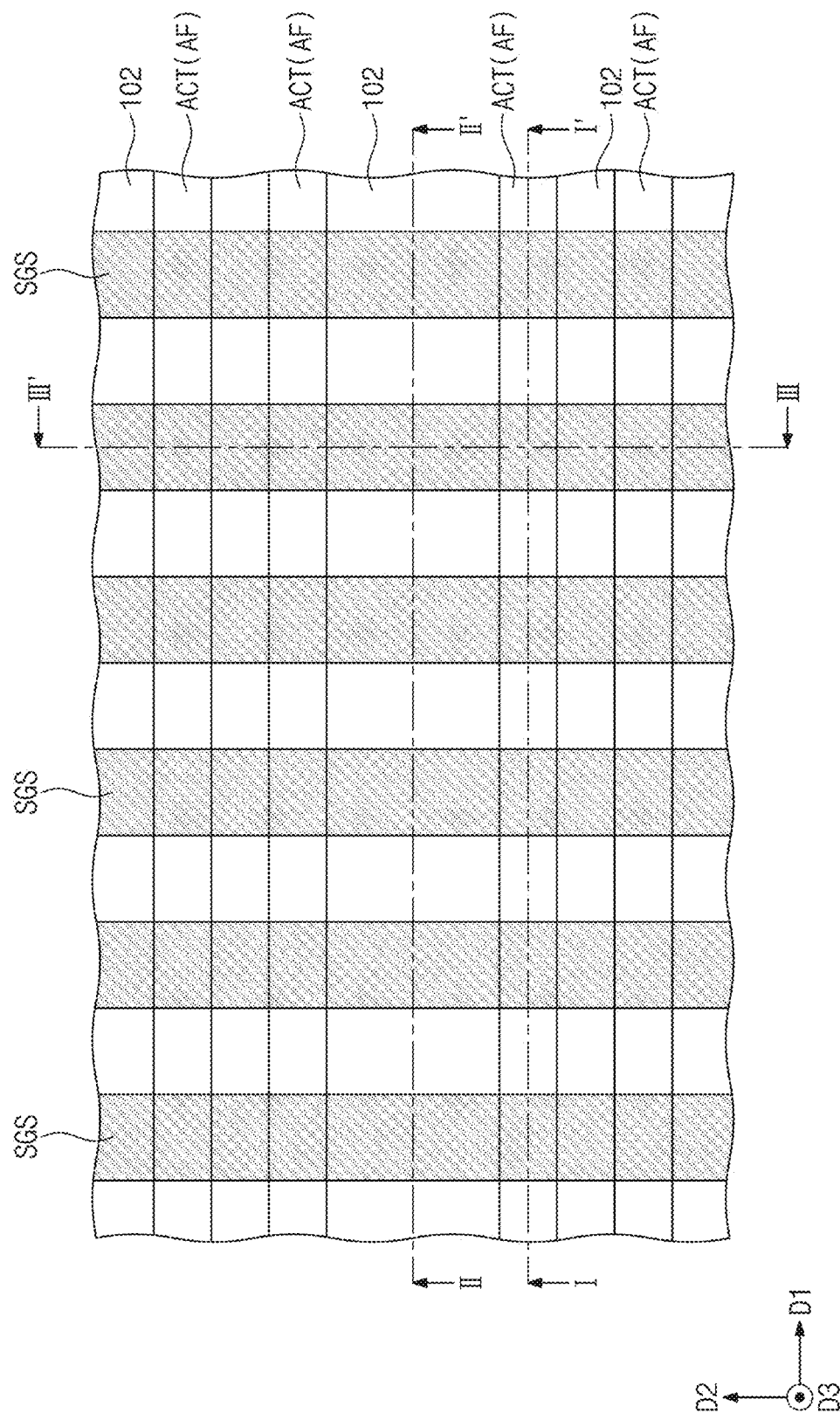
Figure 4A:
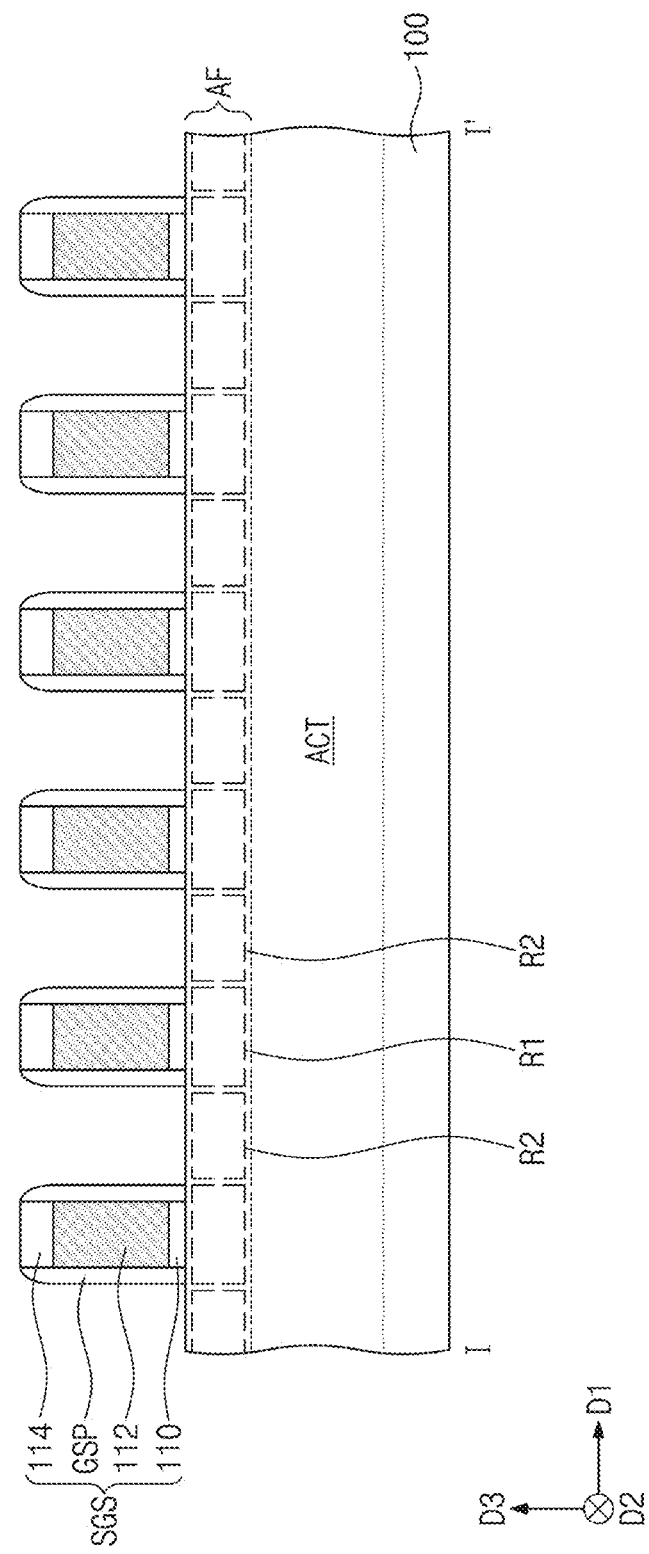
FIGS. 4A, 6A, 8A, 10A, 12A, 14A, 16A, 18A, and 20A illustrate cross-sectional views taken along line I-I' of FIGS. 3, 5, 7, 9, 11, 13, 15, 17, and 19, respectively.
Figure 4B:
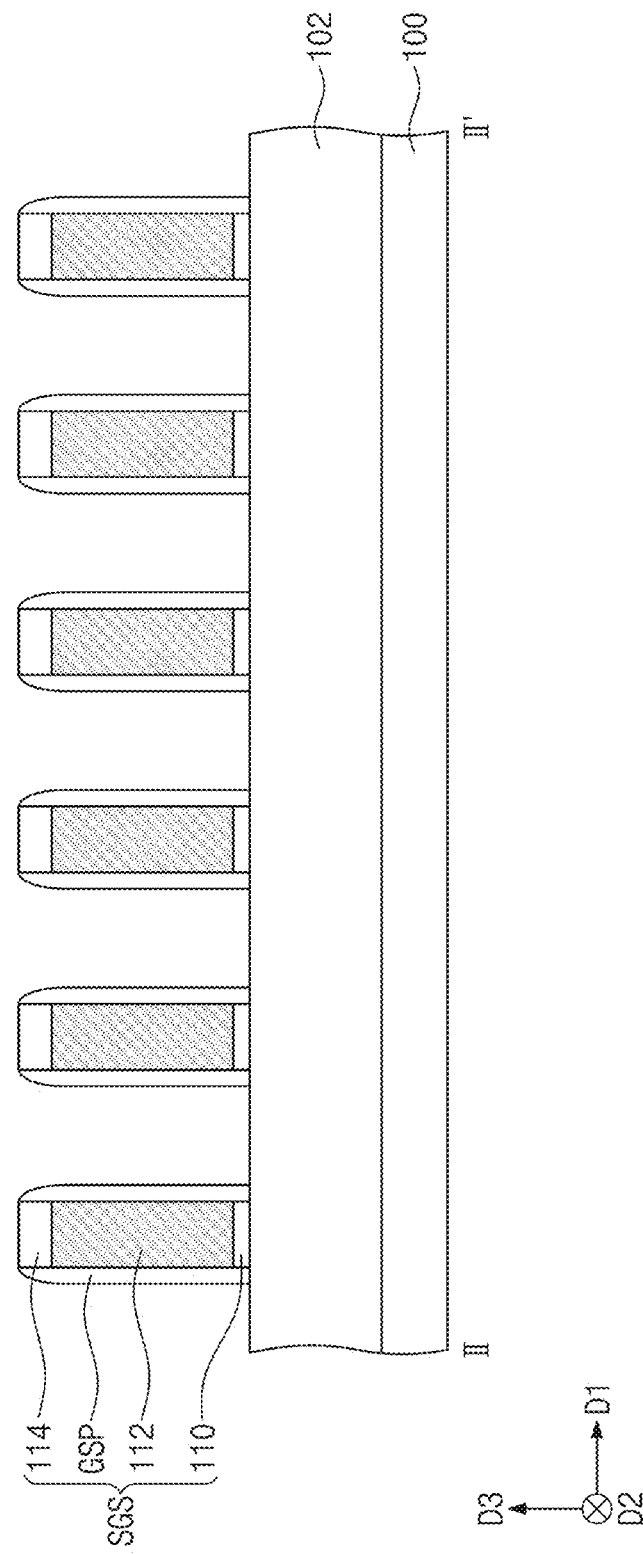
Figure 5:
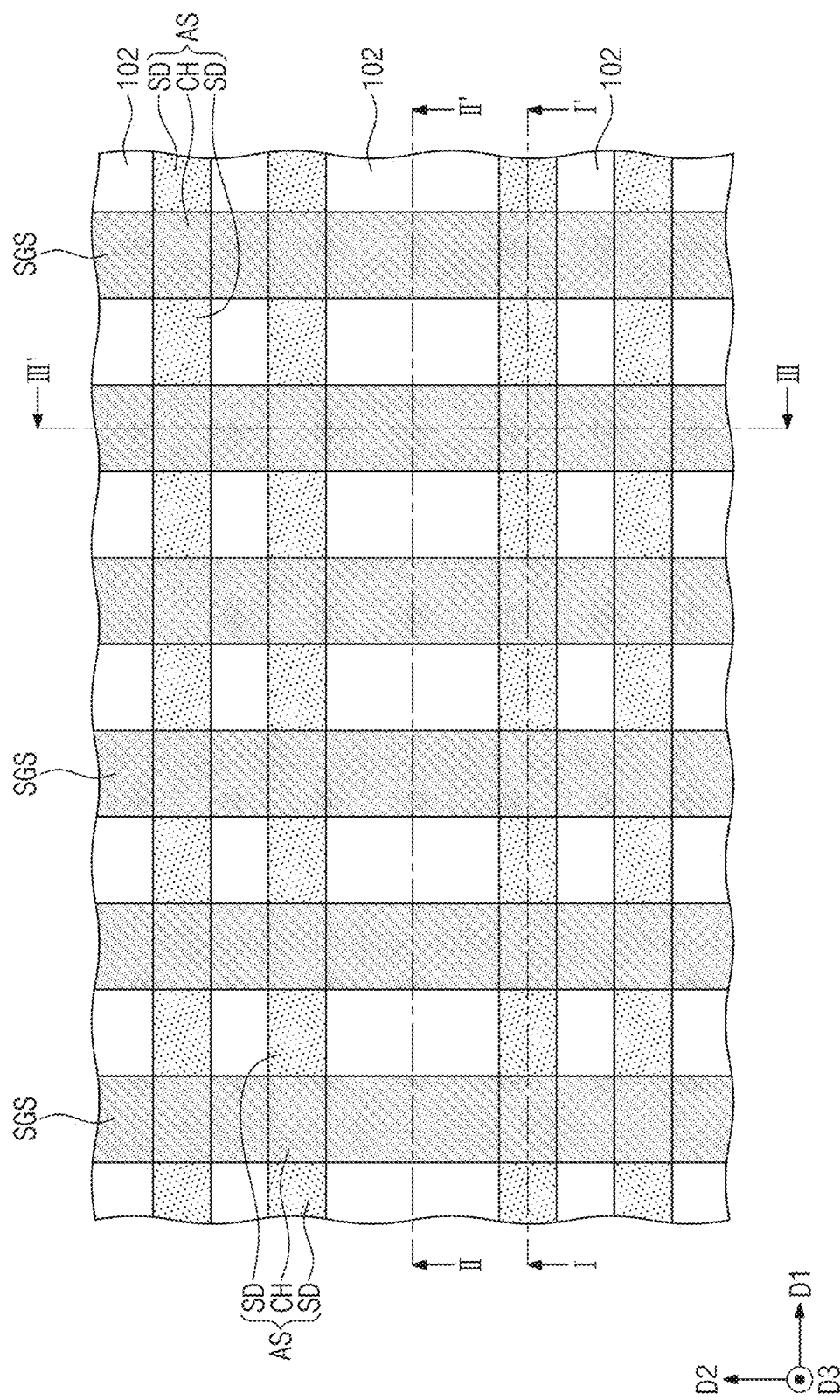
Figure 6A:
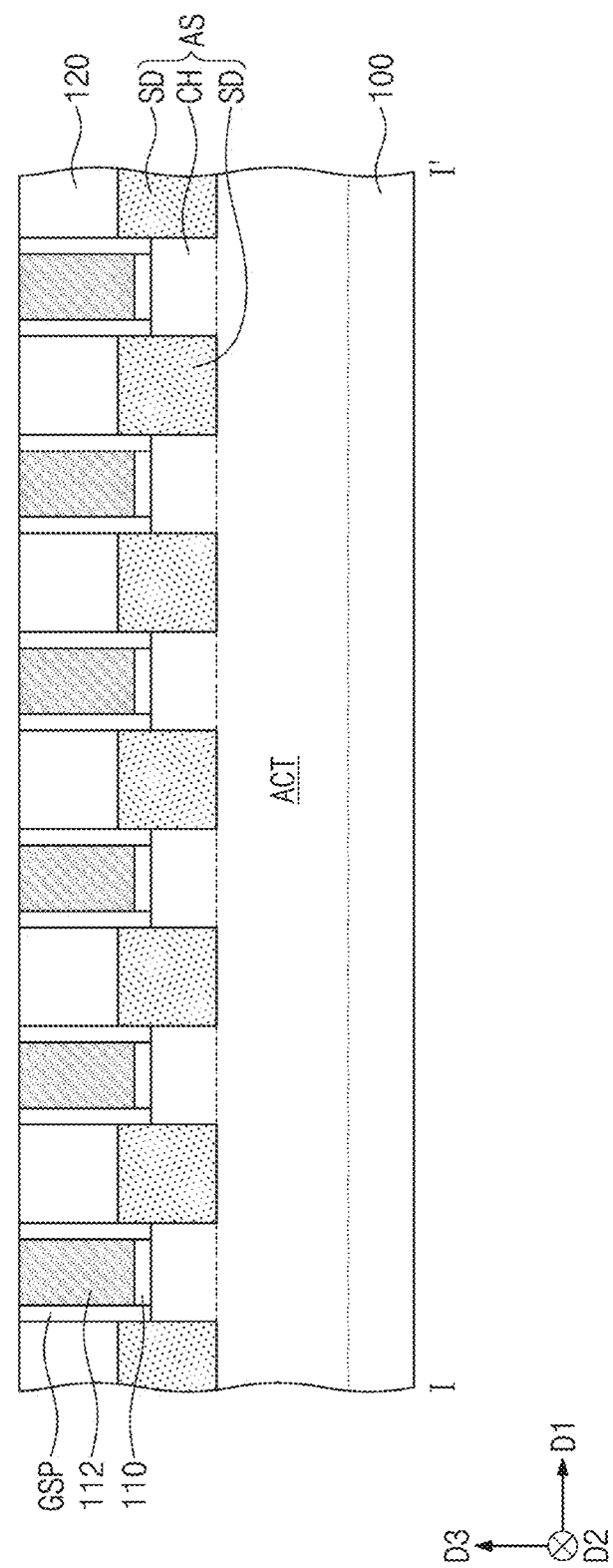
Figure 6B:
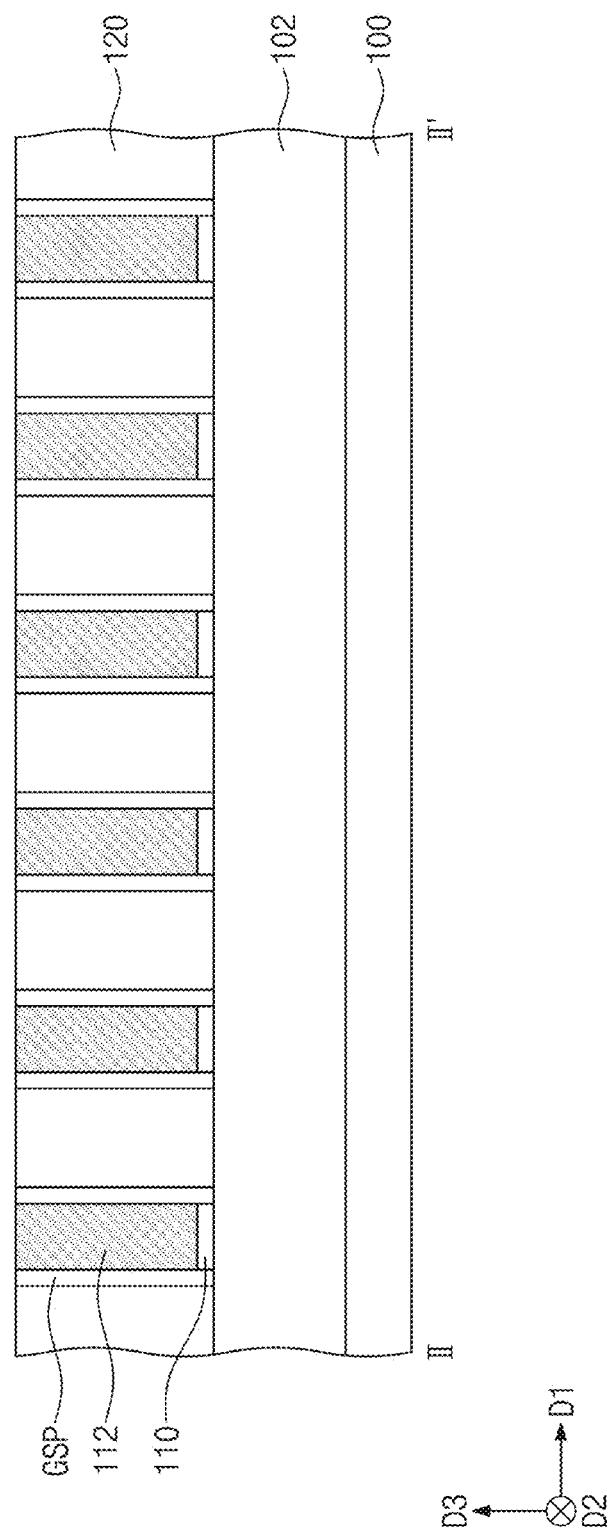
Figure 8A:
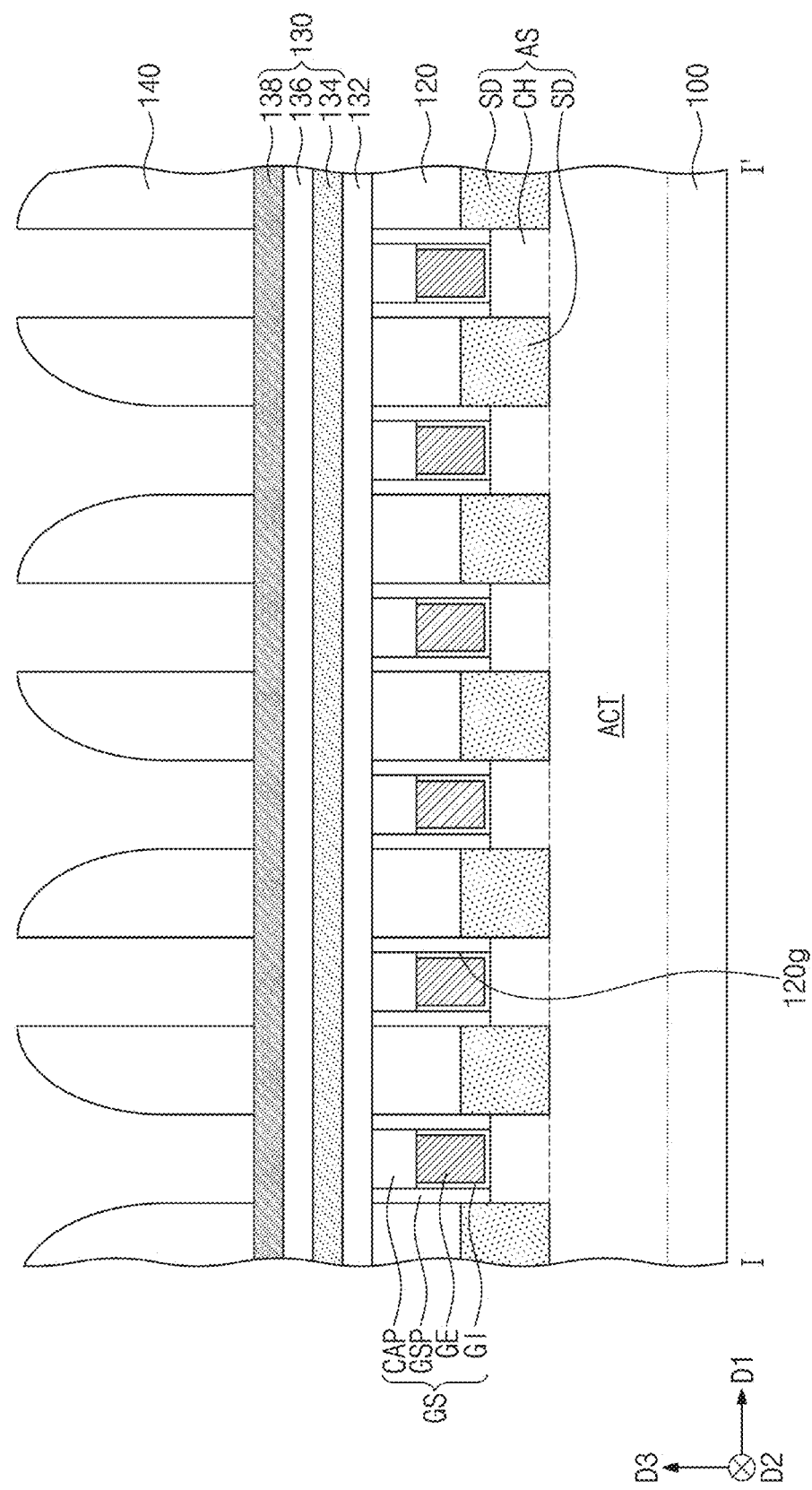
Figure 8B:
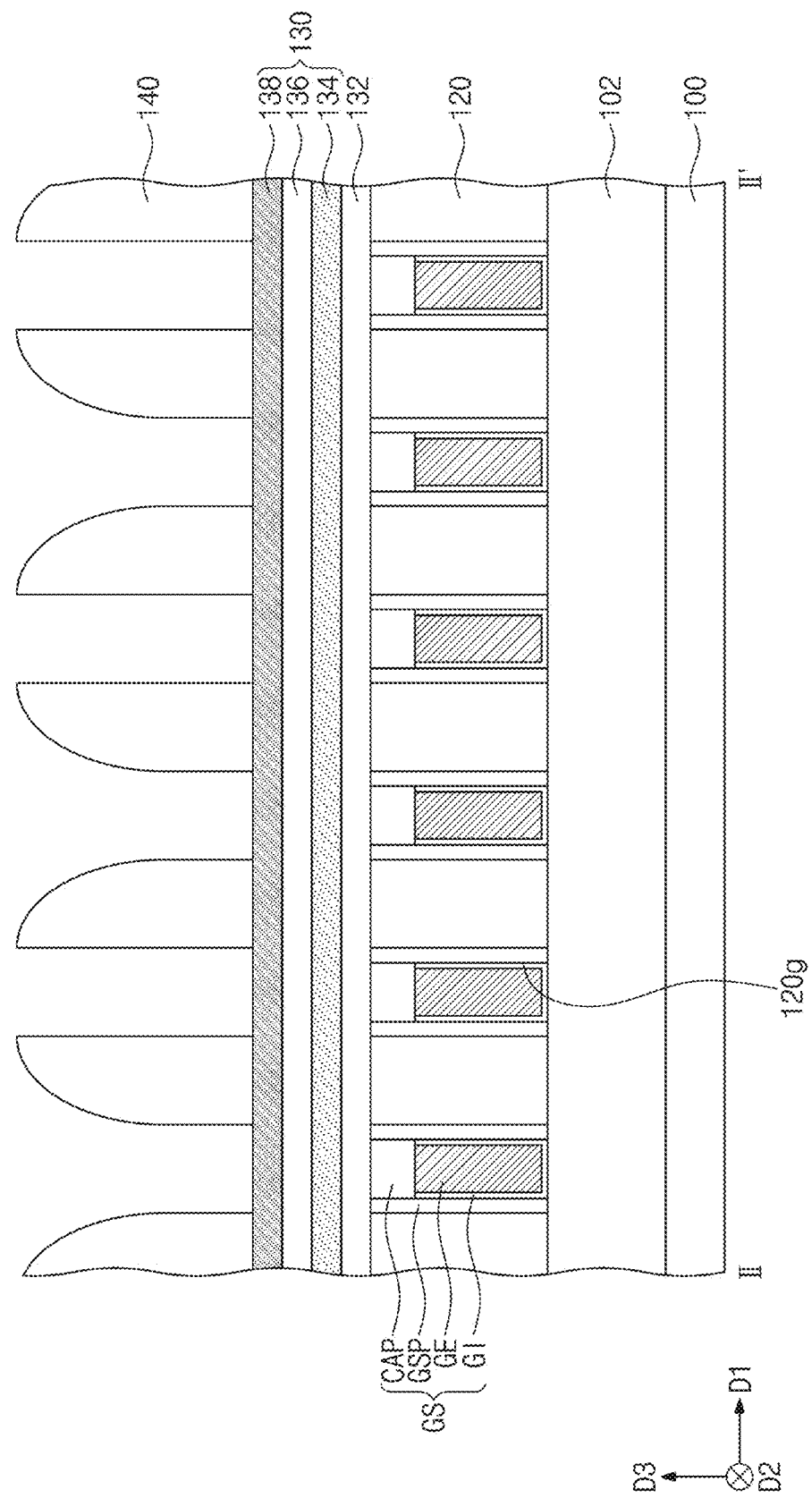
Figure 9:
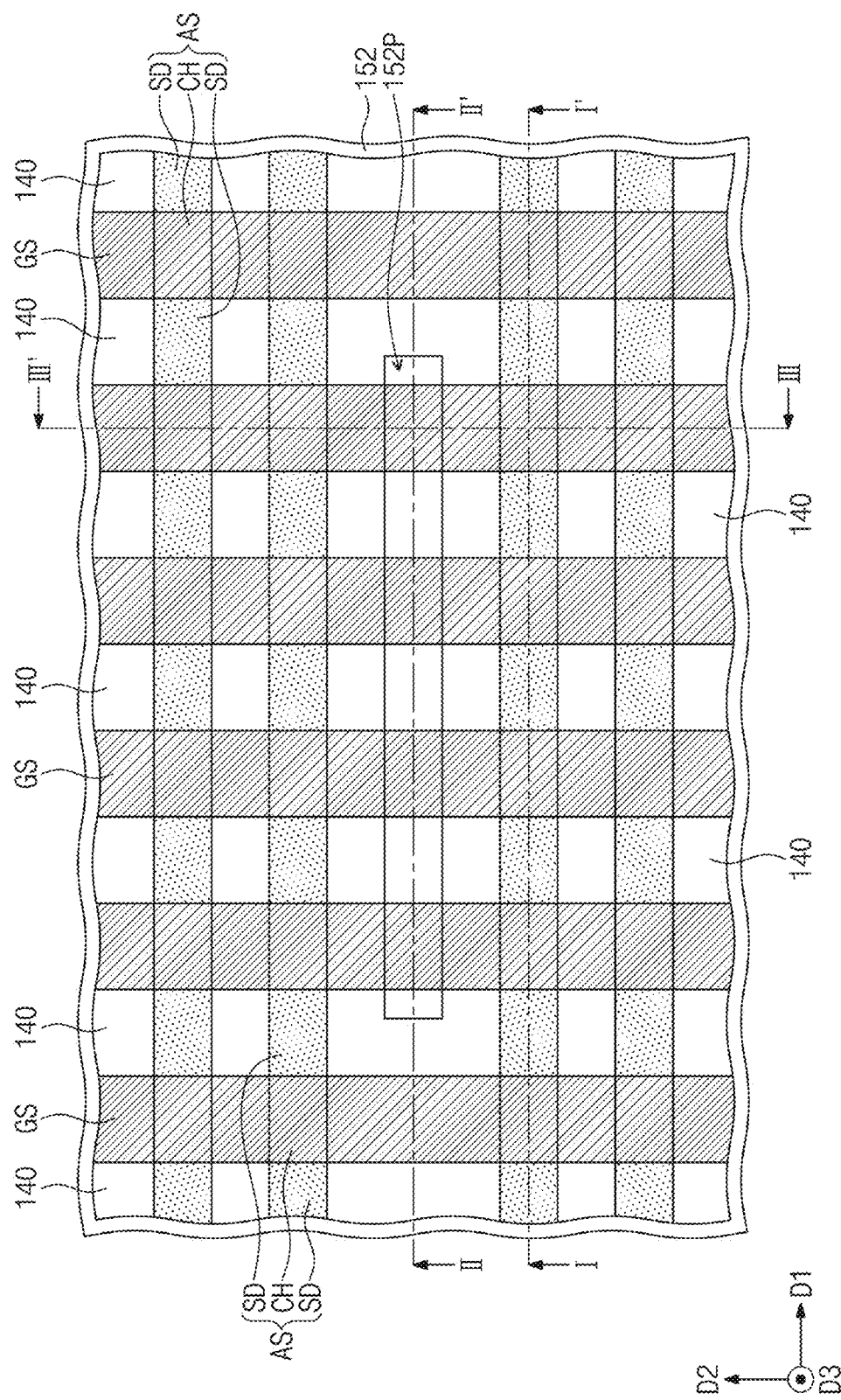
Figure 10A:
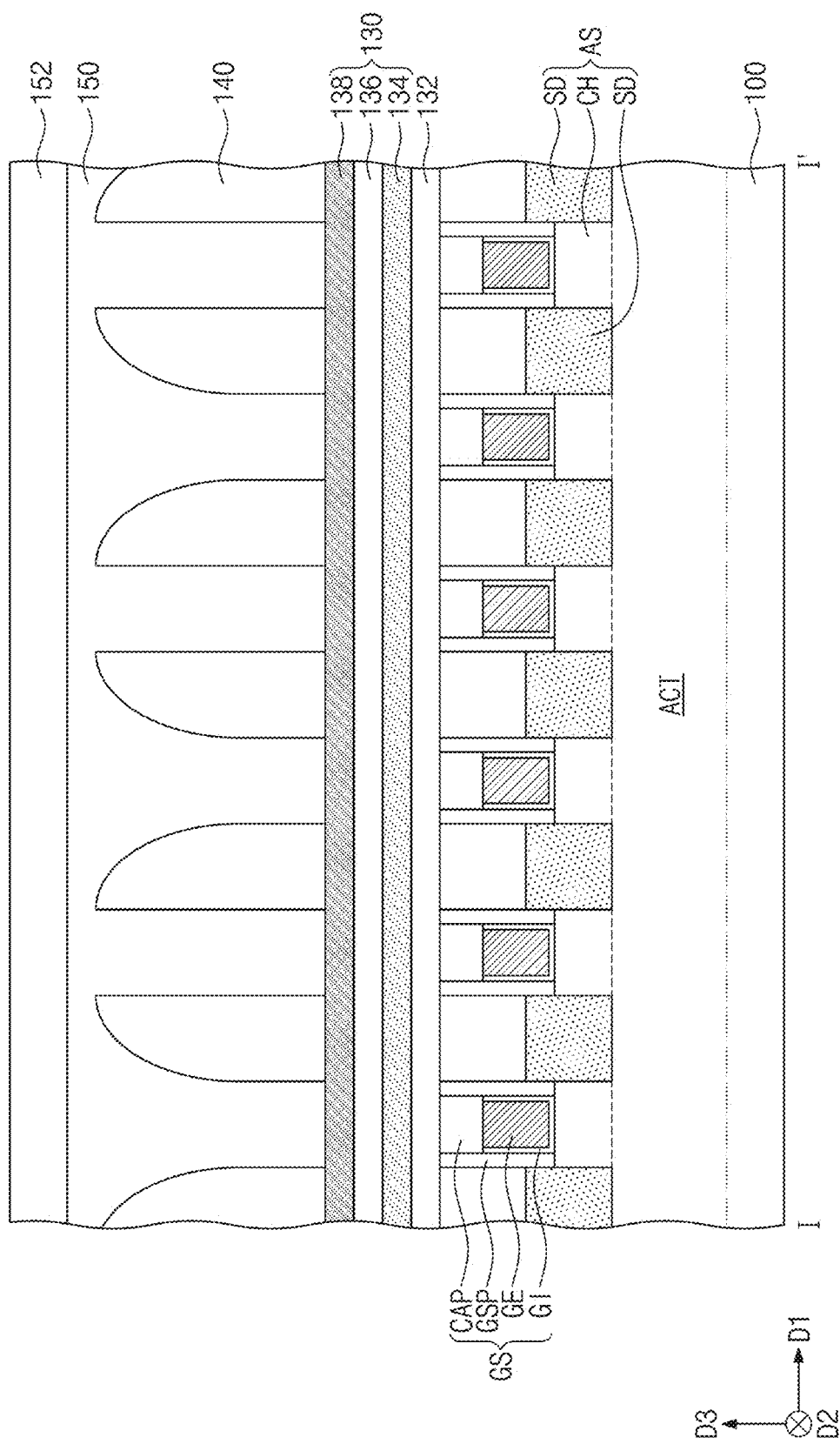
Figure 10C:
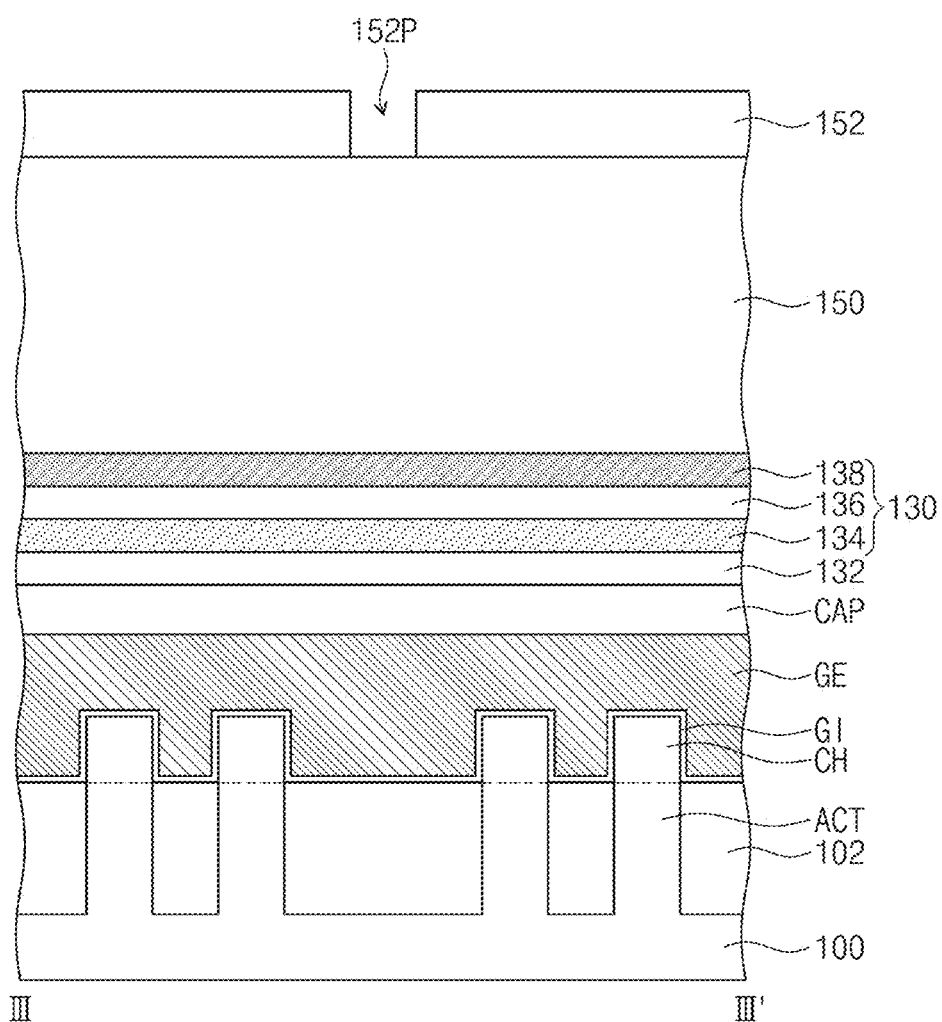
Figure 11:
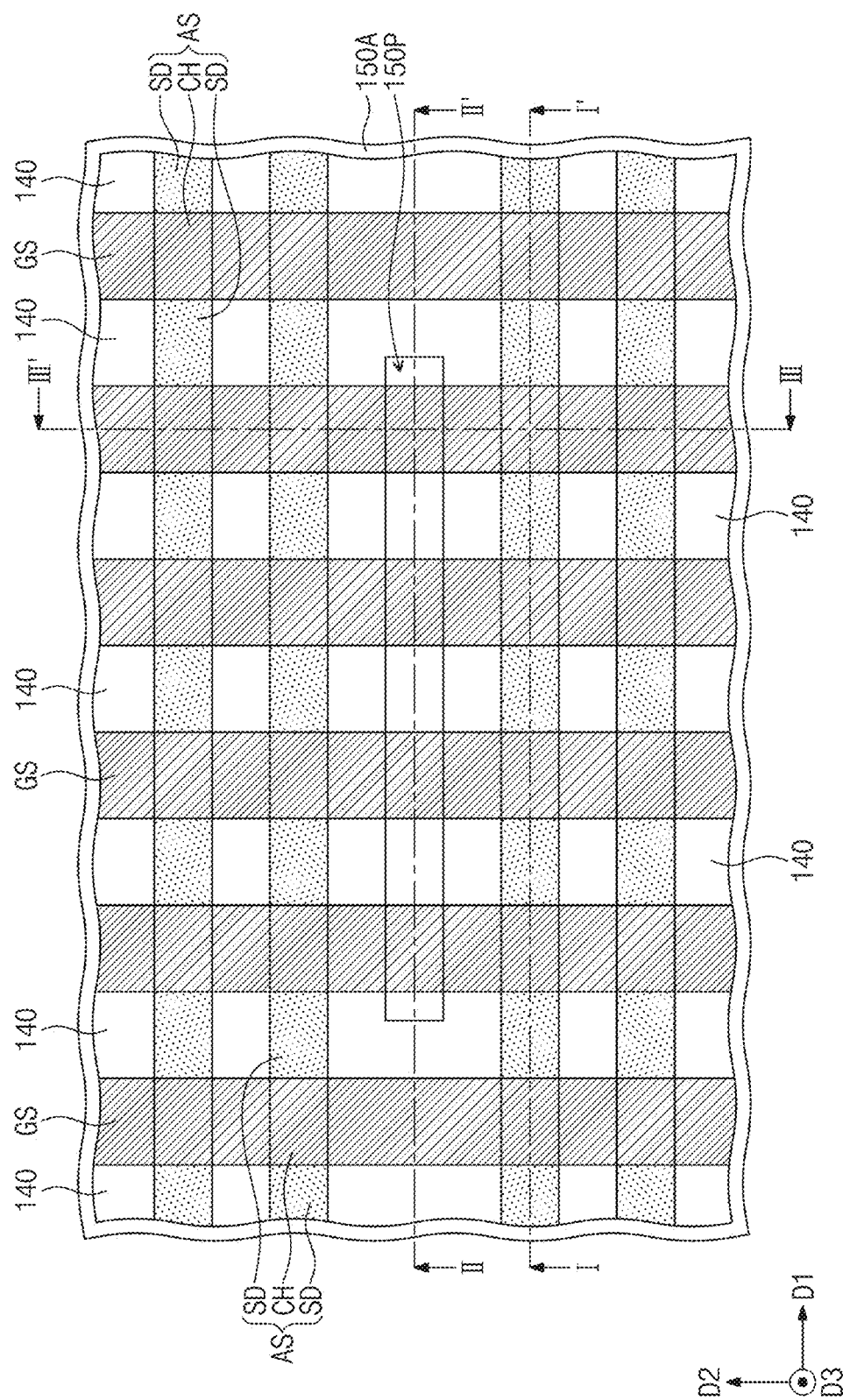
Figure 12A:
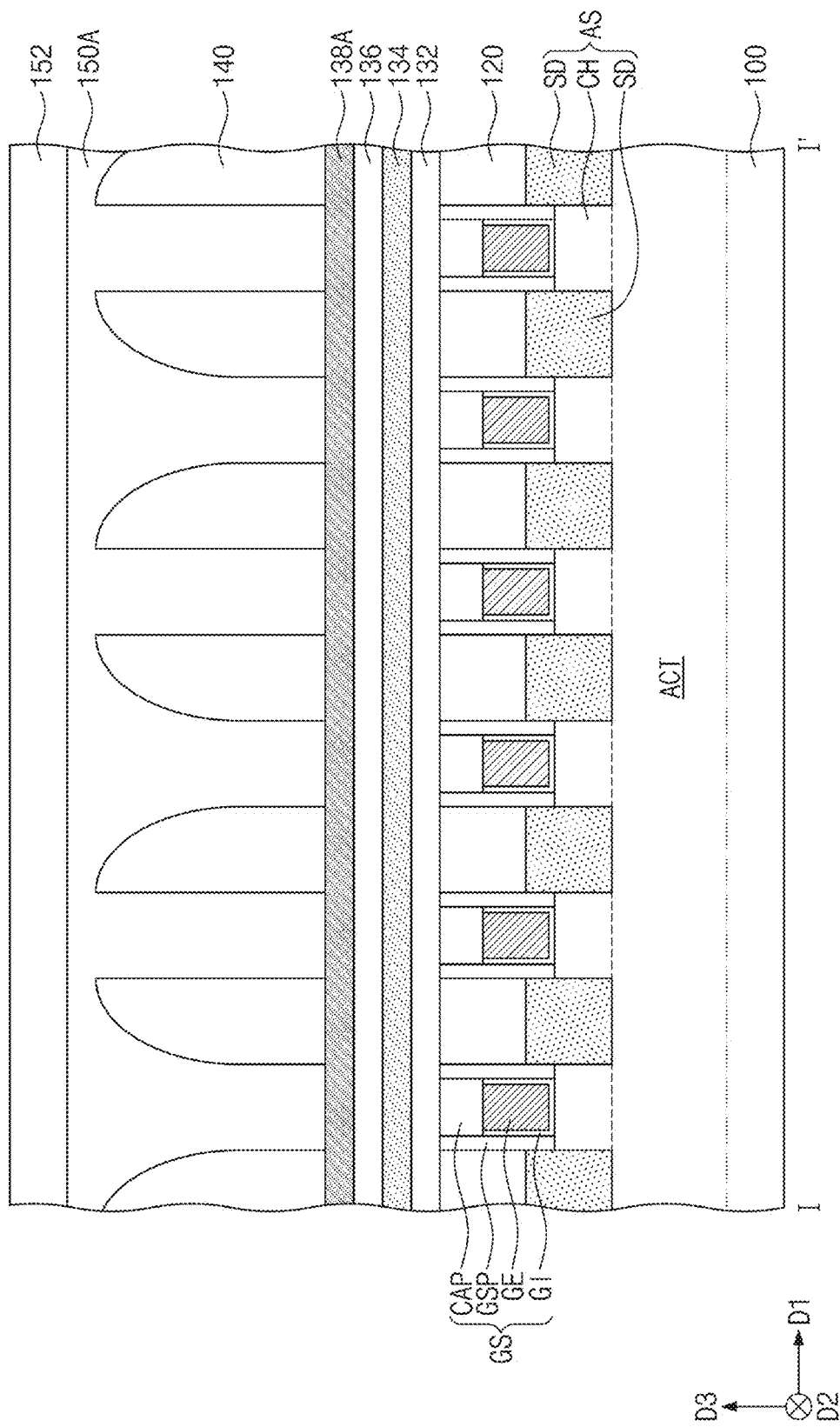
Figure 13:
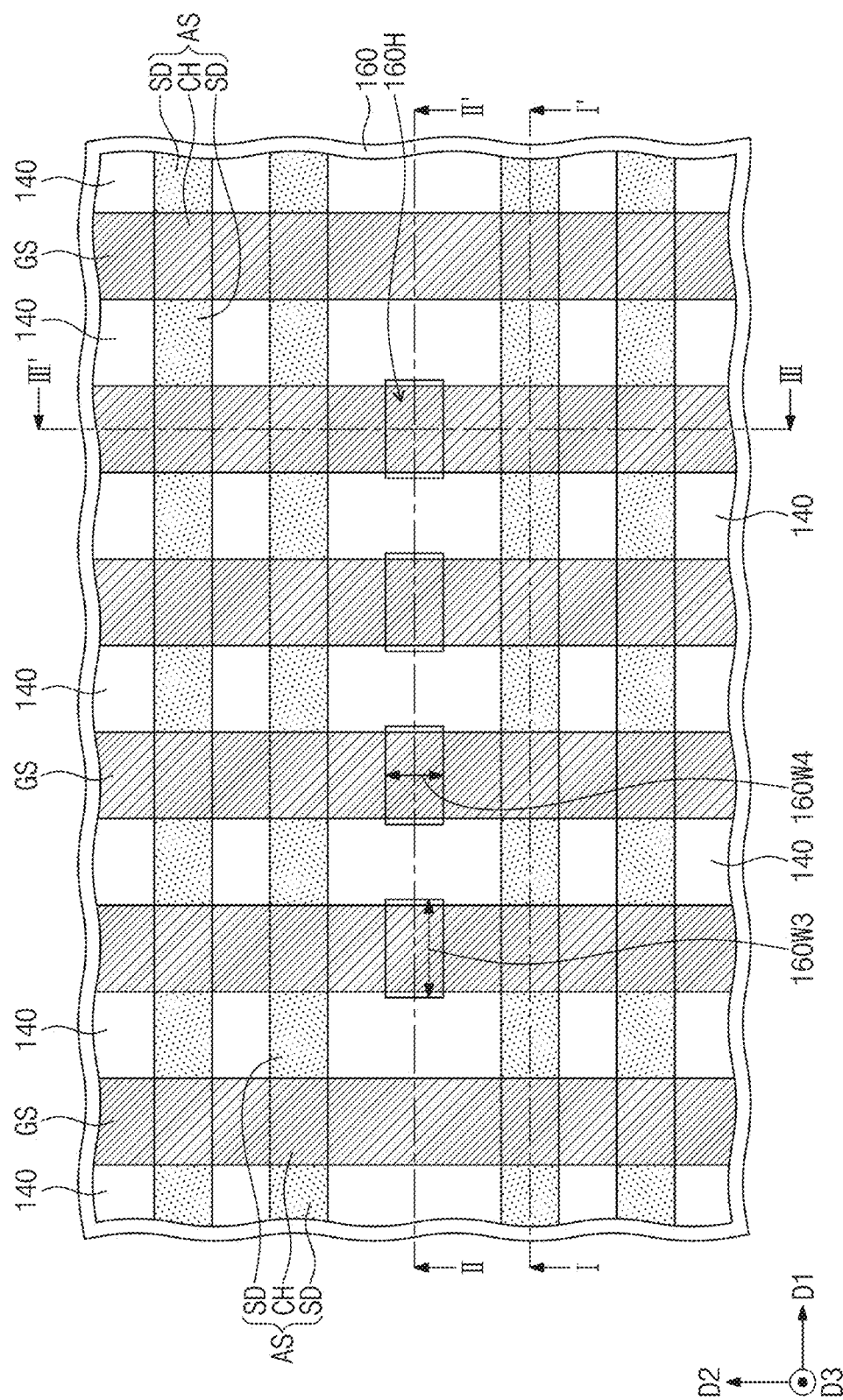
Figure 14A:
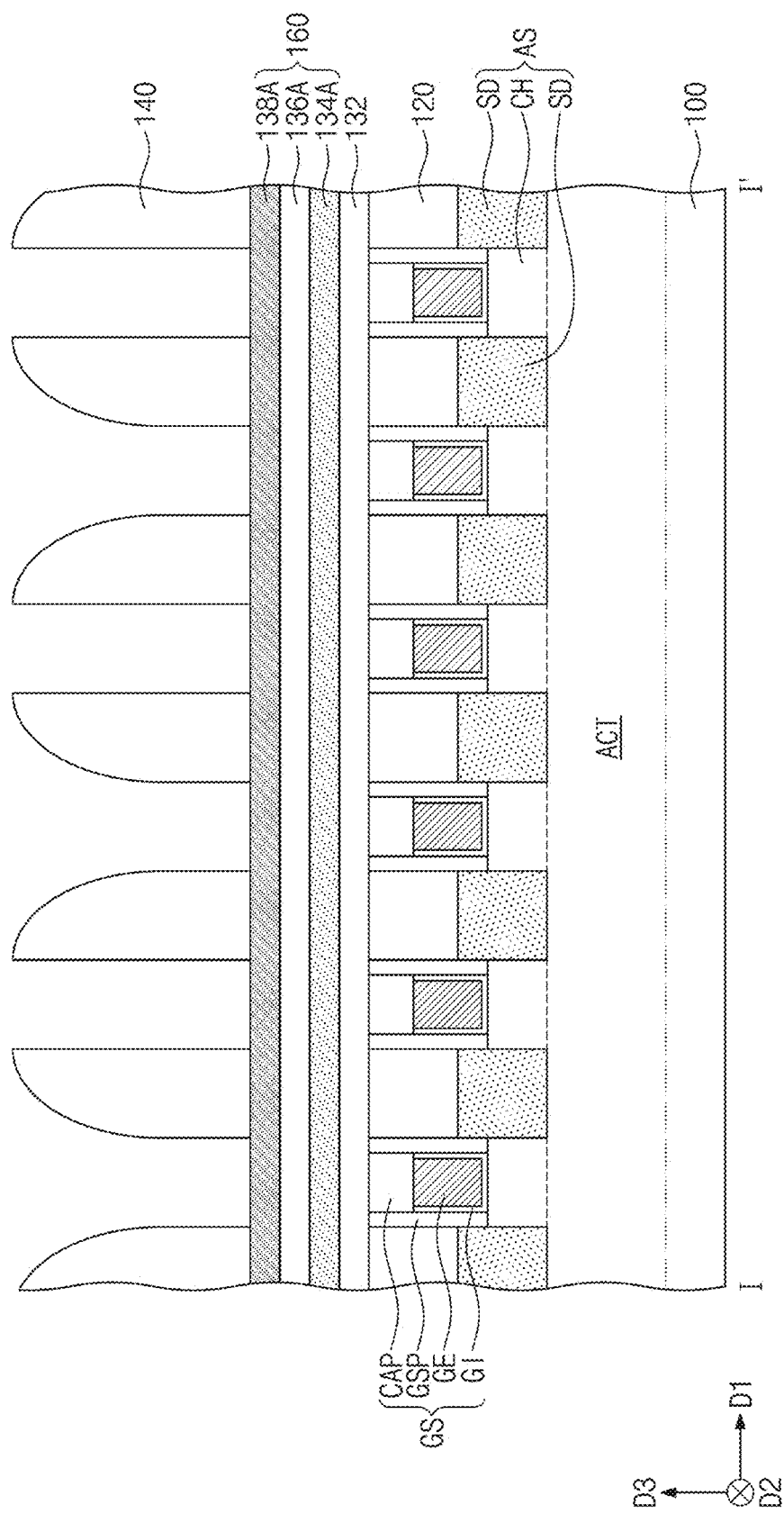
Figure 14B:
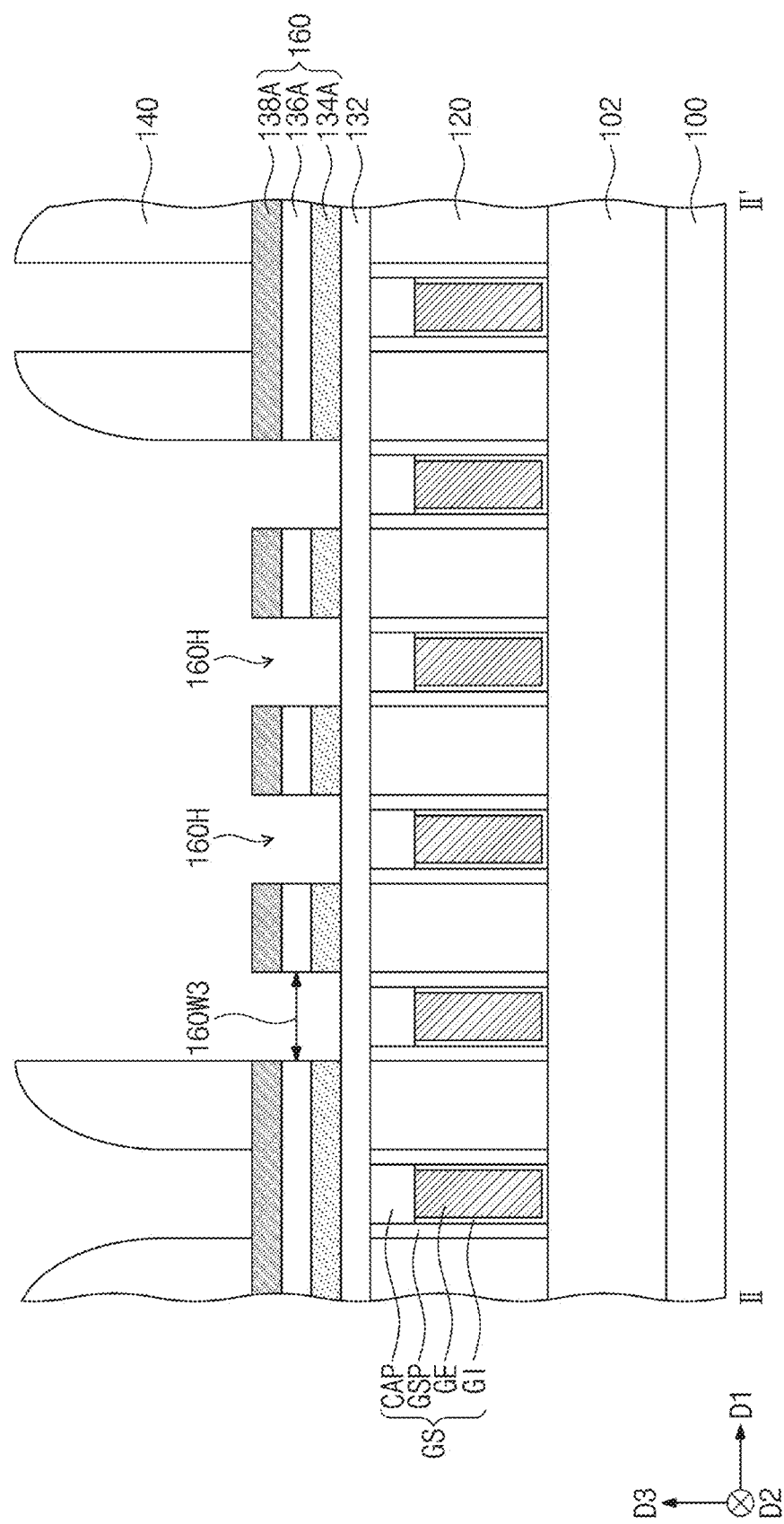
Figure 14C:
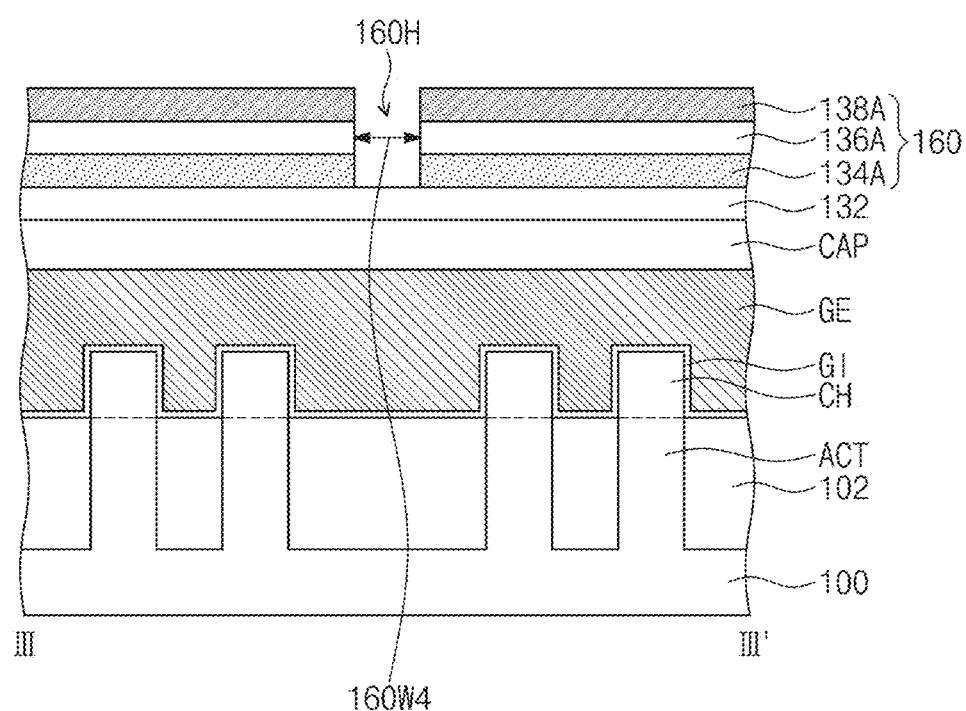
Figure 15:
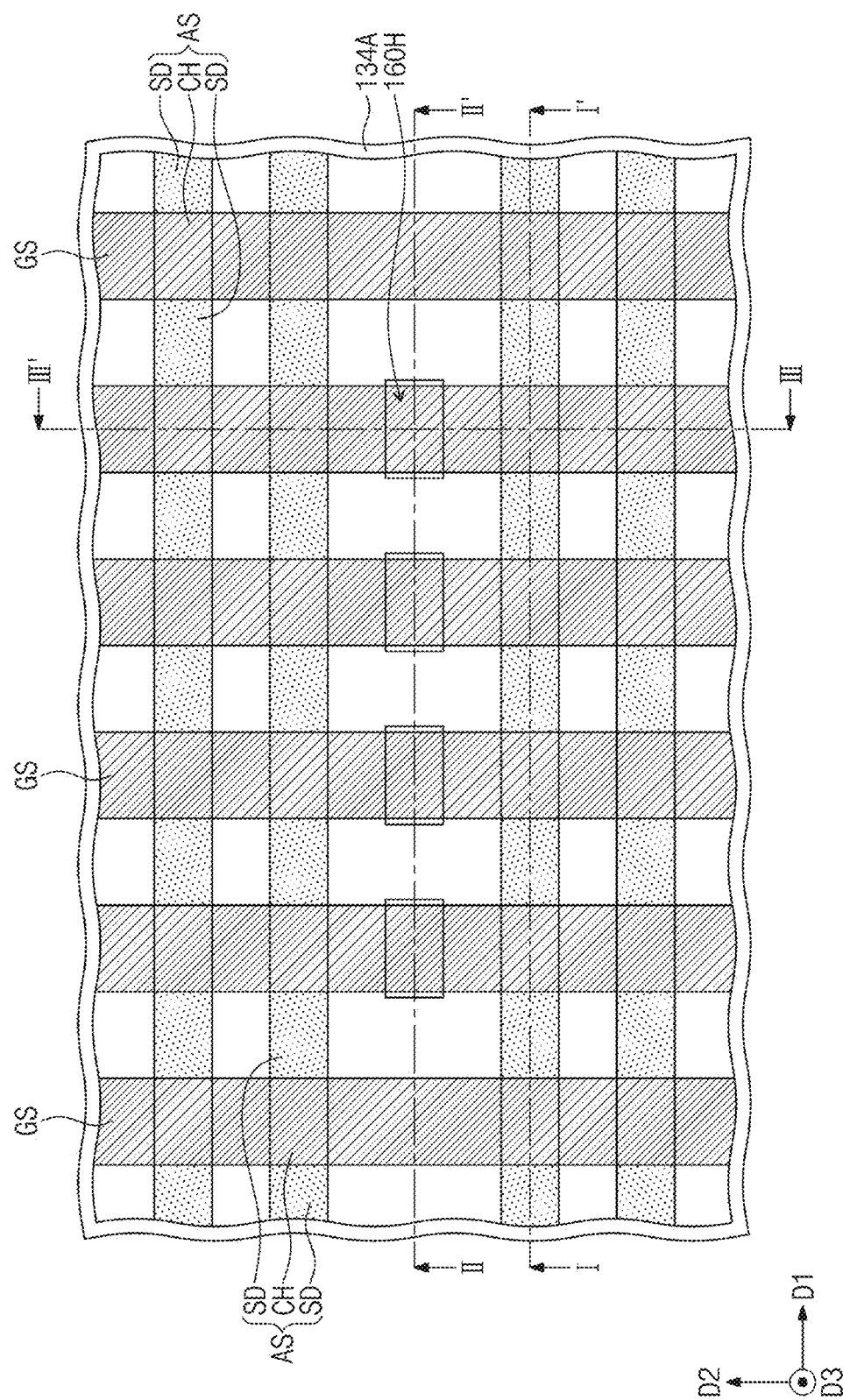
Figure 16A:
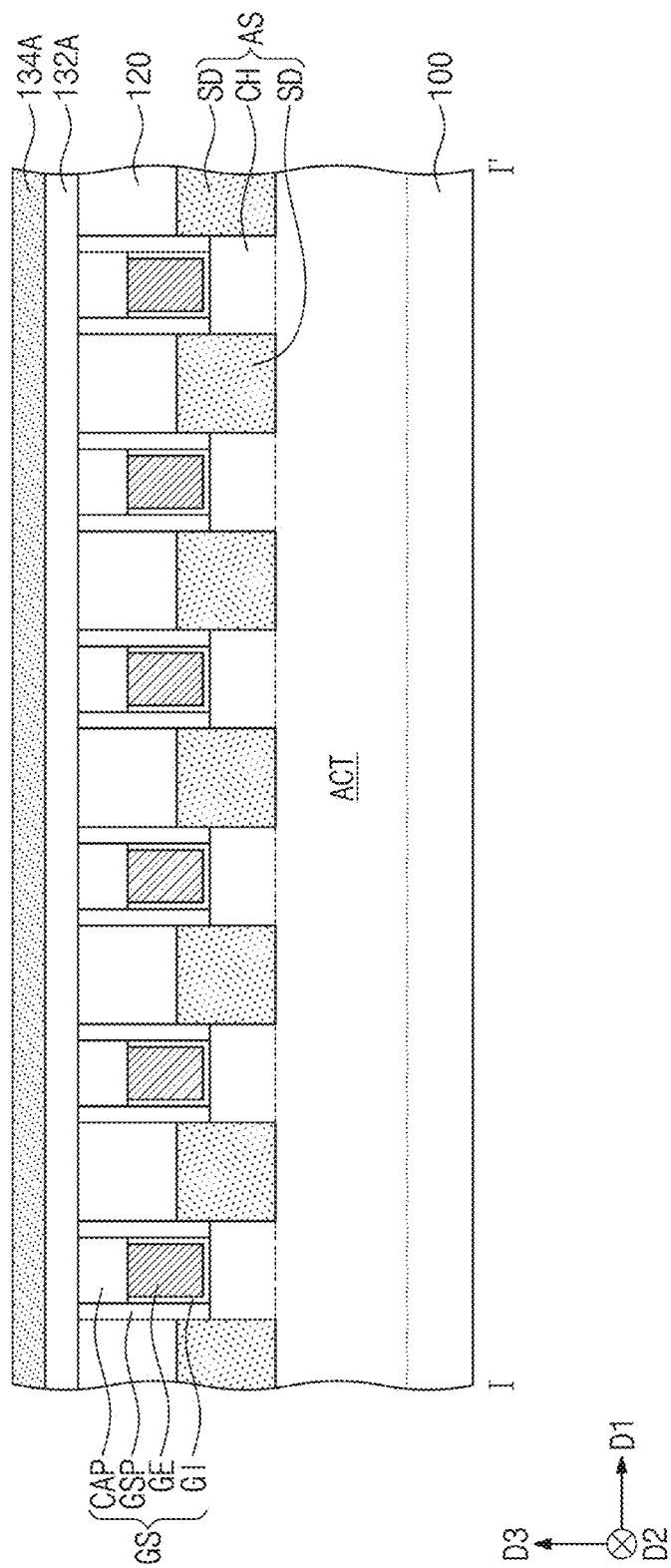
Figure 16B:
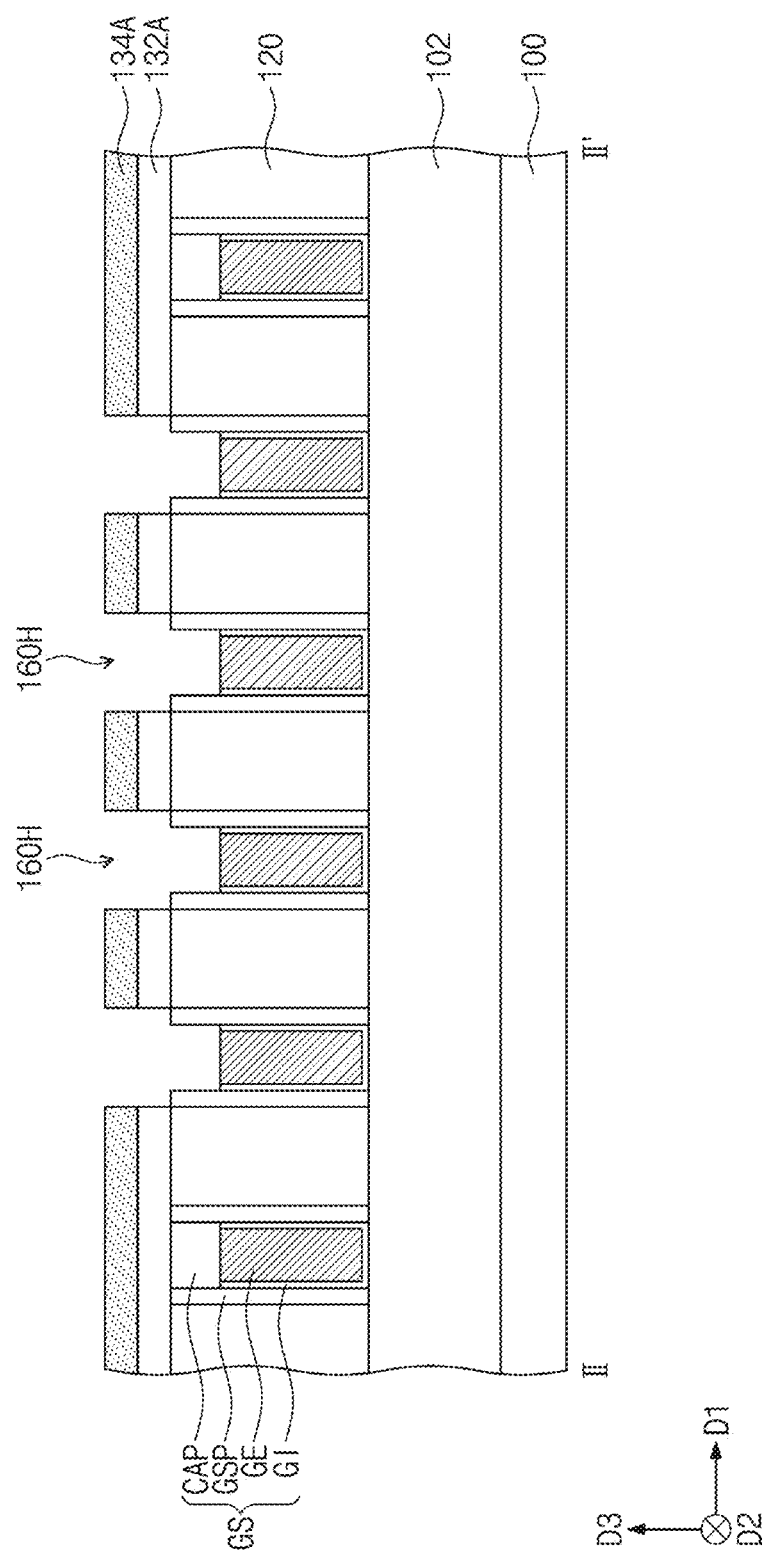
Figure 16C:
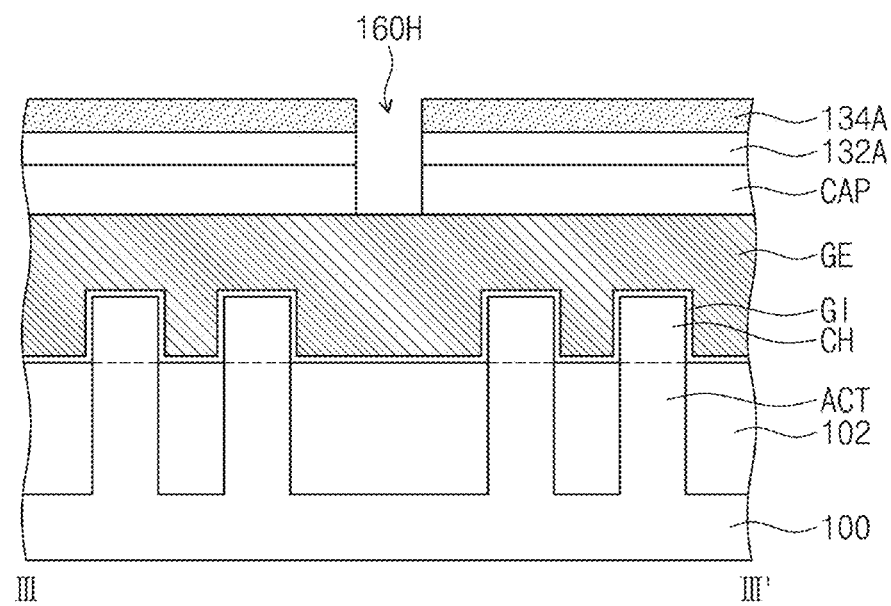
Figure 17:
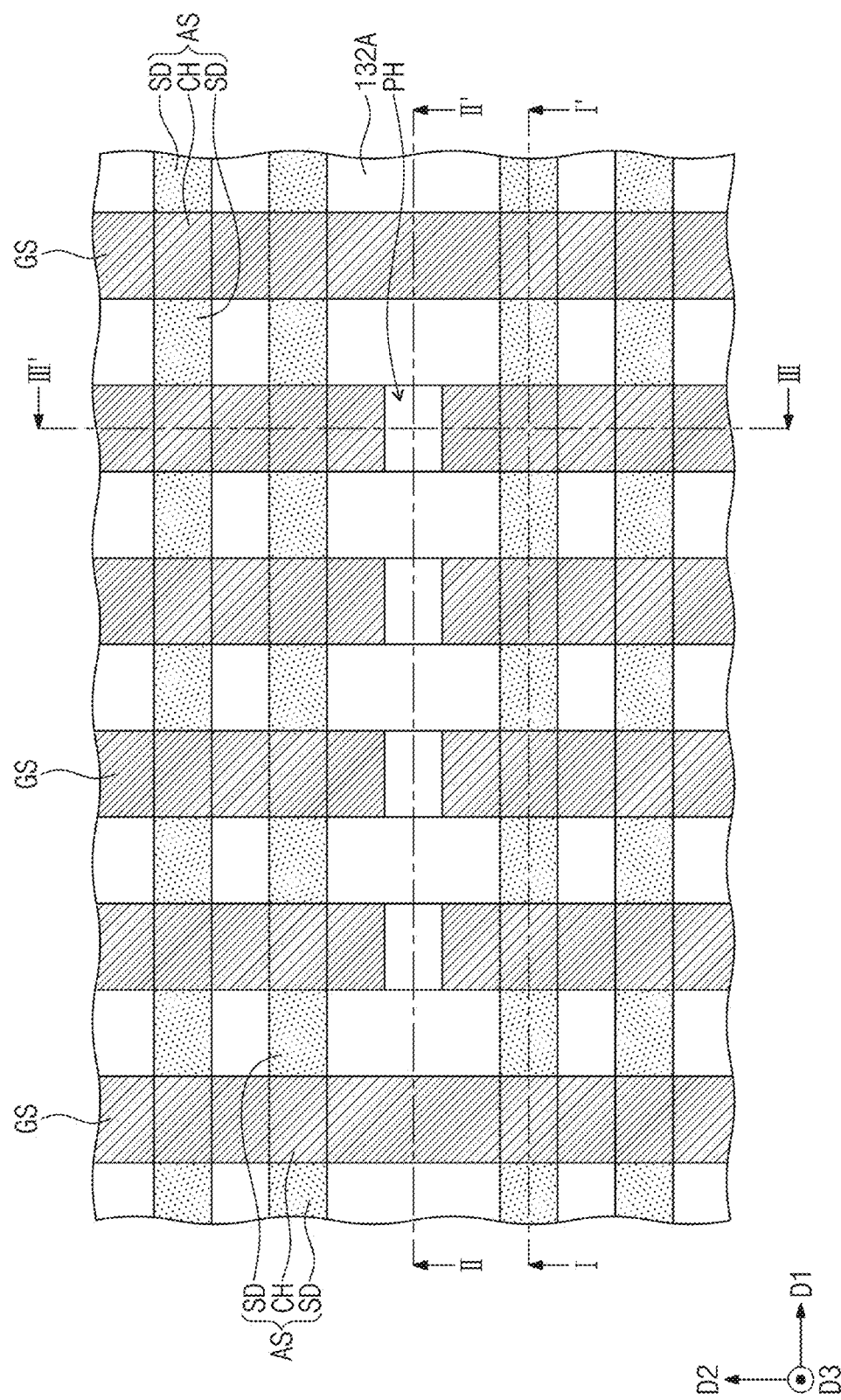
Figure 18A:
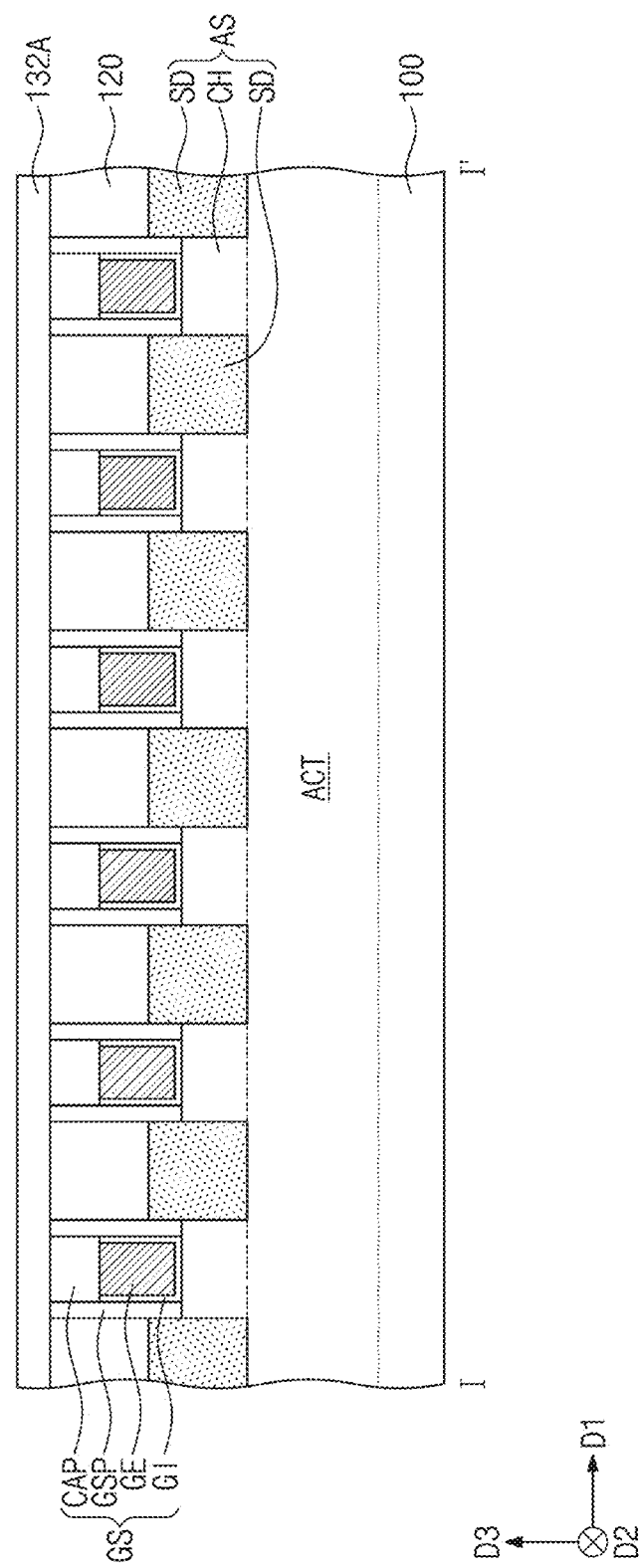
Figure 18B:
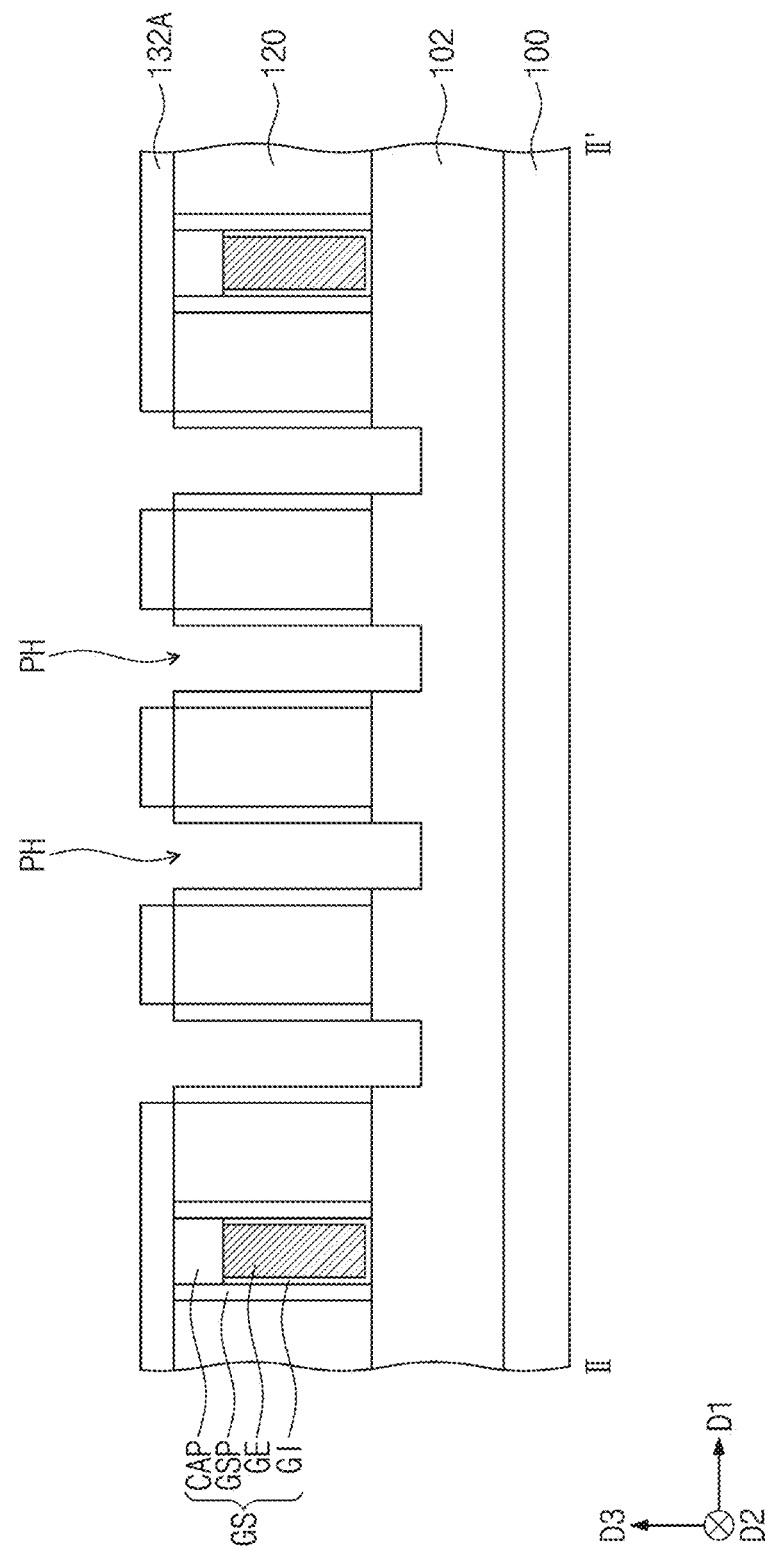
Figure 18C:
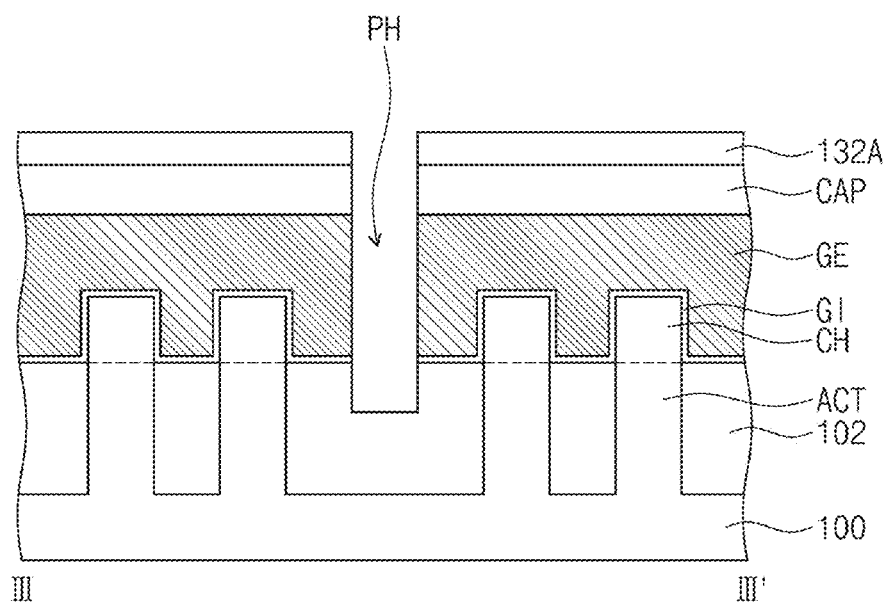
Figure 19:
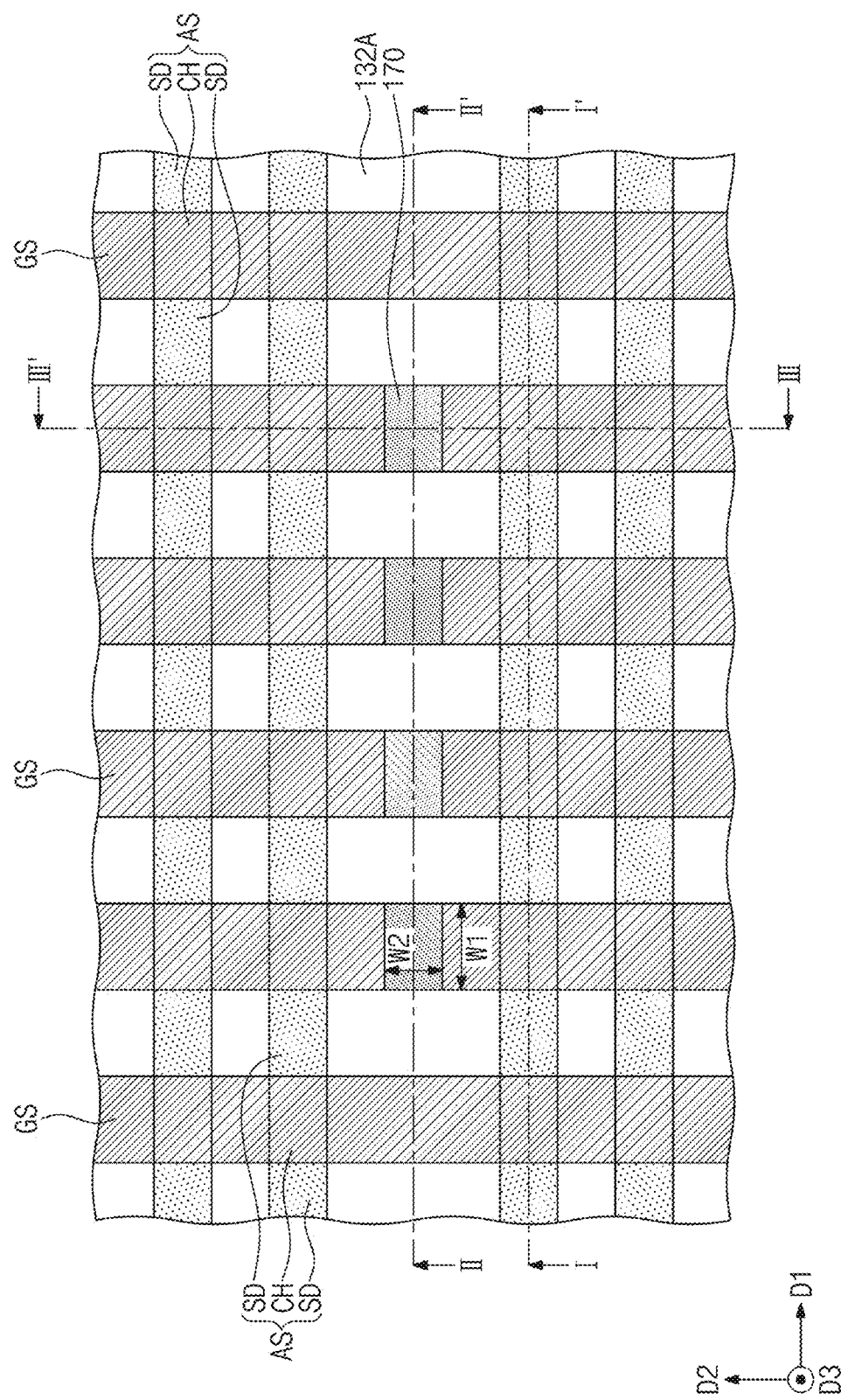
Figure 20A:
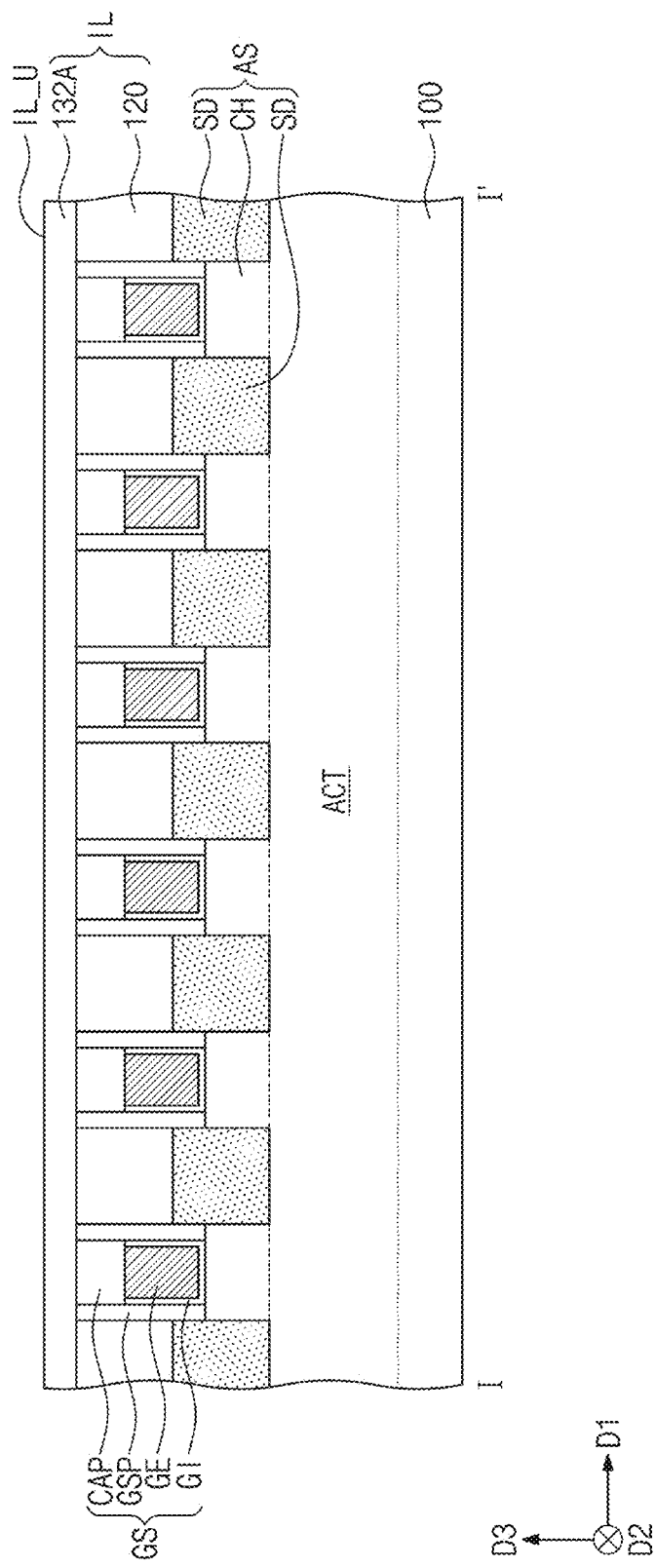
Figure 20B:
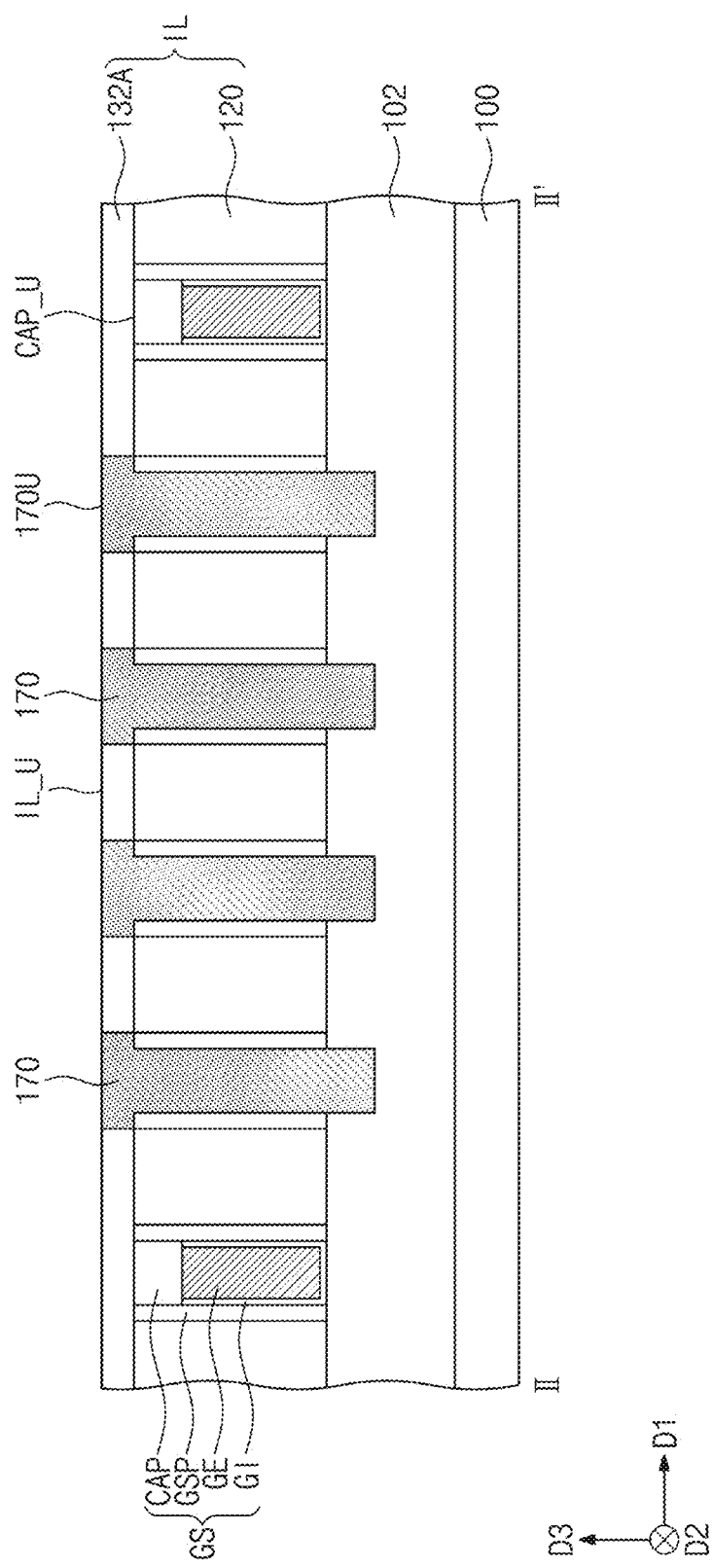
Figure 20C:
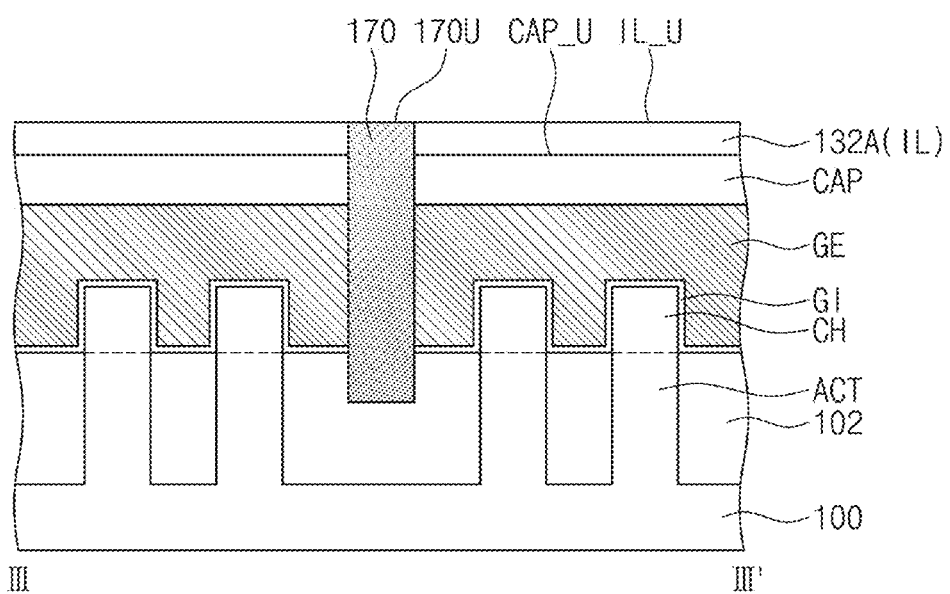

FIG. 1 illustrates a plan view showing a semiconductor device according to an example embodiment of the present inventive concepts. FIGS. 2A, 2B, and 2C illustrate cross-sectional views taken along lines I-I', II-II', and III-III' of FIG. 1, respectively.

Referring to FIGS. 1 and 2A to 2C, an active pattern ACT may be provided on a substrate 100. The substrate 100 may be a semiconductor substrate. For example, the substrate 100 may be a silicon substrate or a silicon-on-insulator (SOI) substrate. The active pattern ACT may protrude from the substrate 100 in a direction perpendicular to a bottom surface 100L of the substrate 100, and may extend in a first direction D1 parallel to the bottom surface 100L of the substrate 100. According to some example embodiments of the present inventive concepts, the active pattern ACT may be provided in plural, and the plurality of active patterns ACT may be spaced apart from each other in a second direction D2 that is parallel to the bottom surface 100L of the substrate 100 and intersects the first direction D1. The active pattern ACT may be a portion of substrate 100, which protrudes in a third direction D3 perpendicular to the bottom surface 100L of the substrate 100.

Device isolation patterns 102 may be provided on the substrate 100 on opposite sides of the active pattern ACT. The device isolation patterns 102 may extend in the first direction D1 and may be spaced apart from each other across the active pattern ACT in the second direction D2. The device isolation patterns 102 may include one or more of oxide, nitride, and oxynitride.

An active structure AS may be provided on the active pattern ACT. When viewed in plan view, the active structure AS may be provided to overlap the active pattern ACT. The active structure AS may extend in the first direction D1 along a top surface of the active pattern ACT. The active structure AS may include channel patterns CH and source/drain patterns SD. Each pair of the source/drain patterns SD is spaced apart from each other in the first direction D1 across a corresponding one of the channel patterns CH. The channel patterns CH and the source/drain patterns SD may be arranged alternately along the first direction D1 on the top surface of the active pattern ACT. A plurality of active structures AS may be provided on the plurality of active patterns ACT, respectively. The plurality of active structures AS may be spaced apart from each other in the second direction D2.

According to some example embodiments, each of the channel patterns CH may be an upper portion of the active pattern ACT (e.g., active fin) that is exposed by the device isolation patterns 102 and protrudes in the third direction D3. Each of the channel patterns CH may have first lateral surfaces that are opposite to each other in the first direction D1, and the source/drain patterns SD may be disposed on corresponding first lateral surfaces of each of the channel patterns CH. Each of the channel patterns CH may have second lateral surfaces that are opposite to each other in the second direction D2, and the device isolation patterns 102 may expose correspondingly second lateral surfaces of each of the channel patterns CH.

The source/drain patterns SD may be epitaxial patterns grown from the active pattern ACT that serves as a seed. The source/drain patterns SD may include one or more of silicon-germanium (SiGe), silicon (Si), and silicon carbide (SiC). The source/drain patterns SD may be configured to provide tensile stress or compressive stress to each of the channel patterns CH. The source/drain patterns SD may further include impurities. The impurities may be adopted to improve electrical characteristics of transistors that include the source/drain patterns SD. When the transistors are NMOS field effect transistors, the impurities may be, for example, phosphorus (P). When the transistors are PMOS field effect transistors, the impurities may be, for example, boron (B).

A plurality of gate structures GS may lie on and run across the active structure AS. The plurality of gate structures GS may be spaced apart from each other in the first direction D1 and may extend in the second direction D2. The plurality of gate structures GS may extend in the second direction D2 to run across the active structure AS, the active pattern ACT, and the device isolation patterns 102. The plurality of gate structures GS may vertically overlap corresponding channel patterns CH of the active structure AS, and the source/drain patterns SD may be disposed on opposite sides of each of the plurality of gate structures GS. Each of the plurality of gate structures GS may extend in the second direction D2 to run across the plurality of active structures AS.

Each of the plurality of gate structures GS may include a gate electrode GE on a corresponding channel pattern CH, a gate dielectric pattern GI between the gate electrode GE and the corresponding channel pattern CH, gate spacers GSP on lateral surfaces (e.g., sidewalls) of the gate electrode GE, and a gate capping pattern CAP on a top surface of the gate electrode GE. The gate electrode GE may cover top and lateral surfaces of the corresponding channel pattern CH, and may extend in the second direction D2 to cover top surfaces 102U of the device isolation patterns 102. The gate dielectric pattern GI may extend along a bottom surface of the gate electrode GE. The gate dielectric pattern GI may be interposed between the gate electrode GE and the corresponding channel pattern CH, and may extend along the second direction D2 between the gate electrode GE and each of the device isolation patterns 102. The gate dielectric pattern GI may extend between the gate electrode GE and each of the gate spacers GSP. The gate dielectric pattern GI may have an uppermost surface substantially coplanar with the top surface of the gate electrode GE. The gate capping pattern CAP may cover the top surface of the gate electrode GE and the uppermost surface of the gate dielectric pattern GI. The gate spacers GSP may extend onto lateral surfaces of the gate capping pattern CAP. The gate spacers GSP may have uppermost surfaces substantially coplanar with a top surface CAP_U of the gate capping pattern CAP. The gate electrode GE, the corresponding channel pattern CH, and corresponding source/drain patterns SD may constitute a fin field effect transistor (FINFET).

The gate electrode GE may include one or more of doped semiconductors, conductive metal nitride, and metal. The gate dielectric pattern GI may include one or more of a silicon oxide layer, a silicon nitride layer, a silicon oxynitride layer, and a high-k dielectric layer. The high-k dielectric layer may include a material, such as hafnium oxide (HfO), aluminum oxide (AlO), or tantalum oxide (TaO), whose dielectric constant is greater than that of a silicon oxide layer. The gate spacers GSP and the gate capping pattern CAP may each include one or more of a silicon oxide layer, a silicon nitride layer, and a silicon oxynitride layer.

A plurality of separation patterns 170 may penetrate immediately neighboring ones of the plurality of gate structures GS. Each of the plurality of separation patterns 170 may penetrate a corresponding one of the plurality of gate structures GS, and may separate the corresponding gate structure GS into a pair of gate structures GS that are spaced apart from each other in the second direction D2. Each of the plurality of separation patterns 170 may penetrate the gate capping pattern CAP, the gate electrode GE, and the gate dielectric pattern GI that are included in the corresponding gate structure GS. The gate spacers GSP of the corresponding gate structure GS may extend onto lateral surfaces of each of the plurality of separation patterns 170. For example, each of the plurality of separation patterns 170 may be interposed between the gate spacers GSP of the corresponding gate structure GS. The gate spacers GSP of a gate structure GS may be interposed between a corresponding one of the plurality of separation patterns 170 and a lower dielectric layer IL which will be discussed below.

The plurality of separation patterns 170 may be spaced apart from each other in the first direction D1 and may be arranged along the first direction D1. The plurality of separation patterns 170 may be disposed on the device isolation pattern 102 between the active patterns ACT that neighbor each other in the second direction D2. According to some example embodiments, each of the plurality of separation patterns 170 may extend into the device isolation pattern 102. In this case, each of the plurality of separation patterns 170 may have a bottom surface 170L located at a lower height than that of a top surface 102U of the device isolation pattern 102. In this description, the term "height" may be a distance measured in the third direction D3 from the bottom surface 100L of the substrate 100. According to some example embodiments, each of the plurality of separation patterns 170 may have an uppermost surface 170U located at a height higher than a height of the top surface CAP_U of the gate capping pattern CAP.

Each of the plurality of separation patterns 170 may have a first width W1 in the first direction D1 and a second width W2 in the second direction D2. According to some example embodiments, the first width W1 of an odd-numbered one of the plurality of separation patterns 170 may be different from the first width W1 of an even-numbered one of the plurality of separation patterns 170. For example, the first width W1 of the odd-numbered separation pattern 170 may be greater or less than the first width W1 of the even-numbered separation pattern 170. According to other example embodiments, the first widths W1 of the plurality of separation patterns 170 may be the same as each other. The second widths W2 of the plurality of separation patterns 170 may be the same as each other. The plurality of separation patterns 170 may include, for example, silicon nitride.

The substrate 100 may be provided thereon with a lower dielectric layer IL that covers the plurality of separation patterns 170, the plurality of gate structures GS, and the source/drain patterns SD. The lower dielectric layer IL may expose the uppermost surfaces 170U of the plurality of separation patterns 170, and an uppermost surface IL_U of the lower dielectric layer IL may be coplanar with the uppermost surfaces 170U of the plurality of separation patterns 170. The uppermost surface IL_U of the lower dielectric layer IL may be located at the same height as that of the uppermost surfaces 170U of the plurality of separation patterns 170. The uppermost surface IL_U of the lower dielectric layer IL may be located at a higher height than that of the top surface CAP_U of the gate capping pattern CAP.

The lower dielectric layer IL may be interposed between the plurality of gate structures GS and may extend between the plurality of separation patterns 170. The uppermost surface IL_U of the lower dielectric layer IL between the plurality of separation patterns 170 may be located at a height that is higher than that of the top surface CAP_U of the gate capping pattern CAP and is the same as that of the uppermost surfaces 170U of the plurality of separation patterns 170.

According to some example embodiments, the lower dielectric layer IL may include a lower interlayer dielectric layer 120 and a dielectric pattern 132A that are sequentially stacked on the substrate 100. The lower interlayer dielectric layer 120 may cover the source/drain patterns SD and lateral surfaces of the plurality of gate structures GS. The lower interlayer dielectric layer 120 may expose the top surface CAP_U of the gate capping pattern CAP, and a top surface of the lower interlayer dielectric layer 120 may be coplanar with the top surface CAP_U of the gate capping pattern CAP. The lower interlayer dielectric layer 120 may be provided thereon with the dielectric pattern 132A that covers the top surface CAP_U of the gate capping pattern CAP. The dielectric pattern 132A may cover the lateral surfaces of the plurality of separation patterns 170 and may expose the uppermost surfaces 170U of the plurality of separation patterns 170. The lower interlayer dielectric layer 120 may include one or more of a silicon oxide layer, a silicon nitride layer, a silicon oxynitride layer, and a low-k dielectric layer. The dielectric pattern 132A may include oxide (e.g., silicon oxide).

The lower dielectric layer IL may be provided thereon with an upper dielectric layer 180 that covers the uppermost surfaces 170U of the plurality of separation patterns 170. The upper dielectric layer 180 may include one or more of a silicon oxide layer, a silicon nitride layer, a silicon oxynitride layer, and a low-k dielectric layer.

First contacts 190 may be disposed on opposite sides of each of the plurality of gate structures GS. Each of the first contacts 190 may penetrate the upper dielectric layer 180 and the lower dielectric layer IL, and may be connected to a corresponding one of the source/drain patterns SD. At least one of the first contacts 190 may pass between the plurality of separation patterns 170 and extend in the second direction D2. The at least one of the first contacts 190 may penetrate the lower dielectric layer IL between the plurality of separation patterns 170. Each of the first contacts 190 may have an uppermost surface 190U located at a higher level (or height) than that of the uppermost surfaces 170U of the plurality of separation patterns 170.

Each of second contacts (not shown) may penetrate the upper dielectric layer 180 and an upper portion (e.g., the dielectric pattern 132A) of the lower dielectric layer IL, and may be connected to the gate electrode GE of each of the plurality of gate structures GS. The upper dielectric layer 180 may be provided thereon with wiring lines (not shown) electrically connected to the first contacts 190 and the second contacts. The wiring lines may be configured to apply voltages to the source/drain patterns SD and the gate electrode GE through the first contacts 190 and the second contacts. The first contacts 190, second contacts, and the wiring lines may include a conductive material.

According to some example embodiments of the present inventive concepts, the plurality of separation patterns 170 may penetrate corresponding ones of the gate structures GS that immediately neighbor each other, and may be spaced apart from and aligned with each other in the first direction D1. The lower dielectric layer IL between the neighboring gate structures GS may extend between the plurality of separation patterns 170. The uppermost surface IL_U of the lower dielectric layer IL between the neighboring gate structures GS may be located at a higher height than that of the top surface CAP_U of the gate capping pattern CAP, and the uppermost surface IL_U of the lower dielectric layer IL between the plurality of separation patterns 170 may also be located at a higher height than that of the top surface CAP_U of the gate capping pattern CAP. At least one of the first contacts 190 between the neighboring gate structures GS may pass between the plurality of separation patterns 170 and extend in the second direction D2. Between the neighboring gate structures GS and between the plurality of separation patterns 170, the uppermost surface IL_U of the lower dielectric layer IL may be located at a higher height than that of the top surface CAP_U of the gate capping pattern CAP, and thus the at least one of the first contacts 190 may easily penetrate the lower dielectric layer IL between the neighboring gate structures GS and the lower dielectric layer IL between the plurality of separation patterns 170. Accordingly, it may be possible to prevent or mitigate the occurrence of defects in the first contacts 190 and provide a semiconductor device with improved electrical characteristics.

FIGS. 3, 5, 7, 9, 11, 13, 15, 17, and 19 illustrate plan views showing a method of fabricating a semiconductor device according to an example embodiment of the present inventive concepts. FIGS. 4A, 6A, 8A, 10A, 12A, 14A, 16A, 18A, and 20A illustrate cross-sectional views taken along line I-I' of FIGS. 3, 5, 7, 9, 11, 13, 15, 17, and 19, respectively. FIGS. 4B, 6B, 8B, 10B, 12B, 14B, 16B, 18B, and 20B illustrate cross-sectional views taken along line II-II' of FIGS. 3, 5, 7, 9, 11, 13, 15, 17, and 19, respectively. FIGS. 4C, 6C, 8C, 10C, 12C, 14C, 16C, 18C, and 20C illustrate cross-sectional views taken along line III-III' of FIGS. 3, 5, 7, 9, 11, 13, 15, 17, and 19, respectively. For brevity of description, omission will be made to avoid duplicate explanation of the semiconductor device discussed with reference to FIGS. 1 and 2A to 2C.

Referring to FIGS. 3 and 4A to 4C, an active pattern ACT may be formed on a substrate 100. The formation of the active pattern ACT may include patterning the substrate 100 to form trenches T that define the active pattern ACT. The trenches T may have linear shapes that extend in a first direction D1 and are spaced apart from each other in a second direction D2. The formation of the trenches T may include forming on the substrate 100 a mask pattern (not shown) that defines an area where the active pattern ACT will be formed, and anisotropically etching the substrate 100 by using the mask pattern as an etching mask.

Device isolation patterns 102 may be formed on opposite sides of the active pattern ACT. The device isolation patterns 102 may be formed to fill the trenches T. The formation of the device isolation patterns 102 may include forming on the substrate 100 a dielectric layer that fills the trenches T and planarizing the dielectric layer until the mask pattern is exposed. Upper portions of the device isolation patterns 102 may be recessed to expose an upper portion of the active pattern ACT. An active fin AF may be defined to refer to the upper portion of the active pattern ACT, which is exposed by the device isolation patterns 102. While the upper portions of the device isolation patterns 102 are recessed, the mask pattern may be removed.

A sacrificial gate pattern 112 may be formed on the substrate 100 to run across the active pattern ACT and the device isolation patterns 102. The sacrificial gate pattern 112 may extend in the second direction D2. The sacrificial gate pattern 112 may cover top and lateral surfaces of the active pattern ACT or may cover the active fin AF, and may extend onto top surfaces of the device isolation patterns 102. When a plurality of active patterns ACT are formed, the plurality of active patterns ACT may extend in the first direction D1 and may be spaced apart from each other in the second direction D2. In this case, the sacrificial gate pattern 112 may extend in the second direction D2 to run across the plurality of active patterns ACT.

An etch stop pattern 110 may be provided between the sacrificial gate pattern 112 and the active pattern ACT, and may extend between the sacrificial gate pattern 112 and each of the device isolation patterns 102. The formation of the sacrificial gate pattern 112 and the etch stop pattern 110 may include sequentially forming on the substrate 100 an etch stop layer (not shown) and a sacrificial gate layer (not shown) that cover the active pattern ACT and the device isolation patterns 102, forming on the sacrificial gate layer a sacrificial mask pattern 114 that defines an area where the sacrificial gate pattern 112 will be formed, and sequentially patterning the sacrificial gate layer and the etch stop layer by using the sacrificial mask pattern 114 as an etching mask. The etch stop layer may include, for example, a silicon oxide layer. The sacrificial gate layer may include a material having an etch selectivity with respect to the etch stop layer. The sacrificial gate layer may include, for example, polysilicon. The sacrificial mask pattern 114 may be used as an etching mask to pattern the sacrificial gate layer to form the sacrificial gate pattern 112. The patterning of the sacrificial gate layer may include performing an etching process that has an etch selectivity with respect to the etch stop layer. After the formation of the sacrificial gate pattern 112, the etch stop layer may be removed from opposite sides of the sacrificial gate pattern 112 such that the etch stop pattern 110 may be formed below the sacrificial gate pattern 112.

Gate spacers GSP may be formed on lateral surfaces of the sacrificial gate pattern 112. The gate spacers GSP may include, for example, silicon nitride. The formation of the gate spacers GSP may include forming on the substrate 100 a gate spacer layer (not shown) that covers the sacrificial gate pattern 112 and anisotropically etching the gate spacer layer.

The sacrificial mask pattern 114, the sacrificial gate pattern 112, the etch stop pattern 110, and the gate spacers GSP may be collectively called a sacrificial gate structure SGS. A plurality of sacrificial gate structures SGS may run across the active pattern ACT and the device isolation patterns 102.

The plurality of sacrificial gate structures SGS may be spaced apart from each other in the first direction D1 and may extend in the second direction D2.

As the sacrificial gate structure SGS is formed to run across the active pattern ACT, a first region R1 and second regions R2 may be defined in the active fin AF. The first region R1 may be a portion of the active fin AF, which lies below the sacrificial gate structure SGS and vertically overlaps the sacrificial gate structure SGS. The second regions R2 may be other portions of the active fin AF, which are positioned on opposite sides of the sacrificial gate structure SGS and are horizontally separated from each other by the first region R1.

Referring to FIGS. 5 and 6A to 6C, source/drain patterns SD may be formed on the active pattern ACT on opposite sides of the sacrificial gate structure SGS. The formation of the source/drain patterns SD may include removing the second regions R2 of the active fin AF, and performing a selective epitaxial growth process in which the active pattern ACT is used as a seed. The source/drain patterns SD may be epitaxial patterns including one or more of silicon-germanium (SiGe), silicon (Si), and silicon carbide (SiC). The formation of the source/drain patterns SD may further include doping impurities into the source/drain patterns SD simultaneously with or after the selective epitaxial growth process. The impurities may be adopted to improve electrical characteristics of a transistor including the source/drain patterns SD. When the transistor is an NMOS field effect transistor, the impurities may be, for example, phosphorus (P). When the transistor is a PMOS field effect transistor, the impurities may be, for example, boron (B).

The first region R1 of the active fin AF may be interposed between the source/drain patterns SD and may be called a channel pattern CH. The channel pattern CH and the source/drain patterns SD may be collectively called an active structure AS.

A lower interlayer dielectric layer 120 may be formed on the substrate 100, and may cover the sacrificial gate structure SGS and the source/drain patterns SD. The lower interlayer dielectric layer 120 may include one or more of a silicon oxide layer, a silicon nitride layer, a silicon oxynitride layer, and a low-k dielectric layer. A planarization process may be performed in which the lower interlayer dielectric layer 120 is planarized until the sacrificial gate pattern 112 is exposed. The planarization process may remove the sacrificial mask pattern 114.

Referring to FIGS. 7 and 8A to 8C, the sacrificial gate pattern 112 and the etch stop pattern 110 may be removed to form a gap region 120g in the lower interlayer dielectric layer 120. The gap region 120g may be an empty space between the gate spacers GSP. The gap region 120g may expose the channel pattern CH.

A gate dielectric pattern GI and a gate electrode GE may be formed to fill the gap region 120g. The formation of the gate dielectric pattern GI and the gate electrode GE may include forming a gate dielectric layer that conformally covers inner surfaces of the gap region 120g, forming a gate electrode layer that fill a remaining portion of the gap region 120g, and forming the gate dielectric pattern GI and the gate electrode GE locally in the gap region 120g by a planarization process performed until the lower interlayer dielectric layer 120 is exposed. Upper portions of the gate dielectric pattern GI and the gate electrode GE may be recessed to form a groove region between the gate spacers GSP. A gate capping pattern CAP may be formed in the groove region. The formation of the gate capping pattern CAP may include forming on the lower interlayer dielectric layer 120 a gate capping layer that fills the groove region, and performing a planarization process in which the gate capping layer is planarized until the lower interlayer dielectric layer 120 is exposed. Due to the planarization process, the lower interlayer dielectric layer 120 may expose a top surface of the gate capping pattern CAP.

The gate dielectric pattern GI, the gate electrode GE, the gate capping pattern CAP, and the gate spacers GSP may be collectively called a gate structure GS. A plurality of gate structures GS may run across the active pattern ACT and the device isolation patterns 102. The plurality of gate structures GS may be spaced apart from each other in the first direction D1 and may extend in the second direction D2. Each of the plurality of gate structures GS may run across the active structure AS.

A dielectric layer 132 may be formed on the lower interlayer dielectric layer 120, and may cover the exposed top surface of the gate capping pattern CAP. The dielectric layer 132 may include oxide (e.g., silicon oxide).

A mask layer 130 may be formed on the dielectric layer 132. The mask layer 130 may include a first mask layer 134, a second mask layer 136, and a third mask layer 138 that are sequentially stacked on the dielectric layer 132. The first mask layer 134 may include nitride (e.g., silicon nitride), the second mask layer 136 may include oxide (e.g., silicon oxide), and the third mask layer 138 may include, for example, polysilicon.

Blocking mask patterns 140 may be formed on the mask layer 130. The blocking mask patterns 140 may be spaced apart from each other in the first direction D1 and may extend in the second direction D2. The blocking mask patterns 140 may vertically overlap the lower interlayer dielectric layer 120 between the plurality of gate structures GS. Each of the blocking mask patterns 140 may vertically overlap the lower interlayer dielectric layer 120 between a pair of gate structures GS that immediately neighbor each other. The blocking mask patterns 140 may include oxide (e.g., silicon oxide).

According to some example embodiments, the formation of the blocking mask patterns 140 may include forming sacrificial patterns (not shown) on the mask layer 130, forming a spacer layer that conformally covers top and lateral surfaces of the sacrificial patterns, and anisotropically etching the spacer layer. Each of the sacrificial patterns may vertically overlap a corresponding one of the plurality of gate structures GS. The blocking mask patterns 140 may be formed by anisotropically etching the spacer layer. After the formation of the blocking mask patterns 140, the sacrificial patterns may be removed.

According to other example embodiments, the formation of the blocking mask patterns 140 may include forming a blocking mask layer on the mask layer 130, forming photoresist patterns on the blocking mask layer, and etching the blocking mask layer by using the photoresist patterns as an etching mask. The photoresist patterns may be formed by, for example, an extreme ultraviolet (EUV) lithography process. The blocking mask patterns 140 may be formed by using the photoresist patterns as an etching mask to etch the blocking mask layer.

Referring to FIGS. 9 and 10A to 10C, a preliminary cutting mask layer 150 may be formed on the mask layer 130 to cover the blocking mask patterns 140. The preliminary cutting mask layer 150 may include, for example, a spin on hardmask (SOH) material.

A photoresist layer 152 may be formed on the preliminary cutting mask layer 150. The photoresist layer 152 may have a first opening 152P that elongates in the first direction D1.

The first opening 152P may run across and vertically overlap corresponding ones of the plurality of gate structures GS and corresponding ones of the blocking mask patterns 140.

Referring to FIGS. 11 and 12A to 12C, the preliminary cutting mask layer 150 may be etched by using the photoresist layer 152 as an etching mask, and as a result, a preliminary cutting mask pattern 150A may be formed. The preliminary cutting mask pattern 150A may have a second opening 150P that vertically overlaps the first opening 152P of the photoresist layer 152. The second opening 150P may elongate in the first direction D1, and may run across the corresponding blocking mask patterns 140 and the corresponding gate structures GS. The second opening 150P may expose portions of the corresponding blocking mask patterns 140, and may also expose the third mask layer 138 between the portions of the corresponding blocking mask patterns 140. The second opening 150P may vertically overlap the portions of the corresponding gate structures GS.

The third mask layer 138 may be etched by using the preliminary cutting mask pattern 150A as an etching mask, and as a result, a third mask pattern 138A may be formed. During the etching of the third mask layer 138, the portions of the corresponding blocking mask patterns 140 exposed to the second opening 150P may serve as an etching mask, and thus portions of the third mask pattern 138A may be formed below the portions of the corresponding blocking mask patterns 140. The portions of the corresponding blocking mask patterns 140 exposed to the second opening 150P may be removed during the etching of the third mask layer 138 or after the formation of the third mask pattern 138A. The second opening 150P of the preliminary cutting mask pattern 150A may expose the portions of the third mask pattern 138A and the second mask layer 136 between the portions of the third mask pattern 138A.

Referring to FIGS. 13 and 14A to 14C, the photoresist layer 152 and the preliminary cutting mask pattern 150A may be removed. Remaining portions of the blocking mask patterns 140 and the third mask pattern 138A may be used as an etching mask to sequentially etch the second mask layer 136 and the first mask layer 134. Therefore, a second mask pattern 136A and a first mask pattern 134A may be formed. The first, second, and third mask patterns 134A, 136A, and 138A may be collectively called a cutting mask pattern 160, and the cutting mask pattern 160 may have a plurality of holes 160H that are spaced apart from each other in the first direction D1. The plurality of holes 160H may be aligned with each other along the first direction D1, and may vertically overlap corresponding immediately neighboring ones of the plurality of gate structures GS.

Each of the plurality of holes 160H may have a third width 160W3 in the first direction D1 and a fourth width 160W4 in the second direction D2. According to some example embodiments, the blocking mask patterns 140 may be formed by anisotropically etching the spacer layer deposited on lateral surfaces of the sacrificial patterns, and in this case, the third widths 160W3 of the plurality of holes 160H may depend on a deposition thickness of the spacer layer. The third width 160W3 of an odd-numbered one of the plurality of holes 160H may be different from the third width 160W3 of an even-numbered one of the plurality of holes 160H. For example, the third width 160W3 of the odd-numbered hole 160H may be greater or less than the third width 160W3 of the even-numbered hole 160H. According to other example embodiments, the blocking mask patterns 140 may be formed by patterning the blocking mask layer by using the photoresist patterns formed through an extreme ultraviolet (EUV) lithography process. The fourth widths 160W4 of the plurality of holes 160H may be the same as each other.

Referring to FIGS. 15 and 16A to 16C, the dielectric layer 132 may be etched by using the cutting mask pattern 160 as an etching mask, and as a result, a dielectric pattern 132A may be formed. The plurality of holes 160H may extend into the dielectric pattern 132A, and each of the plurality of holes 160H may expose a portion of the gate capping pattern CAP of the corresponding gate structure GS. The portion of the gate capping pattern CAP exposed by one of the plurality of holes 160H may be removed such that each of the plurality of holes 160H may expose a portion of the gate electrode GE of the corresponding gate structure GS. During the etching of the dielectric layer 132 and/or the removal of the gate capping pattern CAP of the corresponding gate structure GS, the remaining portions of the blocking mask patterns 140 may be removed, and the third mask pattern 138A and the second mask pattern 136A may also be removed.

Referring to FIGS. 17 and 18A to 18C, the first mask pattern 134A and the dielectric pattern 132A may be used as an etching mask to remove the portion of the gate electrode GE exposed by each of the plurality of holes 160H, and thus a through hole PH may be formed to penetrate the gate electrode GE. The through hole PH may penetrate the gate dielectric pattern GI of the corresponding gate structure GS, and may extend into the device isolation pattern 102 below the corresponding gate structure GS. The through hole PH may separate the corresponding gate structure GS into a pair of gate structures GS that are spaced apart from each other in the second direction D2.

A plurality of through holes PH may be formed to correspond to the plurality of holes 160H, and the plurality of through holes PH may penetrate corresponding immediately neighboring ones of the plurality of gate structures GS. The plurality of through holes PH may be aligned with each other along the first direction D1, and may expose the device isolation pattern 102 between the active patterns ACT that immediately neighbor each other in the second direction D2. According to some example embodiments, each of the plurality of through holes PH may extend into the device isolation pattern 102. During the formation of the through holes PH, the first mask pattern 134A may be removed.

Referring to FIGS. 19 and 20A to 20C, each of a plurality of separation patterns 170 may be formed in a corresponding one of the plurality of through holes PH. The formation of the plurality of separation patterns 170 may include forming on the dielectric pattern 132A a separation layer that fills the plurality of through holes PH, and performing a planarization process to planarize the separation layer. Due to the planarization process of the separation layer, the plurality of separation patterns 170 may be formed locally in the plurality of through holes PH, respectively.

According to some example embodiments, the planarization process of the separation layer may continue until a top surface of the dielectric pattern 132A is exposed. The lower interlayer dielectric layer 120 and the dielectric pattern 132A may be collectively called a lower dielectric layer IL. The planarization process may allow each of the plurality of separation patterns 170 to have an uppermost surface 170U coplanar with an uppermost surface IL_U of the lower dielectric layer IL. The uppermost surface IL_U of the lower dielectric layer IL may be located at the same height as that of the uppermost surfaces 170U of the plurality of separation patterns 170. The uppermost surface IL_U of the lower dielectric layer IL and the uppermost surfaces 170U of the plurality of separation patterns 170 may be located at a higher height than that of a top surface CAP_U of the gate capping pattern CAP.

Referring back to FIGS. 1 and 2A to 2C, an upper dielectric layer 180 may be formed on the lower dielectric layer IL, and may cover the uppermost surfaces 170U of the plurality of separation patterns 170. First contacts 190 may be formed on opposite sides of each of the plurality of gate structures GS. Each of the first contacts 190 may penetrate the upper dielectric layer 180 and the lower dielectric layer IL, and may be connected to a corresponding one of the source/drain patterns SD. At least one of the first contacts 190 may pass between the plurality of separation patterns 170 and extend in the second direction D2. The at least one of the first contacts 190 may penetrate the lower dielectric layer IL between the plurality of separation patterns 170.

When the lower dielectric layer IL is recessed between at least a pair of neighboring through holes PH during an etching process for forming the plurality of through holes PH, at least a pair of separation patterns 170 may be formed to be connected into a single piece(or unitary body). In this case, the at least one of the first contacts 190 may be formed by an etching process that etches a portion of the at least a pair of separation patterns 170 and a portion of the lower dielectric layer IL between the plurality of gate structures GS. During the etching process, it may not be easy to etch the portion of the at least a pair of separation patterns 170, and thus pattern defects may be generated in the at least one of the first contacts 190. In this case, the first contacts 190 may suffer from a deterioration in electrical characteristics.

According to the present inventive concepts, the plurality of separation patterns 170 may penetrate immediately neighboring gate structures GS, and may be spaced apart from and aligned with each other in the first direction D1. The uppermost surface IL_U of the lower dielectric layer IL between the plurality of separation patterns 170 may be located at substantially the same height as that of the uppermost surface IL_U of the lower dielectric layer IL between the plurality of gate structures GS. In this case, the at least one of the first contacts 190 may be easily formed by etching the lower dielectric layer IL between the plurality of gate structures GS and the lower dielectric layer IL between the plurality of separation patterns 170. Therefore, it may be possible to prevent or mitigate the occurrence of pattern defects in the at least one of the first contacts 190 and prevent or mitigate a deterioration in electrical characteristics of the first contacts 190. Accordingly, a semiconductor device may improve in electrical characteristics.

Although not shown, second contacts may be formed in the upper dielectric layer 180. Each of the second contacts may penetrate the upper dielectric layer 180 and an upper portion (e.g., the dielectric pattern 132A) of the lower dielectric layer IL, and may be connected to the gate electrode GE of each of the plurality of gate structures GS. Wiring lines (not shown) may be formed on the upper dielectric layer 180, and may be electrically connected to the first contacts 190 and the second contacts.

Figure 21A:
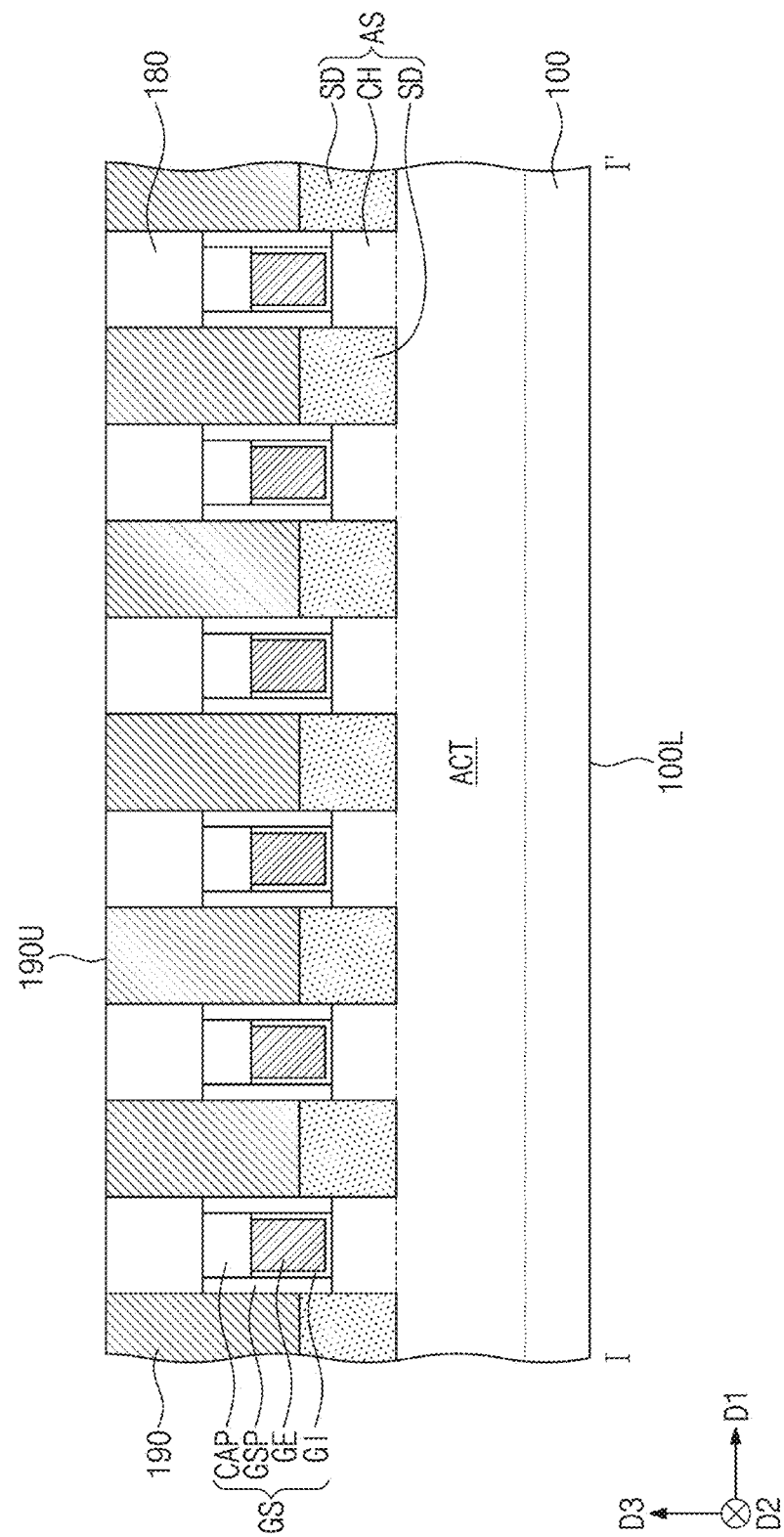
FIGS. 21A, 21B, and 21C illustrate cross-sectional views taken along lines I-I', II-II', and III-III' of FIG. 1, respectively, showing a semiconductor device according to an example embodiment of the present inventive concepts.
Figure 21B:
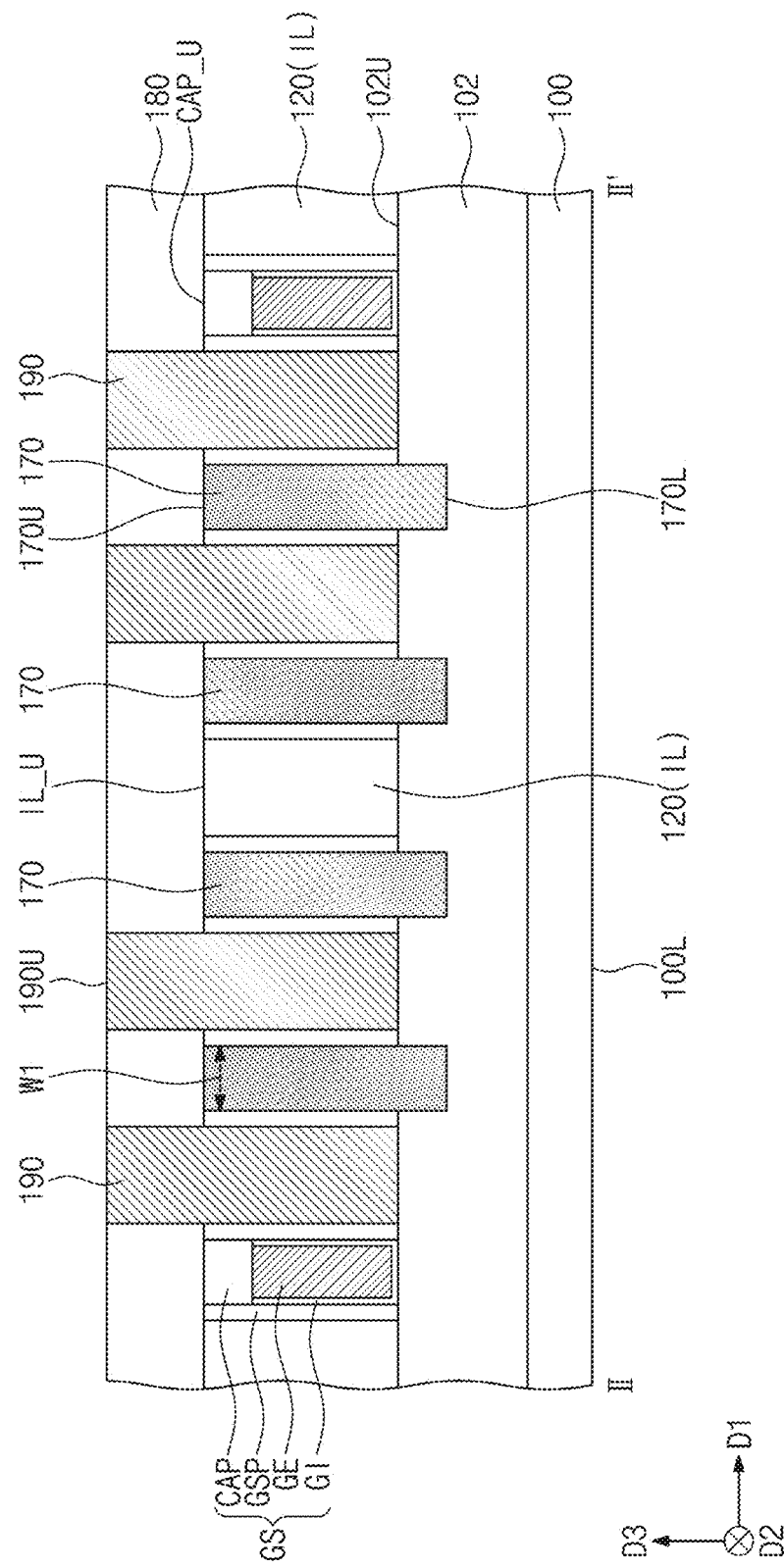
Figure 21C:
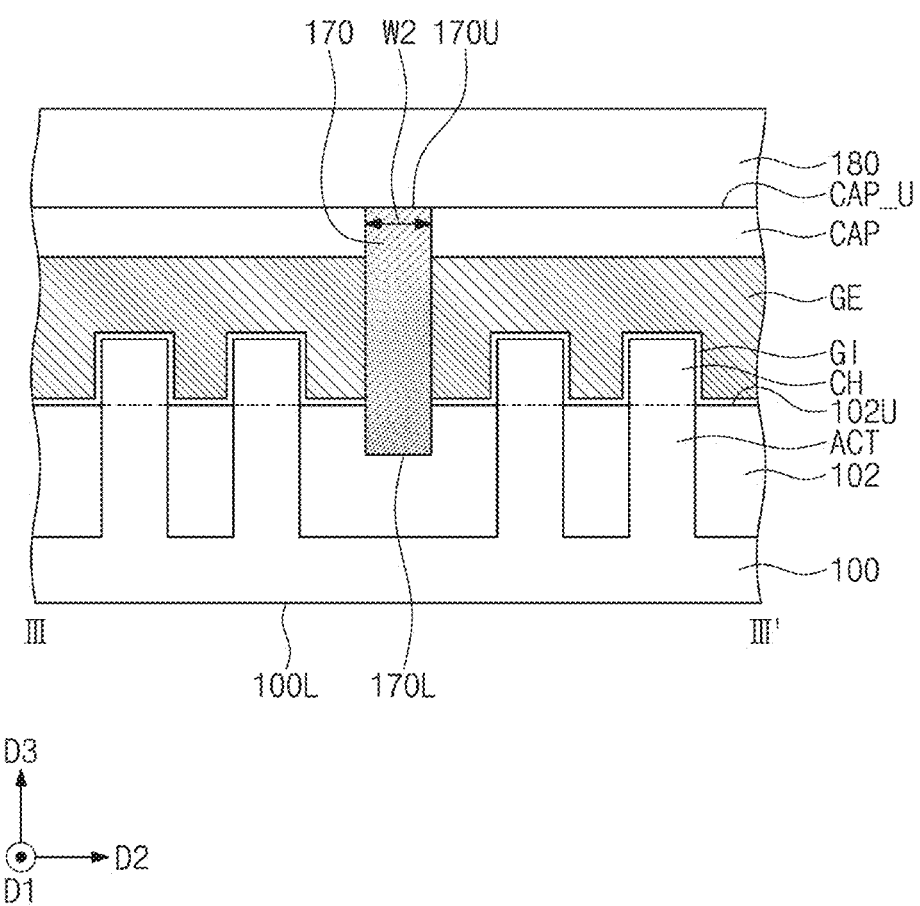

FIGS. 21A, 21B, and 21C illustrate cross-sectional views taken along lines I-I', II-II', and III-III' of FIG. 1, respectively, showing a semiconductor device according to an example embodiment of the present inventive concepts. The following semiconductor device is similar to that discussed with reference to FIGS. 1 and 2A to 2C, and thus the major differences between the semiconductor devices will be described below in the interest of brevity of description.

Referring to FIGS. 1, 21A, 21B, and 21C, the plurality of separation patterns 170 may be spaced apart from and aligned with each other in the first direction D1. The plurality of separation patterns 170 may be disposed on the device isolation pattern 102 between the active patterns ACT that neighbor each other in the second direction D2. According to some example embodiments, each of the plurality of separation patterns 170 may extend into the device isolation pattern 102. In this case, the bottom surface 170L of each of the plurality of separation patterns 170 may be located at a higher height than that of the top surface 102U of the device isolation pattern 102. According to some example embodiments, the uppermost surface 170U of each of the plurality of separation patterns 170 may be substantially coplanar with the top surface CAP_U of the gate capping pattern CAP. The uppermost surface 170U of each of the plurality of separation patterns 170 may be located at the same height as that of the top surface CAP_U of the gate capping pattern CAP.

Each of the plurality of separation patterns 170 may have a first width W1 in the first direction D1 and a second width W2 in the second direction D2. According to some example embodiments, the first width W1 of an odd-numbered one of the plurality of separation patterns 170 may be different from the first width W1 of an even-numbered one of the plurality of separation patterns 170. For example, the first width W1 of the odd-numbered separation pattern 170 may be greater or less than the first width W1 of the even-numbered separation pattern 170. According to other example embodiments, the first widths W1 of the plurality of separation patterns 170 may be the same as each other. The second widths W2 of the plurality of separation patterns 170 may be the same as each other.

The substrate 100 may be provided thereon with a lower dielectric layer IL that covers the plurality of separation patterns 170, the plurality of gate structures GS, and the source/drain patterns SD. According to some example embodiments, the lower dielectric layer IL may be a lower interlayer dielectric layer 120 that covers the source/drain patterns SD and also covers lateral surfaces of the plurality of gate structures GS and lateral surfaces of the plurality of separation patterns 170. The lower dielectric layer IL may expose the uppermost surfaces 170U of the plurality of separation patterns 170, and an uppermost surface IL_U of the lower dielectric layer IL may be coplanar with the uppermost surfaces 170U of the plurality of separation patterns 170. The uppermost surface IL_U of the lower dielectric layer IL may be located at the same height as that of the uppermost surfaces 170U of the plurality of separation patterns 170. The uppermost surface IL_U of the lower dielectric layer IL may be located at the same height as that of the top surface CAP_U of the gate capping pattern CAP.

The lower dielectric layer IL may be interposed between the plurality of gate structures GS and may extend between the plurality of separation patterns 170. The uppermost surface IL_U of the lower dielectric layer IL between the plurality of separation patterns 170 may be located at the same height as that of the top surface CAP_U of the gate capping pattern CAP and that of the uppermost surfaces 170U of the plurality of separation patterns 170.

According to the present inventive concepts, the uppermost surface IL_U of the lower dielectric layer IL between neighboring gate structures GS may be located at the same height as that of the top surface CAP_U of the gate capping pattern CAP, and the uppermost surface IL_U of the lower dielectric layer IL between the plurality of separation patterns 170 may also be located at the same height as that of the top surface CAP_U of the gate capping pattern CAP. At least one of the first contacts 190 between the neighboring gate structures GS may pass between the plurality of separation patterns 170 and extend in the second direction D2. Between the neighboring gate structures GS and between the plurality of separation patterns 170, the uppermost surface IL_U of the lower dielectric layer IL may be located at the same height as that of the top surface CAP_U of the gate capping pattern CAP, and thus the at least one of the first contacts 190 may easily penetrate the lower dielectric layer IL between the neighboring gate structures GS and the lower dielectric layer IL between the plurality of separation patterns 170. Accordingly, it may be possible to prevent or mitigate the occurrence of defects in the first contacts 190 and as a result to provide a semiconductor device with improved electrical characteristics.

Figure 22A:
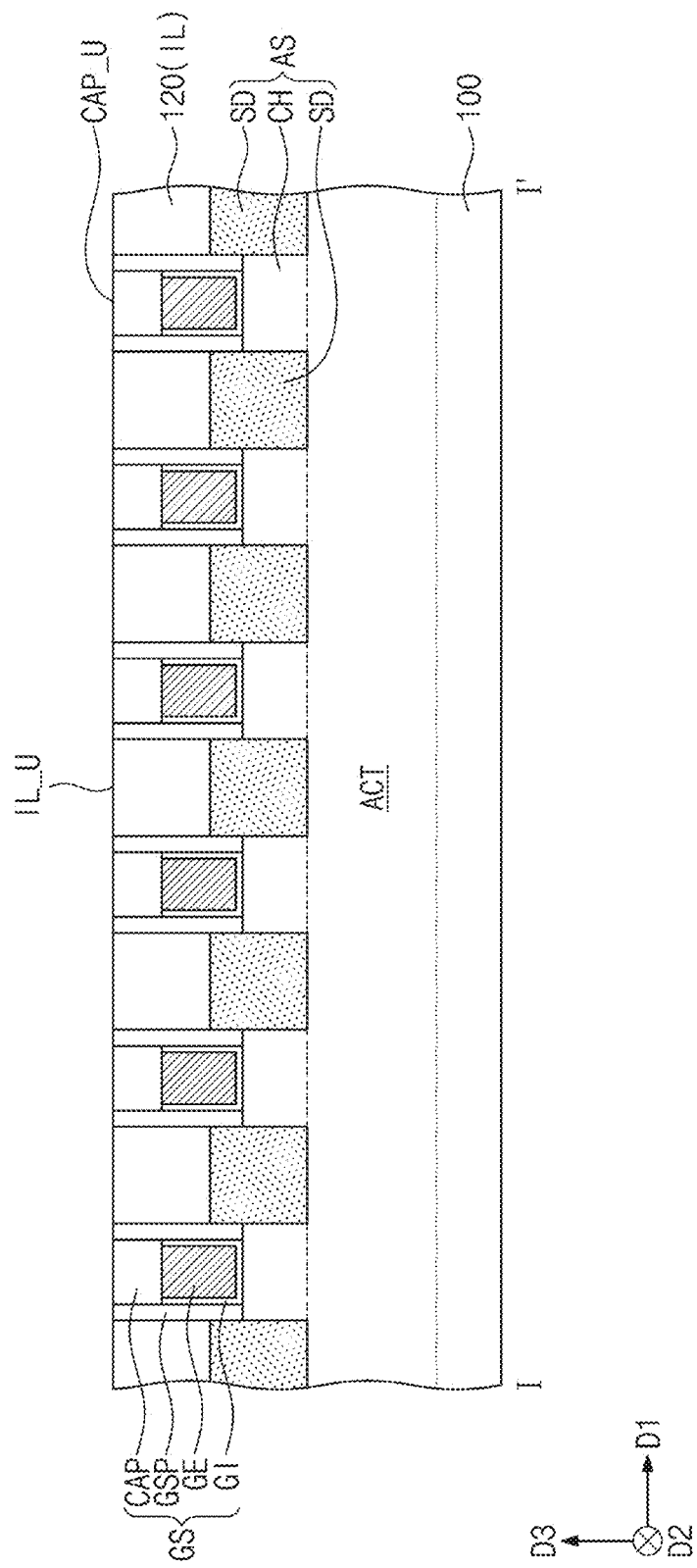
FIGS. 22A, 22B, 22C illustrate cross-sectional views taken along lines I-I', II-II', and III-III' of FIG. 1, respectively, showing a method of fabricating a semiconductor device according to an example embodiment of the present inventive concepts.
Figure 22B:
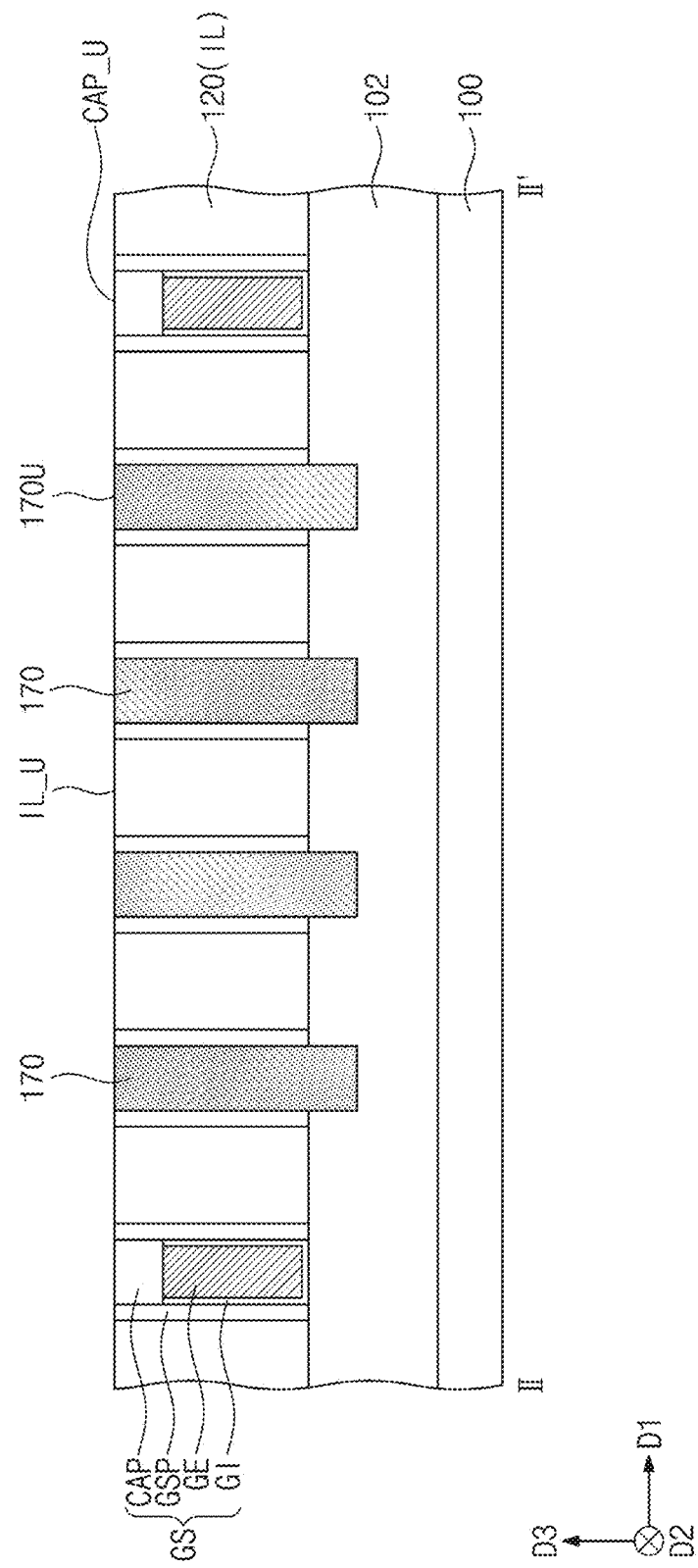
Figure 22C:
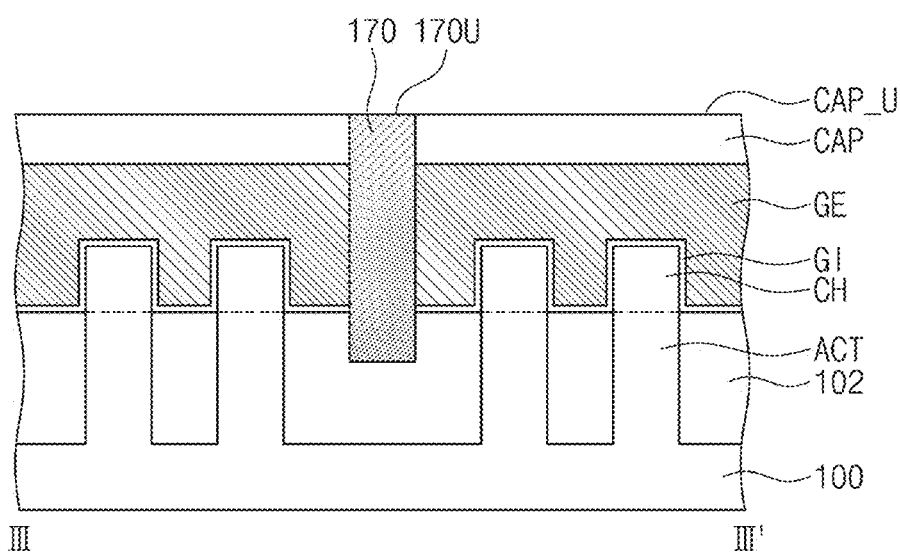

FIGS. 22A, 22B, 22C illustrate cross-sectional views taken along lines I-I', II-II', and III-III' of FIG. 1, respectively, showing a method of fabricating a semiconductor device according to an example embodiment of the present inventive concepts. The following method of fabricating a semiconductor device is similar to that discussed with reference to FIGS. 3 to 20C, and thus the major differences between the methods will be described below in the interest of brevity of description.

Referring to FIGS. 22A, 22B, and 22C, each of a plurality of separation patterns 170 may be formed in a corresponding one of the plurality of through holes PH discussed with reference to FIGS. 17 and 18A to 18C. The formation of the plurality of separation patterns 170 may include forming on the dielectric pattern 132A a separation layer that fills the plurality of through holes PH, and performing a planarization process to planarize the separation layer.

According to some example embodiments, the planarization process of the separation layer may continue until a top surface of the lower interlay dielectric layer 120 is exposed. The planarization process may remove the dielectric pattern 132A discussed with reference to FIGS. 17 and 18A to 18C, and the lower interlayer dielectric layer 120 may be called a lower dielectric layer IL. The planarization process may allow each of the plurality of separation patterns 170 to have an uppermost surface 170U coplanar with an uppermost surface IL_U of the lower dielectric layer IL. The uppermost surface IL_U of the lower dielectric layer IL may be located at the same height as that of the uppermost surfaces 170U of the plurality of separation patterns 170. The uppermost surface IL_U of the lower dielectric layer IL and the uppermost surfaces 170U of the plurality of separation patterns 170 may be located at the same height as that of the top surface CAP_U of the gate capping pattern CAP.

Except the difference mentioned above, a semiconductor device fabrication method according to this example embodiment of the present embodiment is substantially the same as the semiconductor device fabrication method discussed with reference to FIGS. 3 to 20C.

Figure 23A:
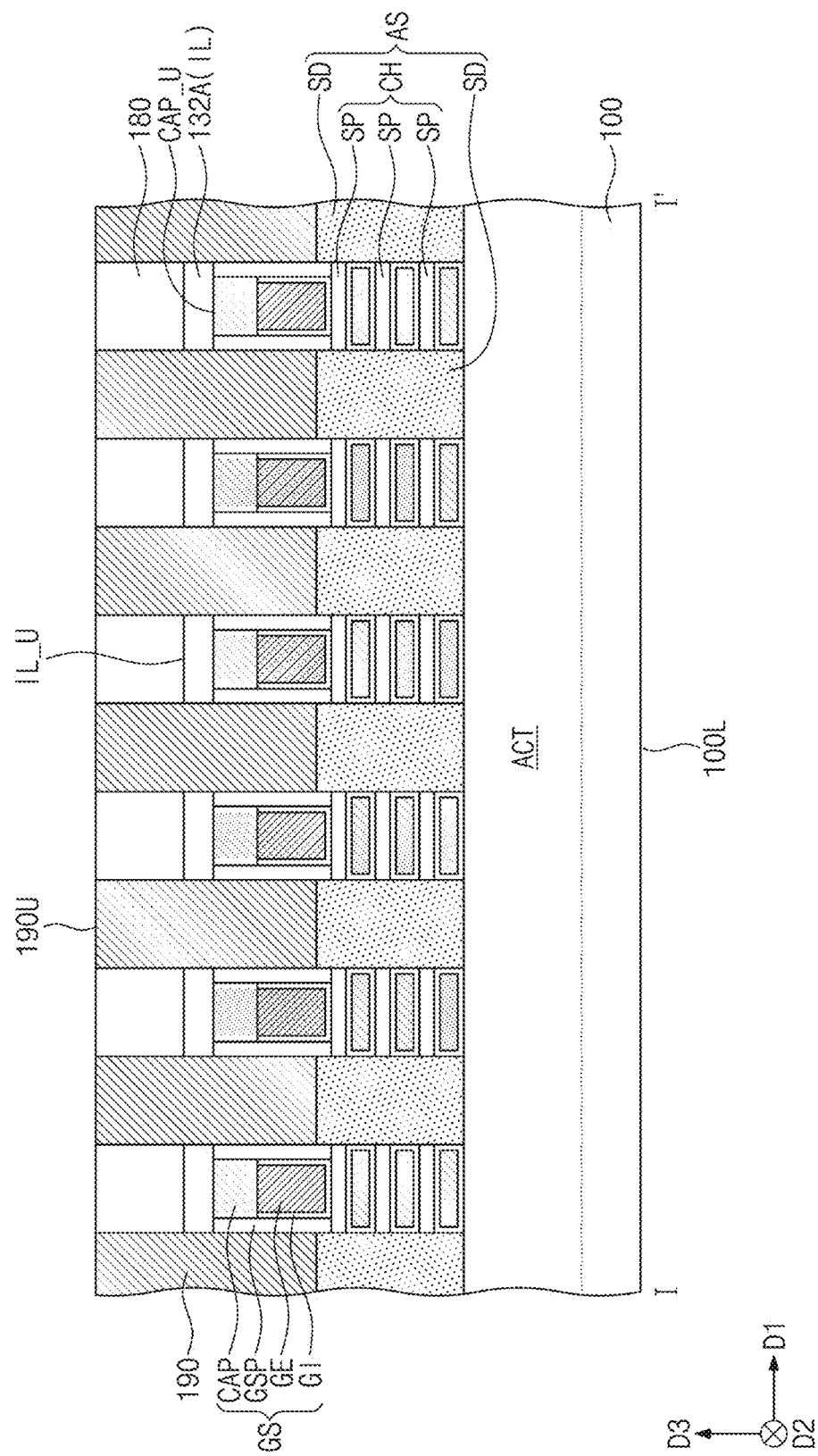
FIGS. 23A, 23B, and 23C illustrate cross-sectional views taken along lines I-I', II-II', and III-III' of FIG. 1, respectively, showing a semiconductor device according to an example embodiment of the present inventive concepts.
Figure 23B:
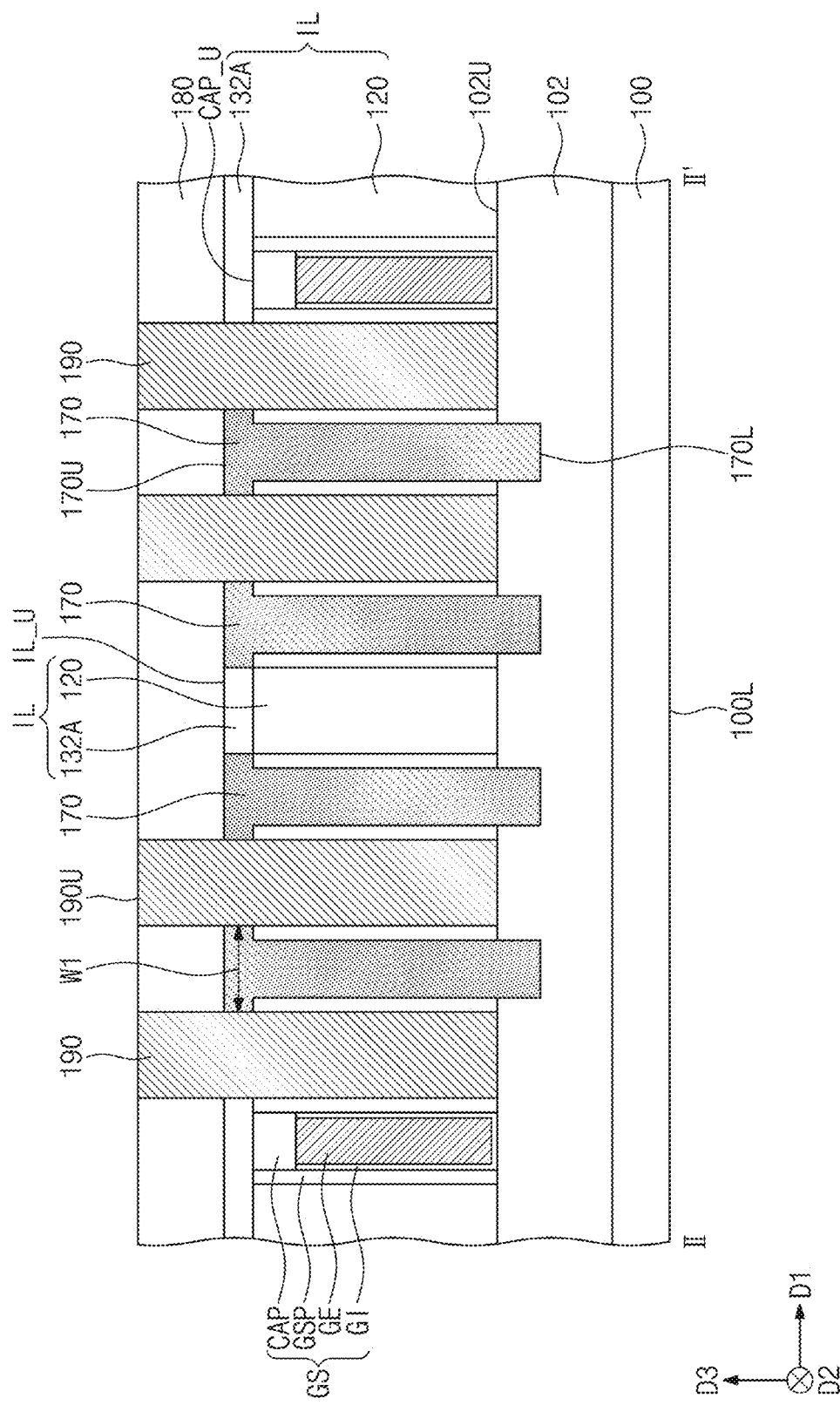
Figure 23C:
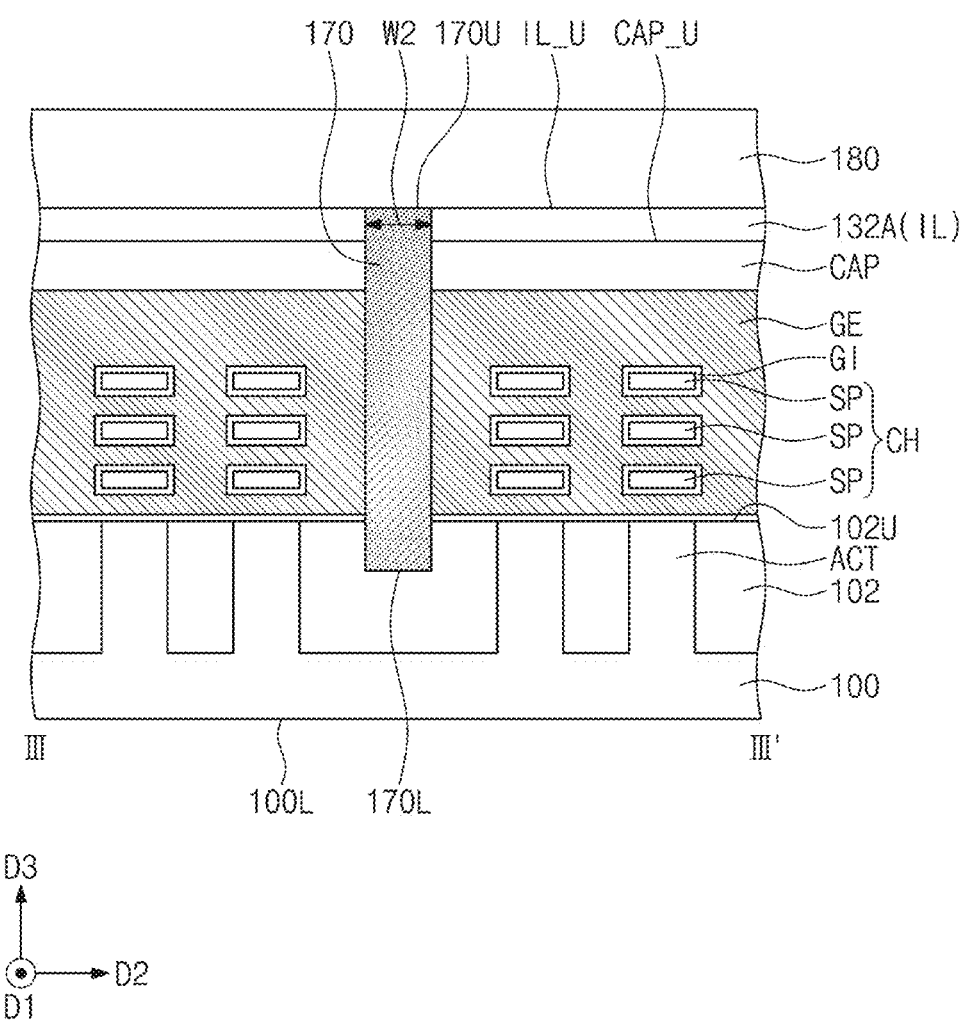

FIGS. 23A, 23B, and 23C illustrate cross-sectional views taken along lines I-I', II-II', and III-III' of FIG. 1, respectively, showing a semiconductor device according to an example embodiment of the present inventive concepts. The following semiconductor device is similar to that discussed with reference to FIGS. 1 and 2A to 2C, and thus the major differences between the semiconductor devices will be described below in the interest of brevity of description.

Referring to FIGS. 1, 23A, 23B, and 23C, an active structure AS may be provided on the active pattern ACT. When viewed in plan view, the active structure AS may be provided to overlap the active pattern ACT. The active structure AS may extend in the first direction D1 along a top surface of the active pattern ACT. The active structure AS may include channel patterns CH and each pair of source/drain patterns SD are spaced apart in the first direction D1 across a corresponding one of the channel patterns CH. The channel patterns CH and the source/drain patterns SD may be arranged alternately along the first direction D1 on the top surface of the active pattern ACT.

According to some example embodiments, each of the channel patterns CH may include a plurality of semiconductor patterns SP that are vertically stacked (or that are stacked along the third direction D3) on the active pattern ACT. The semiconductor patterns SP may be spaced apart from each other along the third direction D3, and a lowermost one of the semiconductor patterns SP may be spaced apart in the third direction D3 from the active pattern ACT. The semiconductor patterns SP may be interposed between the source/drain patterns SD. Each of the semiconductor patterns SP may be connected and in direct contact with the source/drain patterns SD. Each of the source/drain patterns SD may be in contact with lateral surfaces of the semiconductor patterns SP. Three semiconductor patterns SP are illustrated, but the present inventive concepts are not limited thereto. The semiconductor patterns SP may include the same semiconductor material.

A plurality of gate structures GS may lie on and run across the active structure AS. The plurality of gate structures GS may be spaced apart from each other in the first direction D1 and may extend in the second direction D2. The plurality of gate structures GS may vertically overlap corresponding channel patterns CH of the active structure AS, and the source/drain patterns SD may be disposed on opposite sides of each of the plurality of gate structures GS.

A gate electrode GE of each of the plurality of gate structures GS may be disposed on the semiconductor patterns SP of a corresponding channel pattern CH. The gate electrode GE may extend between the semiconductor patterns SP and between the active pattern ACT and a lowermost one of the semiconductor patterns SP. The gate electrode GE may extend in the second direction D2, and may cover top surfaces of the device isolation patterns 102 and opposing lateral surfaces in the second direction D2 of the corresponding channel pattern CH (or opposing lateral surfaces in the second direction D2 of each of the semiconductor patterns SP).

A gate dielectric pattern GI of each of the plurality of gate structures GS may be interposed between the gate electrode GE and the corresponding channel pattern CH, and may extend between the gate electrode GE and the gate spacers GSP. The gate dielectric pattern GI may be interposed between the gate electrode GE and each of the semiconductor patterns SP, and may surround an outer surface of each of the semiconductor patterns SP. Each of the semiconductor patterns SP may be spaced apart from the gate electrode GE across the gate dielectric pattern GI. The gate dielectric pattern GI may extend between the gate electrode GE and each of corresponding source/drain patterns SD. The gate dielectric pattern GI may be interposed between the active pattern ACT and the gate electrode GE. The gate dielectric pattern GI may extend along a bottom surface of the gate electrode GE, and may be interposed between the gate electrode GE and each of the device isolation patterns 102.

The gate electrode GE, the corresponding channel pattern CH, and the corresponding source/drain patterns SD may constitute a gate-all-around type field effect transistor or a multi-bridge channel field effect transistor (MBCFET).

According to some example embodiments, although not shown, spacer patterns may be interposed between the corresponding channel pattern CH and the semiconductor patterns SP, and may be spaced apart from each other across the gate electrode GE. Each of the spacer patterns may be interposed between the gate electrode GE and a corresponding one of the source/drain patterns SD. The gate dielectric pattern GI may be interposed between the gate electrode GE and each of the semiconductor patterns SP, and may extend between the gate electrode GE and each of the spacer patterns. The spacer patterns may include a low-k dielectric layer (e.g., silicon nitride). For example, the spacer patterns may include one or more of SiN, SiCN, SiOCN, SiBCN, and SiBN. Except the difference mentioned above, a semiconductor device according to this example embodiment of the present embodiments may be substantially the same as the semiconductor device discussed with reference to FIGS. 1 and 2A to 2C.

A semiconductor device according to some example embodiments of the present inventive concepts may include a negative capacitance field effect transistor that uses a negative capacitor. For example, the gate dielectric pattern GI may include a ferroelectric material layer having ferroelectric properties and a paraelectric material layer having paraelectric properties. The ferroelectric material layer may have a negative capacitance, and the paraelectric material layer may have a positive capacitance. For example, when two or more capacitors are connected in series, and when each capacitor has a positive capacitance, an overall capacitance may be reduced to be less than the capacitance of each capacitor. In contrast, when at least one of two or more capacitors connected in series has a negative capacitance, an overall capacitance may have a positive value that is increased to be greater than an absolute value of the capacitance of each capacitor. When the ferroelectric material layer having a negative capacitance is connected in series to the paraelectric material layer having a positive capacitance, there may be an increase in overall capacitance of the ferroelectric and paraelectric material layers that are connected in series. The increase in overall capacitance may be used to allow a transistor including the ferroelectric material layer to have a sub-threshold swing of less than about 60 mV/decade at room temperature.

The ferroelectric material layer may have ferroelectric properties. The ferroelectric material layer may include, for example, one or more of hafnium oxide, hafnium zirconium oxide, barium strontium titanium oxide, and lead zirconium titanium oxide. For example, the hafnium zirconium oxide may be a material in which hafnium oxide is doped with zirconium (Zr). For another example, the hafnium zirconium oxide may be a compound of hafnium (Hf), zirconium (Zr), and oxygen (O). The ferroelectric material layer may further include impurities doped thereinto. For example, the impurities may include one or more of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). A kind of impurities included in the ferroelectric material layer may be changed depending on what ferroelectric material is included in the ferroelectric material layer. When the ferroelectric material layer includes hafnium oxide, the ferroelectric material layer may include at least one of impurities such as gadolinium (Gd), silicon (Si), zirconium (Zr), aluminum (Al), and yttrium (Y). When the impurities are aluminum (Al), the ferroelectric material layer may include about 3 to 8 atomic percent aluminum. In this description, the ratio of impurities may be a ratio of aluminum to the sum of hafnium and aluminum. When the impurities are silicon (Si), the ferroelectric material layer may include about 2 to 10 atomic percent silicon. When the impurities are yttrium (Y), the ferroelectric material layer may include about 2 to 10 atomic percent yttrium. When the impurities are gadolinium (Gd), the ferroelectric material layer may include about 1 to 7 atomic percent gadolinium. When the impurities are zirconium (Zr), the ferroelectric material layer may include about 50 to 80 atomic percent zirconium.

The paraelectric material layer may have paraelectric properties. The paraelectric material layer may include, for example, one or more of silicon oxide and high-k metal oxide. The metal oxide included in the paraelectric material layer may include, for example, one or more of hafnium oxide, zirconium oxide, and aluminum oxide, but the present inventive concepts are not limited thereto.

The ferroelectric and paraelectric material layers may include the same material. The ferroelectric material layer may have ferroelectric properties, but the paraelectric material layer may not have ferroelectric properties. For example, when the ferroelectric material layer and the paraelectric material layer include hafnium oxide, the hafnium oxide included in the ferroelectric material layer may have a different crystal structure from that of the hafnium oxide included in the paraelectric material layer.

The ferroelectric material layer may have a thickness having ferroelectric properties. The thickness of the ferroelectric material layer may range, for example, from about 0.5 nm to about 10 nm, but the present inventive concepts are not limited thereto. Because ferroelectric materials have their own critical thickness that exhibits ferroelectric properties, the thickness of the ferroelectric material layer may depend on ferroelectric material. For example, the gate dielectric pattern GI may include a single ferroelectric material layer. For another example, the gate dielectric pattern GI may include a plurality of ferroelectric material layers that are spaced apart from each other. The gate dielectric pattern GI may have a stack-layered structure in which a plurality of ferroelectric material layers are stacked alternately with a plurality of paraelectric material layers.

According to the present inventive concepts, a plurality of separation patterns may penetrate corresponding immediately neighboring gate structures, and may be spaced apart from and aligned with each other in a first direction. A lower dielectric layer between the neighboring gate structures may extend between the plurality of separation patterns. An uppermost surface of the lower dielectric layer between the neighboring gate structures and an uppermost surface of the lower dielectric layer between the plurality of separation patterns may be located at a height the same as or higher than that of a top surface of a gate capping pattern of each of the neighboring gate structures. At least one of first contacts interposed between the neighboring gate structures may pass between the plurality of separation patterns and extend in a second direction. As the uppermost surface of the lower dielectric layer between the plurality of separation patterns is located at substantially the same as that of the uppermost surface of the lower dielectric layer between the neighboring gate structures, the at least one of the first contacts may easily penetrate the lower dielectric layer between the neighboring gate structures and the lower dielectric layer between the plurality of separation patterns. Accordingly, it may be possible to prevent or mitigate the occurrence of pattern defects in the at least one of the first contacts and provide a semiconductor device with improved electrical characteristics.

The aforementioned description provides some example embodiments for explaining the present inventive concepts. Therefore, the present inventive concepts are not limited to the example embodiments described above, and it will be understood by one of ordinary skill in the art that variations in form and detail may be made therein without departing from the spirit and essential features of the present inventive concepts.

What is claimed is:

1. A semiconductor device, comprising:
a plurality of gate structures on a substrate, the plurality of gate structures spaced apart from each other in a first direction and extending in a second direction intersecting the first direction;
a plurality of separation patterns penetrating immediately neighboring gate structures of the plurality of gate structures, respectively; and
a lower dielectric layer being between the plurality of gate structures and extending between the plurality of separation patterns,
wherein each of the plurality of separation patterns separates a corresponding one of the neighboring gate structures into a pair of gate structures that are spaced apart from each other in the second direction, and
wherein the plurality of separation patterns are spaced apart from and aligned with each other along the first direction,
wherein each of the plurality of gate structures includes:
a gate electrode extending in the second direction; and
a gate capping pattern on a top surface of the gate electrode,
wherein each of the plurality of separation patterns penetrates the gate capping pattern and the gate electrode that are included in a corresponding one of the neighboring gate structures,
wherein a height of an uppermost surface of each of the plurality of separation patterns is higher than a height of a top surface of the gate capping pattern, and
wherein a height of an uppermost surface of the lower dielectric layer between the plurality of separation patterns is higher than the height of a top surface of the gate capping pattern.

2. The semiconductor device of claim 1, wherein the height of the uppermost surface of each of the plurality of separation patterns is equal to the height of the uppermost surface of the lower dielectric layer between the plurality of separation patterns.

3. The semiconductor device of claim 1, wherein
each of the plurality of gate structures further includes,
a gate dielectric pattern extending along a bottom surface of the gate electrode, and
a pair of gate spacers on opposite lateral surfaces of the gate electrode, respectively, and
each of the plurality of separation patterns penetrates the gate capping pattern, the gate electrode, and the gate dielectric pattern that are included in a corresponding one of the neighboring gate structures.

4. The semiconductor device of claim 3, wherein the pair of gate spacers included in each of the neighboring gate structures extends onto lateral surfaces of a corresponding one of the plurality of separation patterns, respectively.

5. The semiconductor device of claim 3, further comprising:
a plurality of active patterns extending in the first direction on the substrate and spaced apart from each other in the second direction; and
a device isolation pattern between the active patterns,
wherein the plurality of gate structures are on and run across the active patterns and the device isolation pattern, and
wherein the plurality of separation patterns are on the device isolation pattern.

6. The semiconductor device of-claim 2,- claim 1, further comprising:
a plurality of source/drain patterns on the substrate on opposite sides of each of the plurality of gate structures; and
a plurality of first contacts on the opposite sides of each of the plurality of gate structures and connected to corresponding ones of the source/drain patterns, respectively,
wherein at least one of the first contacts extends between the plurality of separation patterns and penetrates the lower dielectric layer between the plurality of separation patterns.

7. The semiconductor device of claim 6, wherein a height of an uppermost surface of each of the first contacts is higher than the height of the uppermost surface of each of the plurality of separation patterns.

8. The semiconductor device of claim 6, further comprising:
an upper dielectric layer on the lower dielectric layer, the upper dielectric layer covering the plurality of gate structures and the plurality of separation patterns,
wherein each of the first contacts penetrates the upper dielectric layer and the lower dielectric layer.

9. The semiconductor device of claim 1, wherein
each of the plurality of separation patterns has a first width in the first direction, and
the first width of an odd-numbered one of the plurality of separation patterns is different from the first width of an even-numbered one of the plurality of separation patterns.

10. The semiconductor device of claim 1, wherein
the plurality of separation patterns have first widths in the first direction, respectively, and
the first widths of the plurality of separation patterns are equal to each other.

11. A semiconductor device, comprising:
a plurality of gate structures on a substrate, the plurality of gate structures spaced apart from each other in a first direction and extending in a second direction intersecting the first direction;
a plurality of separation patterns separating immediately neighboring gate structures of the plurality of gate structures, respectively, into a pair of gate structures that are spaced apart from each other in the second direction, the neighboring gate structures being between a pair of gate structures, from among the plurality of gate structures, in the first direction, the plurality of separation patterns aligned with each other along the first direction; and
a lower dielectric layer between the separation patterns, above the plurality of gate structures in a third direction perpendicular to the first direction and the second direction, and between the plurality of gate structures,
wherein the separation patterns are spaced apart from each other in the first direction across the lower dielectric layer,
wherein each of the plurality of gate structures includes a gate electrode and a gate capping pattern on a top surface of the gate electrode,
wherein a first uppermost surface of the lower dielectric layer on the plurality of gate structures, uppermost surfaces of the plurality of separation patterns, and a second uppermost surface of the lower dielectric layer between the plurality of separation patterns are coplanar, and wherein a height of each of the first and second uppermost surfaces of the lower dielectric layer is higher than a height of an uppermost surface of the gate capping pattern.

12. The semiconductor device of claim 11, wherein each of the plurality of gate structures further includes,
   a gate dielectric pattern on a bottom surface of the gate electrode, and
   a pair of gate spacers on opposite lateral surfaces of the gate electrode, respectively,
   the gate dielectric pattern extends between the gate electrode and each of the gate spacers, and
   each of the separation patterns penetrates the gate capping pattern, the gate electrode, and the gate dielectric pattern that are included in a corresponding one of the plurality of gate structures.

13. The semiconductor device of claim 12, wherein at least one of the gate spacers is between the lower dielectric layer and each of the separation patterns.

14. The semiconductor device of claim 11, wherein
   each of the separation patterns has a first width in the first direction, and
   the first width of an odd-numbered one of the separation patterns is different from the first width of an even-numbered one of the separation patterns.

15. The semiconductor device of claim 11, wherein
   the separation patterns have second width in the second direction, respectively, and
   the second widths of the separation patterns are equal to each other.

* * * * *